(12) United States Patent
Hata et al.

(10) Patent No.: US 6,977,953 B2
(45) Date of Patent: Dec. 20, 2005

(54) NITRIDE-BASED SEMICONDUCTOR LIGHT-EMITTING DEVICE AND METHOD OF FABRICATING THE SAME

(75) Inventors: Masayuki Hata, Kadoma (JP); Yasuhiko Nomura, Moriguchi (JP); Daijiro Inoue, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 11 days.

(21) Appl. No.: 10/200,771

(22) Filed: Jul. 24, 2002

(65) Prior Publication Data

US 2003/0020079 A1    Jan. 30, 2003

(30) Foreign Application Priority Data

Jul. 27, 2001 (JP) ............................. 2001-228100
Aug. 8, 2001 (JP) ............................. 2001-240716

(51) Int. Cl.[7] ............................................... H01S 5/00
(52) U.S. Cl. ................................. 372/46.01; 372/43.01
(58) Field of Search ...................................... 372/39–50

(56) References Cited

U.S. PATENT DOCUMENTS

| | | | |
|---|---|---|---|
| 5,070,510 A * | 12/1991 | Konushi et al. ............... 372/46 |
| 5,272,109 A * | 12/1993 | Motoda ........................ 438/40 |
| 5,282,218 A * | 1/1994 | Okajima et al. ............... 372/46 |
| 5,319,661 A * | 6/1994 | Irikawa et al. ................ 372/46 |
| 5,426,658 A * | 6/1995 | Tohmon et al. ................ 372/46 |
| 5,470,786 A * | 11/1995 | Irikawa et al. ................ 438/31 |
| 5,610,096 A * | 3/1997 | Yodoshi et al. ............... 438/40 |
| 5,960,019 A * | 9/1999 | Hayashi et al. ............... 372/46 |
| 5,966,396 A * | 10/1999 | Okazaki et al. ............... 372/46 |
| 5,970,080 A * | 10/1999 | Hata .......................... 372/45 |
| 5,978,402 A * | 11/1999 | Matsumoto et al. ........... 372/50 |
| 5,990,496 A * | 11/1999 | Kunisato et al. .............. 257/94 |
| 6,064,079 A * | 5/2000 | Yamamoto et al. ......... 257/101 |
| 6,185,238 B1 * | 2/2001 | Onomura et al. ............. 372/46 |
| 6,215,803 B1 * | 4/2001 | Hata .......................... 372/46 |
| 6,323,507 B1 * | 11/2001 | Yokoyama et al. ........... 257/79 |
| 6,359,919 B1 * | 3/2002 | Ishikawa et al. .............. 372/45 |
| 6,387,721 B1 * | 5/2002 | Hashimoto et al. ........... 438/46 |
| 6,400,742 B1 * | 6/2002 | Hatakoshi et al. ............ 372/46 |
| 6,522,676 B1 * | 2/2003 | Goto et al. ................... 372/43 |
| 6,534,800 B1 * | 3/2003 | Ohbo et al. ................. 257/103 |
| 6,580,736 B1 * | 6/2003 | Yoshie et al. ................ 372/45 |

(Continued)

FOREIGN PATENT DOCUMENTS

JP         03-183182         8/1991

(Continued)

Primary Examiner—Minsun Oh Harvey
Assistant Examiner—Phillip Nguyen
(74) Attorney, Agent, or Firm—McDermott Will & Emery LLP

(57) ABSTRACT

A nitride-based semiconductor light-emitting device capable of stabilizing transverse light confinement is obtained. This nitride-based semiconductor light-emitting device comprises an emission layer, a cladding layer, formed on the emission layer, including a first nitride-based semiconductor layer and having a current path portion and a current blocking layer, formed to cover the side surfaces of the current path portion, including a second nitride-based semiconductor layer, while the current blocking layer is formed in the vicinity of the current path portion and a region having no current blocking layer is included in a region not in the vicinity of the current path portion. Thus, the width of the current blocking layer is reduced, whereby strain applied to the current blocking layer is relaxed. Consequently, the thickness of the current blocking layer can be increased, thereby stabilizing transverse light confinement.

56 Claims, 31 Drawing Sheets

U.S. PATENT DOCUMENTS 6,567,449 B1 * 7/2003 Smolka et al. ............... 372/50
6,614,059 B1 * 9/2003 Ban et al. .................. 257/101

FOREIGN PATENT DOCUMENTS

| JP | 04-111487 | 4/1992 |
| JP | 04-311080 | 11/1992 |
| JP | 05-075215 | 3/1993 |
| JP | 08-018157 | 1/1996 |
| JP | 10-173278 | 6/1998 |
| JP | 10-321962 | 12/1998 |
| JP | 2000-277865 A | 10/2000 |
| JP | 2001-068786 A | 3/2001 |

* cited by examiner

NITRIDE-BASED SEMICONDUCTOR LIGHT-EMITTING DEVICE AND METHOD OF FABRICATING THE SAME

BACKGROUND OF THE INVENTION

1. Field of the Invention

The present invention relates to a nitride-based semiconductor light-emitting device and a method of fabricating the same, and more particularly, it relates to a nitride-based semiconductor light-emitting device comprising a current blocking layer and a method of fabricating the same.

2. Description of the Background Art

A nitride-based semiconductor laser device, which is one of nitride-based semiconductor light-emitting devices, is expected as an advanced light source for a large capacity disk, and subjected to active development. A well-known general nitride-based semiconductor laser device has current blocking layers consisting of a material having reverse conductivity to a nitride-based semiconductor layer forming a ridge portion on side portions of the ridge portion serving as a current path portion. This nitride-based semiconductor laser device is disclosed in Japanese Patent Laying-Open No. 10-321962 (1998), for example.

FIG. 69 is a sectional view showing an exemplary structure of a conventional nitride-based semiconductor laser device comprising current blocking layers 306 having reverse conductivity to a ridge portion. Referring to FIG. 69, an n-type contact layer 302 of n-type GaN is formed on a sapphire substrate 301 in the conventional nitride-based semiconductor laser device. An n-type cladding layer 303 of n-type AlGaN and an emission layer 304 of InGaN are formed on the n-type contact layer 302. A p-type cladding layer 305 of p-type AlGaN having the ridge portion serving as the current path portion is formed on the emission layer 304. The current blocking layers 306 of n-type AlGaN are formed on the side surfaces of the ridge portion of the p-type cladding layer 305 and on flat portions of the p-type cladding layer 305. A p-type contact layer 307 of p-type GaN is formed on the upper surfaces of the current blocking layers 306 and the upper surface of the ridge portion of the p-type cladding layer 305. A p-side ohmic electrode 308 is formed on the upper surface of the p-type contact layer 307.

Partial regions of the layers from the p-type cladding layer 305 to the n-type contact layer 302 are removed for exposing a surface portion of the n-type contact layer 302. An n-side ohmic electrode 309 is formed on the exposed surface portion of the n-type contact layer 302.

In the conventional nitride-based semiconductor laser device having the aforementioned structure, current flows from the p-side ohmic electrode 308 to the emission layer 304, the n-type cladding layer 303, the n-type contact layer 302 and the n-side ohmic electrode 309 through the p-type contact layer 307 and the p-type cladding layer 305. Thus, a laser beam can be emitted from a region of the emission layer 304 located under the ridge portion forming the current path portion.

In the aforementioned conventional nitride-based semiconductor laser device, the current blocking layers 306 have two functions. First, the current blocking layers 306 are provided on side portions of the current path portion, for feeding the current only to the ridge portion forming the current path portion located substantially at the center of the device. Further, the current blocking layers 306 are prepared from a material having a refractive index different from that of the p-type cladding layer 305, for confining transverse light in the emission layer 304 through the difference between the refractive indices.

In order to strengthen the light confinement in the emission layer 304 in this case, the difference between the refractive indices of the p-type cladding layer 305 located on the emission layer 304 and the current blocking layers 306 must be increased. In order to increase the difference between the refractive indices, the Al composition of the current blocking layers 306 consisting of n-type AlGaN may be increased. In other words, the transverse light can be confined in the emission layer 304 by increasing the Al composition of the n-type AlGaN forming the current blocking layers 306 as compared with the Al composition of the p-type AlGaN forming the p-type cladding layer 305. The nitride-based semiconductor laser device having such a structure is generally referred to as a real refractive index guided laser.

In order to confine the transverse light, the current blocking layers 306 may alternatively be prepared from a material having a smaller band gap than the emission layer 304. When an emission layer and current blocking layers 306 are made of InGaN and the In composition of the InGaN forming the current blocking layers is increased as compared with that of the InGaN forming the emission layer, for example, the current blocking layers can absorb part of light generated in the emission layer. Thus, transverse light can be confined. The nitride-based semiconductor laser device having such a structure is referred to as a complex refractive index guided laser.

In the aforementioned conventional real refractive index guided laser, the current blocking layers 306 of n-type AlGaN are different in Al composition from the p-type cladding layer 305 of p-type AlGaN, and hence the lattice constant of the current blocking layers 306 is different from that of the p-type cladding layer 305. When the Al composition of the current blocking layers 306 consisting of n-type AlGaN is increased, therefore, strain is applied to the current blocking layers 306 to disadvantageously easily cause cracks or crystal defects such as dislocations in the current blocking layers 306. Consequently, it is difficult to form the current blocking layers 306 with a large thickness, leading to difficulty in stabilization of transverse light confinement.

In the aforementioned conventional complex refractive index guided laser, the current blocking layers of InGaN are prepared from the material different from that of the p-type cladding layer consisting of AlGaN, and hence the lattice constant of the current blocking layers is different from that of the p-type cladding layer. When the In composition of the current blocking layers consisting of InGaN is increased, therefore, strain is applied to the current blocking layers to easily cause lattice defects in the current blocking layers. Also in this case, it is difficult to form the current blocking layers with a large thickness, leading to difficulty in stabilization of transverse light confinement.

In the aforementioned nitride-based semiconductor laser device, the current blocking layers 306 are formed above the n-type contact layer 302 of GaN formed in a large thickness. In this case, strain is disadvantageously applied to the current blocking layers 306 due to the difference between the lattice constants of the current blocking layers 306 and the n-type contact layer 302 of GaN having a large thickness.

In the conventional nitride-based semiconductor laser device, further, the ridge portion consisting of the p-type cladding layer 305 is etched by dry etching or the like for thereafter crystal-growing the current blocking layers 306. In this case, the p-type cladding layer 305 consisting of AlGaN is active and hence a surface portion of the p-type cladding layer 305 exposed by etching is easily contaminated with C or O. Therefore, this contaminant infiltrates into the interfaces between the p-type cladding layer 305 and the current blocking layers 306, to disadvantageously cause crystal defects such as dislocations in the current blocking layers 306.

In the aforementioned conventional real refractive index guided laser, the current blocking layers 306 are formed above a substrate or a thick nitride-based semiconductor layer formed on a substrate. When GaN is employed as the material for the substrate or the thick nitride-based semiconductor layer formed on the substrate and the Al composition of the current blocking layers 306 consisting of AlGaN is increased in this case, strain is applied to the current blocking layers 306 since the lattice constant of AlGaN forming the current blocking layers 306 is smaller than the lattice constant of GaN. Therefore, cracks or lattice defects are easily caused on the current blocking layers 306. Consequently, it is difficult to thickly form the current blocking layers 306, disadvantageously leading to difficulty in stabilization of transverse light confinement.

Also in the aforementioned conventional complex refractive index guided laser, the current blocking layers are formed above a substrate or a thick nitride-based semiconductor layer formed on a substrate, similarly to the conventional real refractive index guided laser. When GaN is employed as the material for the substrate or the thick nitride-based semiconductor layer formed on the substrate and the In composition of the current blocking layers consisting of InGaN is increased in this case, strain is applied to the current blocking layers since the lattice constant of InGaN forming the current blocking layers is larger than the lattice constant of GaN. Therefore, cracks or lattice defects are easily caused on the current blocking layers. Also in this case, it is difficult to thickly form the current blocking layers, disadvantageously leading to difficulty in stabilization of transverse light confinement.

SUMMARY OF THE INVENTION

An object of the present invention is to provide a nitride-based semiconductor light-emitting device capable of stabilizing transverse light confinement.

Another object of the present invention is to provide a nitride-based semiconductor light-emitting device capable of suppressing formation of crystal defects resulting from a contaminant on an interface between a cladding layer and a current blocking layer.

Still another object of the present invention is to provide a method of fabricating a nitride-based semiconductor light-emitting device capable of easily forming a nitride-based semiconductor light-emitting device capable of stabilizing transverse light confinement.

In order to attain the aforementioned objects, a nitride-based semiconductor light-emitting device according to a first aspect of the present invention comprises an emission layer, a cladding layer, formed on the emission layer, including a first nitride-based semiconductor layer and having a current path portion, and a current blocking layer, formed to cover the side surfaces of the current path portion, including a second nitride-based semiconductor layer, while the current blocking layer is formed in the vicinity of the current path portion and a region not in the vicinity of the current path portion includes a region having no current blocking layer. For example, the emission layer may include the region having no current blocking layer.

The nitride-based semiconductor light-emitting device according to the first aspect is so formed that the region not in the vicinity of the current path portion includes the region having no current blocking layer, whereby the width of the current blocking layer is reduced as compared with that formed on the overall surface excluding the region in the vicinity of the current path portion. Thus, strain applied to the current blocking layer due to the difference between the lattice constants of the current blocking layer and a nitride-based semiconductor substrate or a nitride-based semiconductor layer formed on a substrate can be relaxed, whereby the current blocking layer can be inhibited from formation of cracks or lattice defects. Consequently, the thickness of the current blocking layer can be increased, thereby stabilizing transverse light confinement.

In the aforementioned nitride-based semiconductor light-emitting device according to the first aspect, the current blocking layer is preferably formed only in the vicinity of the current path portion. According to this structure, the width of the current blocking layer is reduced, whereby strain applied to the current blocking layer can be further relaxed.

In the aforementioned nitride-based semiconductor light-emitting device, the total width of the current path portion and the current blocking layer is preferably at least three times and not more than seven times the width of the current path portion. If the total width of the current path portion and the current blocking layer is smaller than three times the width of the current path portion, the range of formation of the current blocking layer is so excessively reduced that transverse light confinement is insufficient. If the total width of the current path portion and the current blocking layer is larger than seven times the width of the current path portion, strain applied to the current blocking layer is so increased as to cause a large number of crystal defects or cracks on the current blocking layer. Therefore, the total width of the current path portion and the current blocking layer is preferably at least three times and not more than seven times the width of the current path portion.

The aforementioned nitride-based semiconductor light-emitting device preferably further comprises a mask layer, serving for selectively growing the current blocking layer, formed on the cladding layer at a prescribed space from the current path portion. According to this structure, the current blocking layer can be selectively grown by using the mask layer, whereby crystallinity of the current blocking layer can be improved. In this case, the mask layer may be formed at a space of at least once and not more than three times the width of the current path portion from the current path portion. According to this structure, the current blocking layer can be selectively grown only in the vicinity of the current path portion by using the mask layer serving for a mask of the selective growth, whereby strain applied to the current blocking layer can be easily relaxed. In this case, the mask layer preferably includes an oxide film or a nitride film containing at least one element selected from a group consisting of Si, Ti and Zr.

In the aforementioned nitride-based semiconductor light-emitting device, the cladding layer preferably includes a projection portion forming the current path portion and a flat portion, and the current blocking layer is preferably formed on the side surfaces of the projection portion and on the flat portion. According to this structure, a ridge-type semiconductor light-emitting device including a current blocking layer inhibited from cracking or the like can be easily, obtained. In this case, the mask layer may be formed on the flat portion of the cladding layer, and the current blocking layer may be formed on the side surfaces of the projection portion of the cladding layer, on the flat portion of the cladding layer and on the mask layer.

In the aforementioned nitride-based semiconductor light-emitting device, the current blocking layer preferably includes an opening, and the cladding layer preferably includes a first cladding layer having a substantially flat upper surface and a second cladding layer, formed on the first cladding layer in the opening, having the current path portion. According to this structure, a self-aligned semiconductor light-emitting device including a current blocking layer inhibited from cracking or the like can be easily obtained.

A nitride-based semiconductor light-emitting device according to a second aspect of the present invention comprises an emission layer, a cladding layer, formed on the emission layer, including a first nitride-based semiconductor layer and having a current path portion, and a current blocking layer, formed to cover the side surfaces of the current path portion, including a second nitride-based semiconductor layer, while a region not in the vicinity of the current path portion includes a region having the current blocking layer of a thickness smaller than the thickness in the vicinity of the current path portion.

In the nitride-based semiconductor light-emitting device according to the second aspect, the current blocking layer is formed to include the region having a thickness smaller than the thickness in the vicinity of the current path portion in the region not in the vicinity of the current path portion, whereby strain applied to the current blocking layer due to the difference between the lattice constants of the current blocking layer and a nitride-based semiconductor substrate or a nitride-based semiconductor layer formed on a substrate easily concentrates to the region of the current blocking layer having a small thickness. Thus, crystal defects or cracks are easily formed in the region, having a small thickness, of the current blocking layer not in the vicinity of the current path portion, whereby the current blocking layer can be inhibited from formation of cracks or lattice defects in the vicinity of the current path portion. Consequently, the thickness of the current blocking layer can be increased in the vicinity of the current path portion, thereby stabilizing transverse light confinement.

The aforementioned nitride-based semiconductor light-emitting device according to the second aspect preferably further comprises a step portion formed on the region not in the vicinity of the current path portion, and the region of the current blocking layer having the thickness smaller than the thickness in the vicinity of the current path portion is preferably formed on the step portion. According to this structure, the current blocking layer can be selectively grown on the step portion, whereby crystallinity of the current blocking layer can be improved. When the current blocking layer is selectively grown on the step portion, the region of the current blocking layer having a small thickness can be easily formed on the step portion. In this case, the step portion is preferably formed on a position separating from the current path portion by at least once and not more than three times the width of the current path portion.

In the aforementioned nitride-based semiconductor light-emitting device according to the first or second aspect, the current blocking layer preferably contains at least one element, selected from a group consisting of B, Ga, Al, In and Tl, and N.

In the aforementioned nitride-based semiconductor light-emitting device according to the first or second aspect, the current blocking layer is preferably formed either on a GaN substrate or on a GaN layer formed on a substrate, and preferably includes the second nitride-based semiconductor layer having a smaller lattice constant than GaN. In this case, strain applied to the current blocking layer due to the difference between the lattice constants of the current blocking layer and GaN can be relaxed, whereby the current blocking layer can be inhibited from formation of cracks or lattice constants. Consequently, the lattice constant of the current blocking layer can be reduced or the thickness thereof can be increased, thereby stabilizing transverse light confinement. In this case, the current blocking layer may include an AlGaN layer as the second nitride-based semiconductor layer having a smaller lattice constant than GaN. In this case, the Al composition of AlGaN can be increased, thereby stabilizing transverse light confinement.

In the aforementioned nitride-based semiconductor light-emitting device according to the first or second aspect, the current blocking layer preferably includes the second nitride-based semiconductor layer having a refractive index smaller than the refractive index of the first nitride-based semiconductor layer forming the cladding layer. In this case, the difference between the refractive indices of the cladding layer and the current blocking layer can be increased, thereby stabilizing transverse light confinement.

In the aforementioned nitride-based semiconductor light-emitting device according to the first or second aspect, the current blocking layer preferably includes the second nitride-based semiconductor layer having a lattice constant smaller than the lattice constant of the first nitride-based semiconductor layer forming the cladding layer. In this case, the current blocking layer can be inhibited from formation of cracks or lattice defects. Consequently, the current blocking layer can be formed with excellent crystallinity. Further, the difference between the lattice constants of the cladding layer and the current blocking layer can be increased, thereby stabilizing transverse light confinement.

In the aforementioned nitride-based semiconductor light-emitting device according to the first or second aspect, the current blocking layer preferably includes an $Al_wGa_{1-w}N$ layer, the cladding layer preferably includes an $Al_vGa_{1-v}N$ layer, and the current blocking layer and the cladding layer are preferably formed to have compositions satisfying w>v. In this case, the current blocking layer can be inhibited from formation of cracks or lattice defects. Consequently, the current blocking layer can be formed with excellent crystallinity. Further, the difference between the Al compositions of the cladding layer and the current blocking layer can be increased, thereby increasing the difference between the refractive indices of the cladding layer and the current blocking layer. Consequently, transverse light confinement can be stabilized.

In the aforementioned nitride-based semiconductor light-emitting device according to the first or second aspect, the current blocking layer is preferably formed either on a GaN substrate or on a GaN layer formed on a substrate, and preferably includes the second nitride-based semiconductor layer having a lattice constant larger than the lattice constant of GaN. In this case, strain applied to the current blocking layer due to the difference between the lattice constants of the current blocking layer and GaN can be relaxed, whereby the current blocking layer can be inhibited from formation of lattice defects. Consequently, the current blocking layer can be formed with excellent crystallinity. Further, the lattice constant or the thickness of the current blocking layer can be increased, thereby stabilizing transverse light confinement. In this case, the current blocking layer may contain InGaN for forming the nitride-based semiconductor layer having the lattice constant larger than that of GaN. According to this structure, the In composition of InGaN can be increased, thereby stabilizing transverse light confinement.

In the aforementioned nitride-based semiconductor light-emitting device according to the first or second aspect, the current blocking layer preferably includes the second nitride-based semiconductor layer absorbing light emitted from the emission layer. In this case, the current blocking layer can further absorb the light emitted from the emission layer. Consequently, the difference between the refractive indices of the cladding layer and the current blocking layer can be increased, thereby stabilizing transverse light confinement. For example, the current blocking layer may be formed to include a second nitride-based semiconductor layer having a smaller band gap than the emission layer.

In the aforementioned nitride-based semiconductor light-emitting device according to the first or second aspect, the current blocking layer preferably includes an $In_sGa_{1-s}N$ layer, the emission layer preferably includes an $In_xGa_{1-x}N$ layer, and the current blocking layer and the emission layer are preferably formed to have compositions satisfying $s \geq x$. In this case, the current blocking layer can be inhibited from formation of lattice defects, whereby the difference between the In compositions of the current blocking layer and the emission layer can be increased. Consequently, the current blocking layer can be formed with excellent crystallinity. Further, the current blocking layer can further absorb the light emitted from the emission layer. Thus, the difference between the refractive indices of the cladding layer and the current blocking layer can be increased, thereby stabilizing transverse light confinement.

A nitride-based semiconductor light-emitting device according to a third aspect of the present invention comprises an emission layer, a cladding layer, formed on the emission layer, including a current path portion, and a current blocking layer formed to cover the side surfaces of the current path portion, while the current blocking layer includes a dielectric blocking layer and a semiconductor blocking layer formed on the dielectric blocking layer.

In the nitride-based semiconductor light-emitting device according to the third aspect, the current blocking layer is formed to include the dielectric blocking layer and the semiconductor blocking layer formed on the dielectric blocking layer as hereinabove described, whereby the dielectric blocking layer can be interposed between the cladding layer and the semiconductor blocking layer. Thus, the cladding layer and the semiconductor blocking layer can be inhibited from coming into contact with each other. Therefore, strain applied to the semiconductor blocking layer due to the difference between the lattice constants of the cladding layer and the semiconductor blocking layer can be relaxed, whereby the semiconductor blocking layer can be inhibited from formation of cracks or crystal defects such as dislocations. Further, the cladding layer and the semiconductor blocking layer can be inhibited from coming into contact with each other, thereby preventing formation of crystal defects resulting from a contaminant on the interface between the cladding layer and the semiconductor blocking layer. In addition, the dielectric blocking layer can be interposed between the semiconductor blocking layer and the underlayer, thereby relaxing strain applied to the semiconductor blocking layer due to the difference between the lattice constants of the semiconductor blocking layer and the underlayer formed by a thick nitride-based semiconductor layer such as a GaN layer, for example. The semiconductor blocking layer can be inhibited from formation of cracks or crystal defects such as dislocations also in this case.

According to the third aspect, the semiconductor blocking layer can be inhibited from formation of cracks or crystal defects as hereinabove described, whereby the thickness of the current blocking layer can be increased for obtaining a nitride-based semiconductor light-emitting device capable of stabilizing transverse light confinement as a result.

In the aforementioned nitride-based semiconductor light-emitting device according to the third aspect, the dielectric blocking layer preferably includes an opening reaching the upper surface of the cladding layer, and the semiconductor blocking layer is preferably in contact with the upper surface of the cladding layer through the opening of the dielectric blocking layer. According to this structure, the contact area between the cladding layer and the semiconductor blocking layer can be reduced, thereby inhibiting formation of crystal defects such as dislocations or cracks resulting from the difference between the lattice constants of the cladding layer and the semiconductor blocking layer or formation of crystal defects resulting from a contaminant on the interface between the cladding layer and the semiconductor blocking layer.

In this case, the semiconductor blocking layer is preferably formed by selective growth from the upper surface of the cladding layer located in the opening of the dielectric blocking layer. According to this structure, the semiconductor blocking layer having excellent crystallinity can be easily formed on the cladding layer.

In the aforementioned nitride-based semiconductor light-emitting device according to the third aspect, the thickness of the dielectric blocking layer is preferably smaller than the thickness of the semiconductor blocking layer. According to this structure, the semiconductor blocking layer having higher thermal conductivity than the dielectric blocking layer can effectively radiate heat generated in the emission layer. Consequently, excellent characteristics can be obtained also in high-temperature operation or high-output operation of the nitride-based semiconductor light-emitting device.

In the aforementioned nitride-based semiconductor light-emitting device according to the third aspect, the cladding layer preferably includes a projection portion forming the current path portion and a flat portion, and the current blocking layer is preferably formed on the side surfaces of the projection portion and on the flat portion. According to this structure, a ridge-type nitride-based semiconductor light-emitting device including the current blocking layer inhibited from formation of crystal defects or cracks can be easily obtained.

In this case, the dielectric blocking layer is preferably formed on the flat portion of the cladding layer, and the semiconductor blocking layer is preferably formed on the side surfaces of the projection portion of the cladding layer and on the dielectric blocking layer formed on the flat portion. According to this structure, the cladding layer and the semiconductor blocking layer come into contact with each other only on the side surfaces of the projection portion of the cladding layer, whereby the contact area between the cladding layer and the semiconductor blocking layer can be reduced. In this case, the semiconductor blocking layer is preferably formed by selective growth from the side surfaces of the projection portion of the cladding layer. According to this structure, the semiconductor blocking layer can be easily formed with excellent crystallinity.

In the aforementioned nitride-based semiconductor light-emitting device according to the third aspect, the current blocking layer preferably includes an opening, and the cladding layer preferably includes a first cladding layer having a substantially flat upper surface and a second cladding layer, formed on the first cladding layer in the opening of the current blocking layer, having the current path portion. According to this structure, a self-aligned nitride-based semiconductor light-emitting device including a current blocking layer inhibited from formation of crystal defects or cracks can be easily obtained.

In this case, the second cladding layer is preferably formed to extend onto the upper surface of the current blocking layer. According to this structure, the area of the upper surface of the second cladding layer is so increased that contact resistance between the second cladding layer and the contact layer formed thereon can be reduced.

In the aforementioned nitride-based semiconductor light-emitting device according to the third aspect, the number of vertical dislocations is preferably reduced in the semiconductor blocking layer due to transversely bent dislocations. According to this structure, the semiconductor blocking layer can be obtained with more excellent crystallinity.

In the aforementioned nitride-based semiconductor light-emitting device according to the third aspect, the semiconductor blocking layer is preferably formed only in the vicinity of the current path portion. According to this structure, the width of the semiconductor blocking layer is so reduced that strain applied to the semiconductor blocking layer due to the difference between the lattice constants of the cladding layer and the semiconductor blocking layer can be further relaxed. Thus, the semiconductor blocking layer can be inhibited from formation of cracks or crystal defects. Consequently, the thickness of the semiconductor blocking layer can be increased, thereby stabilizing transverse light confinement. Further, the semiconductor blocking layer is so formed only in the vicinity of the current path portion as to reduce the capacitance between the current blocking layer including the semiconductor blocking layer and the dielectric blocking layer and the cladding layer. Thus, a pulse for operating the device can quickly rise and fall, whereby a nitride-based semiconductor laser device allowing high-speed pulsed operation can be obtained.

In the aforementioned nitride-based semiconductor light-emitting device according to the third aspect, the semiconductor blocking layer preferably contains at least one element, selected from a group consisting of B, Ga, Al, In and Tl, and N. According to this structure, the semiconductor blocking layer can be formed with excellent crystallinity.

In the aforementioned nitride-based semiconductor light-emitting device according to the third aspect, the cladding layer preferably includes a first nitride-based semiconductor layer, and the semiconductor blocking layer is preferably formed either on a GaN substrate or on a GaN layer formed on a substrate, and preferably includes a second nitride-based semiconductor layer having a smaller lattice constant than GaN. In this case, strain applied to the semiconductor blocking layer due to the difference between the lattice constants of the semiconductor blocking layer and GaN can be relaxed, thereby inhibiting the semiconductor blocking layer from formation of cracks or lattice defects. Consequently, the lattice constant of the semiconductor blocking layer can be reduced or the thickness thereof can be increased, thereby stabilizing transverse light confinement. In this case, the semiconductor blocking layer may include an AlGaN layer as the second nitride-based semiconductor layer having a lattice constant smaller than that of GaN. In this case, the Al composition of the AlGaN layer can be increased, thereby stabilizing transverse light confinement.

In the aforementioned nitride-based semiconductor light-emitting device according to the third aspect, the cladding layer preferably includes a first nitride-based semiconductor layer, and the semiconductor blocking layer preferably includes a second nitride-based semiconductor layer having a refractive index smaller than the refractive index of the first nitride-based semiconductor layer forming the cladding layer. In this case, the difference between the refractive indices of the cladding layer and the semiconductor blocking layer can be increased, thereby stabilizing transverse light confinement.

In the aforementioned nitride-based semiconductor light-emitting device according to the third aspect, the cladding layer preferably includes a first nitride-based semiconductor layer, and the semiconductor blocking layer preferably includes a second nitride-based semiconductor layer having a lattice constant smaller than the lattice constant of the first nitride-based semiconductor layer forming the cladding layer. In this case, the semiconductor blocking layer can be inhibited from formation of cracks or lattice defects, whereby the semiconductor blocking layer can be formed with excellent crystallinity. Further, the difference between the lattice constants of the cladding layer and the semiconductor blocking layer can be increased, thereby stabilizing transverse light confinement.

In the aforementioned nitride-based semiconductor light-emitting device according to the third aspect, the current blocking layer preferably includes an $Al_wGa_{1-w}N$ layer, the cladding layer preferably includes an $Al_vGa_{1-v}N$ layer, and the current blocking layer and the cladding layer are preferably formed to have compositions satisfying w>v. In this case, the semiconductor blocking layer can be inhibited from formation of cracks or lattice defects, whereby the semiconductor blocking layer can be formed with excellent crystallinity. Further, the difference between the Al compositions of the cladding layer and the semiconductor blocking layer can be increased, thereby increasing the difference between the refractive indices of the cladding layer and the semiconductor blocking layer. Consequently, transverse light confinement can be stabilized.

In the aforementioned nitride-based semiconductor light-emitting device according to the third aspect, the cladding layer preferably includes a first nitride-based semiconductor layer, and the semiconductor blocking layer preferably is preferably formed either on a GaN substrate or on a GaN layer formed on a substrate, and preferably includes a second nitride-based semiconductor layer having a lattice constant larger than the lattice constant of GaN. In this case, strain applied to the semiconductor blocking layer due to the difference between the lattice constants of the semiconductor blocking layer and GaN can be relaxed, thereby inhibiting the semiconductor blocking layer from formation of lattice defects. Consequently, the semiconductor blocking layer can be formed with excellent crystallinity. Further, the lattice constant or the thickness of the semiconductor blocking layer can be increased, thereby stabilizing transverse light confinement. In this case, the semiconductor blocking layer may be formed to contain InGaN forming the nitride-based semiconductor layer having the larger lattice constant than GaN. In this case, the In composition of InGaN can be increased, thereby stabilizing transverse light confinement.

In the aforementioned nitride-based semiconductor light-emitting device according to the third aspect, the cladding layer preferably includes a first nitride-based semiconductor layer, and the semiconductor blocking layer preferably includes a second nitride-based semiconductor layer absorbing light emitted from the emission layer. According to this structure, the semiconductor blocking layer can further absorb the light emitted from the emission layer. Consequently, the difference between the refractive indices of the cladding layer and the semiconductor blocking layer can be increased, thereby stabilizing transverse light confinement. For example, the semiconductor blocking layer may be formed to include the second nitride-based semiconductor layer having a smaller band gap than the emission layer.

In the aforementioned nitride-based semiconductor light-emitting device according to the third aspect, the semiconductor blocking layer preferably includes an $In_sGa_{1-s}N$ layer, the emission layer preferably includes an $In_sGa_{1-x}N$ layer, and the semiconductor blocking layer and the emission layer are preferably formed to have compositions satisfying $s \geq x$. According to this structure, the semiconductor blocking layer can be inhibited from formation of lattice defects, whereby the difference between the In compositions of the semiconductor blocking layer and the emission layer can be increased. Consequently, the semiconductor blocking layer can be formed with excellent crystallinity. Further, the semiconductor blocking layer can further absorb the light emitted from the emission layer. Thus, the difference between the refractive indices of the cladding layer and the semiconductor blocking layer can be increased, thereby stabilizing transverse light confinement.

In the aforementioned nitride-based semiconductor light-emitting device according to the third aspect, the dielectric blocking layer preferably includes an oxide film or a nitride film containing at least one element selected from a group consisting of Si, Ti and Zr. According to this structure, the dielectric blocking layer can easily relax the difference between the lattice constants of the cladding layer or a thick nitride-based semiconductor layer forming the underlayer and the semiconductor blocking layer. In this case, the dielectric blocking layer may include an SiN film.

A method of fabricating a nitride-based semiconductor light-emitting device according to a fourth aspect of the present invention comprises steps of forming a cladding layer including a first nitride-based semiconductor layer and having a current path portion on an emission layer, and forming a current blocking layer including a second nitride-based semiconductor layer in the vicinity of the current path portion to cover the side surfaces of the current path portion while forming a region having no current blocking layer on a region not in the vicinity of the current path portion.

In the method of fabricating a nitride-based semiconductor light-emitting device according to the fourth aspect, the region having no current blocking layer is formed on the region not in the vicinity of the current path portion as hereinabove described, whereby the width of the current blocking layer is reduced as compared with that formed on the overall surface excluding the region in the vicinity of the current path portion. Thus, strain applied to the current blocking layer due to the difference between the lattice constants of the current blocking layer and a nitride-based semiconductor substrate or a nitride-based semiconductor layer formed on a substrate can be relaxed, whereby the current blocking layer can be inhibited from formation of cracks or lattice defects. Consequently, the thickness of the current blocking layer can be increased, thereby easily forming a nitride-based semiconductor light-emitting device capable of stabilizing transverse light confinement.

The aforementioned method of fabricating a nitride-based semiconductor light-emitting device according to the fourth aspect preferably further comprises a step of forming a mask layer on the cladding layer at a prescribed space from the current path portion, and the step of forming the current blocking layer preferably includes a step of forming the current blocking layer only in the vicinity of the current path portion to cover the side surfaces of the current path portion by selectively growing the current blocking layer by using the mask layer. According to this structure, the current blocking layer can be selectively grown by using the mask layer, whereby crystallinity of the current blocking layer can be improved. Further, the current blocking layer can be selectively grown only in the vicinity of the current path portion by using the mask layer serving as a mask, whereby strain applied to the current blocking layer can be easily relaxed.

A method of fabricating a nitride-based semiconductor light-emitting device according to a fifth aspect of the present invention comprises steps of forming a cladding layer including a first nitride-based semiconductor layer and having a current path portion on an emission layer, and forming a current blocking layer, covering the side surfaces of the current path portion, including a second nitride-based semiconductor layer, having a region of a thickness smaller than the thickness in the vicinity of the current path portion on a region not in the vicinity of the current path portion.

In the method of fabricating a nitride-based semiconductor light-emitting device according to the fifth aspect, the current blocking layer is formed on the region not in the vicinity of the current path portion to include the region having a thickness smaller than the thickness in the vicinity of the current path portion, whereby strain applied to the current blocking layer due to the difference between the lattice constants of the current blocking layer and a nitride-based semiconductor substrate or a nitride-based semiconductor layer formed on a substrate easily concentrates to the region of the current blocking layer having a small thickness. Thus, crystal defects or cracks are easily formed in the region, having a small thickness, of the current blocking layer not in the vicinity of the current path portion, whereby the current blocking layer can be inhibited from formation of cracks or lattice defects in the vicinity of the current path portion. Consequently, the thickness of the current blocking layer can be increased in the vicinity of the current path portion, whereby a nitride-based semiconductor light-emitting device capable of stabilizing transverse light confinement can be easily formed.

In the aforementioned method of fabricating a nitride-based semiconductor light-emitting device according to the fifth aspect, the step of forming the current blocking layer preferably includes steps of forming a step portion on the region not in the vicinity of the current path portion and selectively growing the current blocking layer in the vicinity of the current path portion on the step portion thereby forming the region of the current blocking layer having the thickness smaller than the thickness of the current blocking layer in the vicinity of the current path portion on the step portion. According to this structure, the current blocking layer can be selectively grown on the step portion, whereby crystallinity of the current blocking layer can be improved. When the current blocking layer is selectively grown on the step portion, the region of the current blocking layer having a small thickness can be easily formed on the step portion.

A method of fabricating a nitride-based semiconductor light-emitting device according to a sixth aspect of the present invention comprises steps of forming a first cladding layer including a first nitride-based semiconductor layer on an emission layer, forming a current blocking layer, including a second nitride-based semiconductor layer, having an opening in the vicinity of a region formed with a current path portion, and forming a second cladding layer, including a third nitride-based semiconductor layer, forming the current path portion on the first cladding layer in the opening of the current blocking layer.

In the method of fabricating a nitride-based semiconductor light-emitting device according to the sixth aspect, the current blocking layer including the second nitride-based semiconductor layer having the opening is formed in the vicinity of the region formed with the current path portion and thereafter the second cladding layer including the third nitride-based semiconductor layer forming the current path portion is formed on the first cladding layer in the opening of the current blocking layer as hereinabove described, thereby easily forming a self-aligned nitride-based semiconductor light-emitting device having the current blocking layer formed only in the vicinity of the current path portion. Thus, the width of the current blocking layer is reduced as compared with that formed on the overall surface excluding the region in the vicinity of the current path portion. Therefore, strain applied to the current blocking layer due to the difference between the lattice constants of the current blocking layer and a nitride-based semiconductor substrate or a nitride-based semiconductor layer formed on a substrate can be relaxed, thereby inhibiting the current blocking layer from formation of cracks or lattice defects. Consequently, the thickness of the current blocking layer can be increased, thereby easily forming a self-aligned nitride-based semiconductor light-emitting device capable of stabilizing transverse light confinement.

The aforementioned method of fabricating a nitride-based semiconductor light-emitting device according to the sixth aspect preferably further comprises a step of forming a mask layer on the first cladding layer at a prescribed space from the region formed with the current path portion, and the step of forming the current blocking layer preferably includes a step of selectively growing the current blocking layer by using the mask layer thereby forming the current blocking layer only in the vicinity of the region formed with the current path portion. According to this structure, the current blocking layer can be selectively grown by using the mask layer, whereby crystallinity of the current blocking layer can be improved in the self-aligned nitride-based semiconductor light-emitting device. Further, the current blocking layer can be selectively grown only in the vicinity of the current path portion by using the mask layer serving for a mask of the selective growth, whereby strain applied to the current blocking layer can be easily relaxed in the self-aligned nitride-based semiconductor light-emitting device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
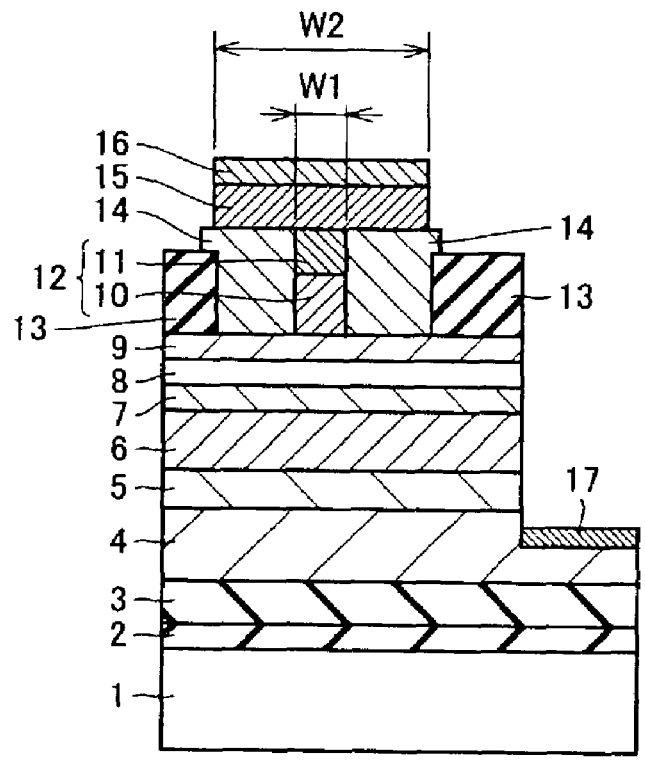
FIG. 1 is a sectional view showing a nitride-based semiconductor laser device according to a first embodiment of the present invention.

Embodiments of the present invention are now described with reference to the drawings.

(First Embodiment)

The structure of a nitride-based semiconductor laser device according to a first embodiment of the present invention is described with reference to FIG. 1. This nitride-based semiconductor laser device according to the first embodiment is a complex refractive index guided laser device.

In the structure of the nitride-based semiconductor laser device according to the first embodiment, a buffer layer 2 of AlGaN having a thickness of about 15 nm and an undoped GaN layer 3 having a thickness of about 0.5 $\mu$m are formed on a sapphire (0001) plane substrate 1 (hereinafter referred to as "sapphire substrate 1"). An n-type contact layer 4, having a mesa portion of about 70 $\mu$m in width, consisting of n-type GaN having a thickness of about 4 $\mu$m is formed on the undoped GaN layer 3. The sapphire substrate 1 is an example of the "substrate" according to the present invention, and the n-type contact layer 4 is an example of the "nitride-based semiconductor layer" according to the present invention.

An anti-cracking layer 5 of n-type $In_{0.05}Ga_{0.95}N$ having a thickness of about 0.1 $\mu$m, an n-type second cladding layer 6 of Si-doped $Al_{0.3}Ga_{0.7}N$ having a thickness of about 1 $\mu$m, an n-type first cladding layer 7 of Si-doped GaN having a thickness of about 50 nm and a multiple quantum well (MQW) emission layer 8 consisting of an MQW of InGaN are formed on the upper surface of the mesa portion of the n-type contact layer 4. The MQW emission layer 8 is formed by alternately stacking five barrier layers of undoped $In_yGa_{1-y}N$ (In composition: y=0, i.e., GaN) each having a thickness of about 4 nm and four well layers of undoped $In_xGa_{1-x}N$ (In composition: x=0.15) each having a thickness of about 4 nm. The MQW emission layer 8 is an example of the "emission layer" according to the present invention.

A p-type first cladding layer 9 of Mg-doped GaN having a thickness of about 40 nm is formed on the MQW emission layer 8. A p-type second cladding layer 10 of Mg-doped $Al_vGa_{1-v}N$ (Al composition: v=0.08) having a width of about 2 $\mu$m and a thickness of about 0.45 $\mu$m is formed on the upper surface of the p-type first cladding layer 9. A cap layer 11 of p-type GaN having a thickness of about 50 nm is formed to be substantially in contact with the overall upper surface of the p-type second cladding layer 10. The p-type second cladding layer 10 and the cap layer 11 form a current path portion (ridge portion) 12 having a width W1 (about 2 $\mu$m in the first embodiment). The p-type first cladding layer 9 and the p-type second cladding layer 10 are examples of the "cladding layer" according to the present invention.

A mask layer 13 of a silicon nitride such as $Si_3N_4$ having an opening of about 10 $\mu$m in width around the current path portion 12 is formed on the upper surface of the p-type first cladding layer 9. A current blocking layer 14 of Si-doped $In_sGa_{1-s}N$ (In composition:s=0.2) having a thickness of about 3 $\mu$m is formed on the upper surface of the p-type first cladding layer 9 exposed in the opening of the mask layer 13 and on a partial region of the upper surface of the mask layer 13, to fill up side portions of the current path portion 12. In this case, the total width W2 (about 10 $\mu$m) of the current path portion 12 and the current blocking layer 14 is set in the range of at least three times and not more than seven times (five times in the first embodiment) the width W1 (about 2 $\mu$m) of the current path portion 12, for the following reason:

If the total width W2 of the current path portion 12 and the current blocking layer 14 is smaller than three times the width W1 of the current path portion 12, the range of formation of the current blocking layer 14 is so excessively reduced that transverse light confinement is insufficient. If the total width W2 of the current path portion 12 and the current blocking layer 14 is larger than seven times the width W1 of the current path portion 12, strain applied to the current blocking layer 14 is increased to result in a large number of lattice defects in the current blocking layer 14. Therefore, the total width W2 of the current path portion 12 and the current blocking layer 14 is preferably set in the range of at least three times and not more than seven times the width W1 of the current path portion 12.

A p-type contact layer 15 of Mg-doped GaN having a thickness of about 3 $\mu$m to about 5 $\mu$m is formed on the current path portion 12 and on the current blocking layer 14 to substantially cover the overall upper surface of the current path portion 12 (the cap layer 11) and a partial region of the upper surface of the current blocking layer 14. Each of the layers 2 to 11, 14 and 15 has a wurtzite structure, and is formed by growing in the [0001] direction of the nitride-based semiconductor.

A p-side electrode 16 of Au/Pd is formed on the p-type contact layer 15 by stacking Pd and Au layers on the p-type contact layer 15 in this order. An n-side electrode 17 of Au/Ti is formed on the exposed surface portion of the n-type contact layer 4 by stacking Ti and Au layers on the n-type contact layer 4 in this order.

According to the first embodiment, the current blocking layer 14 is formed in the range of the width W2 (about 10 $\mu$m) of the opening of the mask layer 13 as hereinabove described, so that the current blocking layer 14 can be formed only in the vicinity of the current path portion 12. Therefore, the width of the current blocking layer 14 is reduced as compared with that formed on the overall surface, which consists of the vicinity of the current path portion 12 and the region excluding the vicinity of the current path portion 12. Thus, strain applied to the current blocking layer 14 due to the difference between the lattice constants of the current blocking layer 14 and the n-type contact layer 4 of n-type GaN formed on the sapphire substrate 1 with the large thickness of about 4 μm can be relaxed, thereby inhibiting the current blocking layer 14 from formation of lattice defects. Consequently, the thickness of the current blocking layer 14 can be increased, thereby stabilizing transverse light confinement.

A method of fabricating the nitride-based semiconductor laser device according to the first embodiment is now described with reference to FIGS. 1 to 7.

Figure 2:
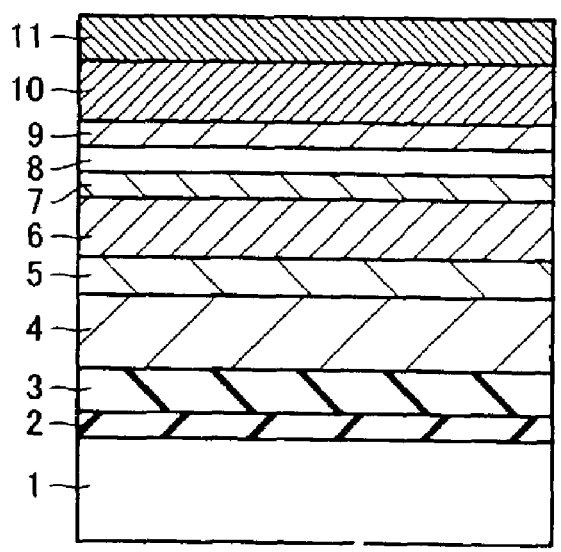
FIGS. 2 to 7 are sectional views for illustrating a method of fabricating the nitride-based semiconductor laser device according to the first embodiment of the present invention.

First, the buffer layer 2 of AlGaN having the thickness of about 15 nm is formed on the sapphire substrate 1 by MOVPE (metal organic vapor phase epitaxy) under the atmospheric pressure while holding the substrate temperature at about 600° C., as shown in FIG. 2. Then, the undoped GaN layer 3 having the thickness of about 0.5 μm and the n-type contact layer 4 of Si-doped GaN having the thickness of about 4 μm are formed on the buffer layer 2 while holding the substrate temperature at about 1150° C. Further, the anti-cracking layer 5 of n-type $In_{0.05}Ga_{0.95}N$ having the thickness of about 0.1 μm is formed on the n-type contact layer 4 while holding the substrate temperature at about 880° C. The n-type second cladding layer 6 of Si-doped $Al_{0.3}Ga_{0.7}N$ having the thickness of about 1 μm and the n-type first cladding layer 7 of Si-doped GaN having the thickness of about 50 nm are formed on the anti-cracking layer 5 while holding the substrate temperature at about 1150° C.

Then, five undoped GaN barrier layers and four undoped $In_{0.15}Ga_{0.85}N$ well layers are alternately stacked on the n-type first cladding layer 7 while holding the substrate temperature at about 880° C., thereby forming the MQW emission layer 8. The p-type first cladding layer 9 of Mg-doped GaN having the thickness of about 40 nm, the p-type second cladding layer 10 of Mg-doped AlGaN (Al composition: 0.08) having the thickness of about 0.45 μm and the cap layer 11 of p-type GaN having the thickness of about 50 nm are successively formed on the MQW emission layer 8 while holding the substrate temperature at about 1150° C.

Figure 3:
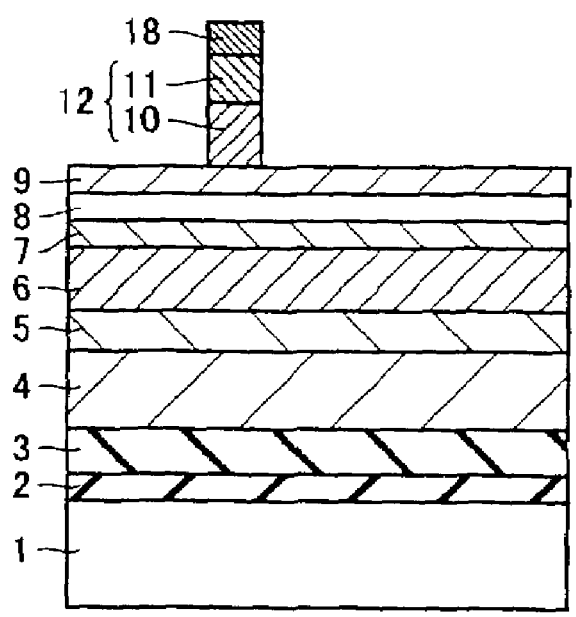

Thereafter a striped Ni mask layer 18 having a width of about 2 μm is formed on a prescribed region of the cap layer 11, as shown in FIG. 3. This Ni mask layer 18 is employed as a mask for etching the cap layer 11 and the p-type second cladding layer 10 to partially expose the p-type first cladding layer 9 by RIE (reactive ion etching) or the like with etching gas of $CF_4$, for example. Thus, the current path portion (ridge portion) 12 is formed by the p-type second cladding layer 10 having the width of about 2 μm and the cap layer 11 as show in FIG. 3. Thereafter the Ni mask layer 18 is removed.

Figure 4:
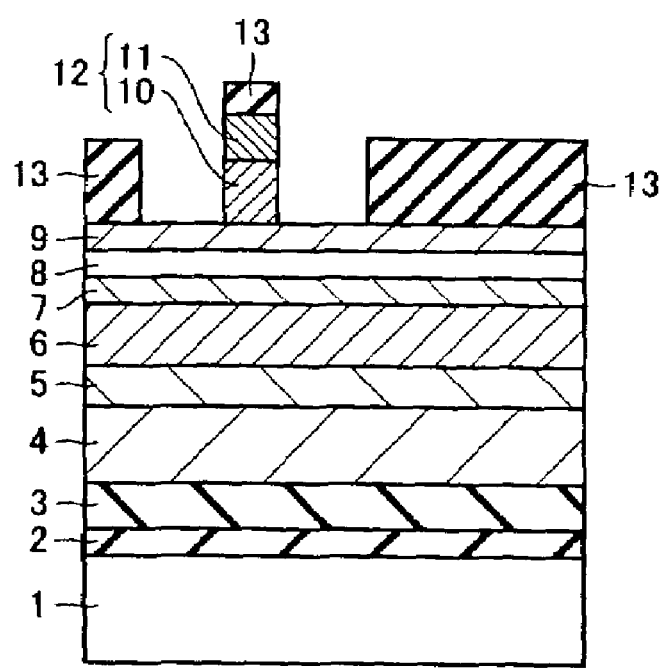

Then, a silicon nitride layer (not shown) of $Si_3N_4$ or the like is formed to cover the overall surface by ECR (electron cyclotron resonance) plasma CVD (chemical vapor deposition), for example, and thereafter patterned by photolithography and wet etching employing BHF (buffered hydrofluoric acid) thereby forming the mask layer 13 as shown in FIG. 4. This mask layer 13 is formed on the upper surface of the current path portion 12 (the cap layer 11) and on partial regions of the upper surface of the p-type first cladding layer 9. The mask layer 13 is formed to have the opening of about 10 μm in width around the current path portion 12 on the upper surface of the p-type first cladding layer 9. The upper surface of the p-type first cladding layer 9 is partially exposed in the opening of the mask layer 13.

Figure 5:
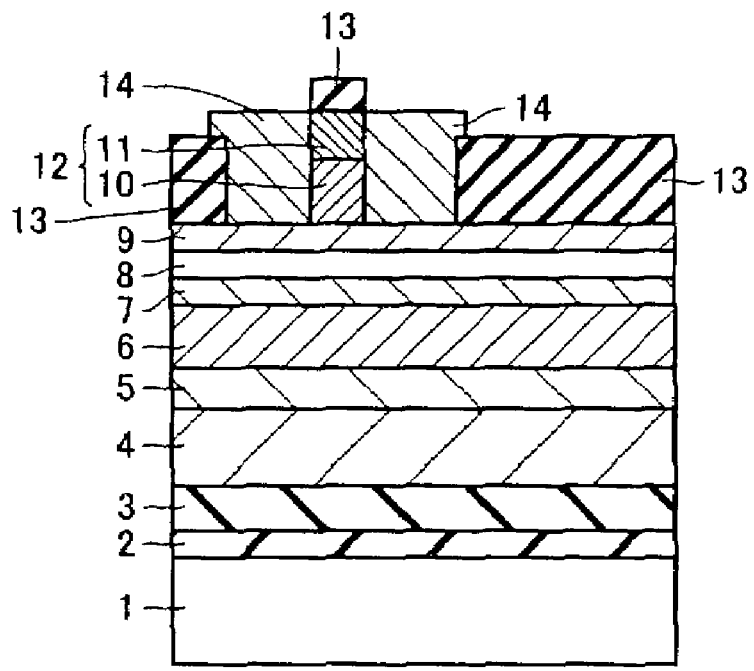

Then, the mask layer 13 is employed as a mask for selectively growing the current blocking layer 14 having the thickness of about 3 μm on the exposed part of the upper surface of the p-type first cladding layer 9 by low-pressure MOVPE with pressure of about $1 \times 10^4$ Pa to cover the side portions of the current path portion 12, as shown in FIG. 5. In this case, the flow rate of $NH_3$ is set to about three times that of $NH_3$ employed for MOVPE under the atmospheric pressure while holding the substrate temperature at about 880° C., for example. The current blocking layer 14 grown under such conditions is formed on the part of the upper surface of the p-type first cladding layer 9 exposed in the opening of the mask layer 13 and on partial regions of the upper surface of the mask layer 13 to cover the side portions of the current path portion 12. Thereafter the mask layer 13 is removed from the current path portion 12 (the cap layer 11).

Figure 6:
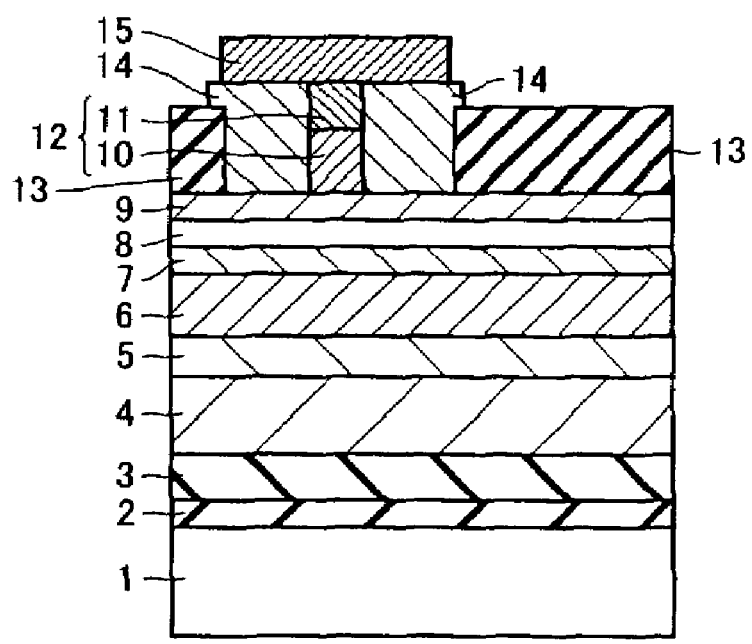

Then, the p-type contact layer 15 of Mg-doped GaN having the thickness of about 3 μm to about 5 μm is formed on the current path portion 12 (the cap layer 11) and on the current blocking layer 14 by low-pressure MOVPE with pressure of about $1 \times 10^4$ Pa, as shown in FIG. 6. In this case, Mg-doped GaN is selectively grown on the current path portion 12 (the cap layer 11) and on the current blocking layer 14. Thus, the p-type contact layer 15 having the width of about 8 μm is formed around the current path portion 12. Raw material gas for forming the layers 2 to 11, 14 and 15 consisting of nitride semiconductors on the sapphire substrate 1 by MOVPE is prepared from trimethyl aluminum (TMAl), trimethyl gallium (TMGa), trimethyl indium (TMIn), $NH_3$, $SiH_4$ or cyclopentadienyl magnesium ($Cp_2Mg$), for example.

Figure 7:
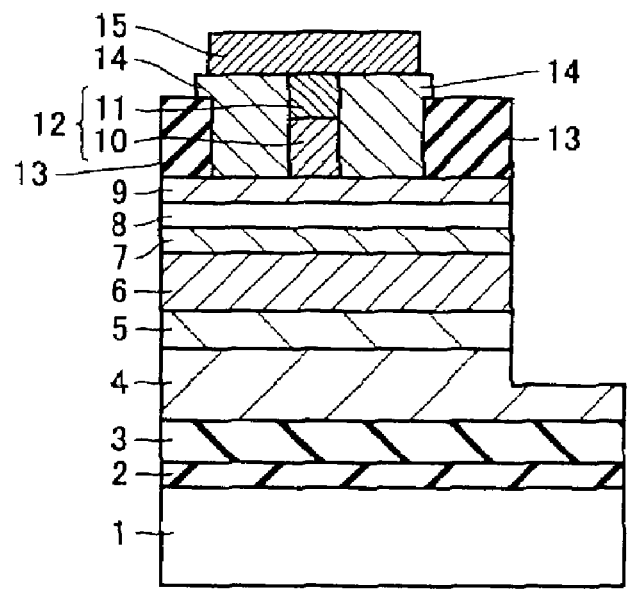

Then, a striped Ni mask (not shown) having a width of about 70 μm and a thickness of about 3 μm to about 5 μm, for example, is formed on a prescribed region of the wafer through a metal mask by EB (electron beam) deposition. Thereafter partial regions of the mask layer 13, the p-type first cladding layer 9, the MQW emission layer 8, the n-type first cladding layer 7, the n-type second cladding layer 6, the anti-cracking layer 5 and the n-type contact layer 4 are removed through the Ni mask by RIE or the like with etching gas of $CF_4$, for example, thereby forming the mesa portion having the thickness of about 70 μm as shown in FIG. 7. Thereafter the Ni mask is removed with hydrochloric acid or the like.

Finally, the p-side electrode 16 of Au/Pd is formed on the p-type contact layer 15, as shown in FIG. 1. Further, the n-side electrode 17 of Au/Ti is formed on the part of the surface of the n-type contact layer 4 exposed by etching. The wafer formed in the aforementioned manner is cleaved, for example, thereby forming a cavity structure having a cavity length of about 300 μm along the longitudinal direction of stripes. Thus, the nitride-based semiconductor laser device according to the first embodiment is fabricated.

In the method of fabricating the nitride-based semiconductor laser device according to the first embodiment, the mask layer 13 is employed as the mask for forming the current blocking layer 14 by selective growth as hereinabove described, so that the current blocking layer 14 can be formed only in the vicinity of the current path portion 12. Thus, strain applied to the current blocking layer 14 due to the difference between the lattice constants of the current blocking layer 14 and the n-type contact layer 4 of n-type GaN formed with the large thickness of about 4 μm can be relaxed.

(Second Embodiment)

The structure of a nitride-based semiconductor laser device according to a second embodiment of the present invention is described with reference to FIG. 8. The nitride-based semiconductor laser device according to the second embodiment is a real refractive index guided laser device. While the current blocking layer 14 is selectively grown only in the vicinity of the current path portion 12 by using the mask layer 13 in the aforementioned first embodiment, a current blocking layer 33 is selectively grown on step portions 100 thereby forming parts of the current blocking layer 33 having a smaller thickness than that in the vicinity of a current path portion 32 in regions not in the vicinity of the current path portion 32 in the second embodiment. The second embodiment is now described in detail.

In the structure of the nitride-based semiconductor laser device according to the second embodiment, a buffer layer 22 of AlGaN having a thickness of about 15 nm and an undoped GaN layer 23 having a thickness of about 0.5 $\mu$m are formed on a sapphire (0001) plane substrate 21 (hereinafter referred to as "sapphire substrate 21"). An n-type contact layer 24 of n-type GaN having a mesa portion of about 10 $\mu$m in width and a thickness of about 4 $\mu$m is formed on the undoped GaN layer 23. The sapphire substrate 21 is an example of the "substrate" according to the present invention, and the n-type contact layer 24 is an example of the "nitride-based semiconductor layer" according to the present invention.

An anti-cracking layer 25 of n-type $In_{0.05}Ga_{0.95}N$ having a thickness of about 0.1 $\mu$m, an n-type second cladding layer 26 of Si-doped $Al_{0.1}Ga_{0.9}N$ having a thickness of about 1 $\mu$m, an n-type first cladding layer 27 of Si-doped GaN having a thickness of about 50 nm and an MQW emission layer 28 consisting of multiple quantum wells (MQW) of InGaN are formed on the mesa portion of the n-type contact layer 24 to have a width of about 10 $\mu$m. The MQW emission layer 28 is formed by alternately stacking five barrier layers of undoped $In_yGa_{1-y}N$ (In composition: y=0, i.e., GaN) each having a thickness of about 4 nm and four well layers of undoped $In_xGa_{1-x}N$ (In composition: x=0.15) each having a thickness of about 4 nm. The MQW emission layer 28 is an example of the "emission layer" according to the present invention.

A p-type first cladding layer 29 of Mg-doped GaN having a width of about 2 $\mu$m and a thickness of about 40 nm is formed substantially at the center of the upper surface of the MQW emission layer 28. A p-type second cladding layer 30 of Mg-doped $Al_vGa_{1-v}N$ (Al composition: v=0.08) having a width of about 2 $\mu$m and a thickness of about 0.45 $\mu$m and a cap layer 31 of p-type GaN having a width of about 2 $\mu$m and a thickness of about 50 nm are formed to be substantially in contact with the overall upper surface of the p-type first cladding layer 29. The p-type first cladding layer 29, the p-type second cladding layer 30 and the cap layer 31 form the current path portion 32 having a width W1 (about 2 $\mu$m in the second embodiment).

Each of exposed parts (terraces) 28a of the upper surface of the MQW emission layer 28 located on both sides of the current path portion 32 has a width of about 4 $\mu$m. The step portions 100 of about 3 $\mu$m in height are formed on the outer sides of the terraces 28a. In other words, the step portions 100 are formed on positions separating from the current path portion 32 by the width (about 4 $\mu$m) of the terraces 28a. Thus, the step portions 100 are preferably formed on positions separating from the current path portion 32 by at least once and not more than three times (twice (about 4 $\mu$m) in this embodiment) the width (about 2 $\mu$m) of the current path portion 32. The p-type first cladding layer 29 and the p-type second cladding layer 30 are examples of the "cladding layer" according to the present invention.

A current blocking layer 33 of undoped $Al_wGa_{1-w}N$ (Al composition: w=0.3) is formed to cover partial side portions of the current path portion 32, the upper surface of the MQW emission layer 28 and the step portions 100. In this case, the part of the current blocking layer 33 formed on the upper surface of the MQW emission layer 28 has a thickness of about 3 $\mu$m on the terraces 28a in the vicinity of the current path portion 32 while having a smaller thickness on the step portions 100 as compared with the thickness in the vicinity of the current path portion 32. In this case, the distance W2 (about 10 $\mu$m) between the step portions 100 including the current path portion 32 is set to at least three times and not more than seven times (five times in this embodiment) the width W1 (about 2 $\mu$m) of the current path portion 32.

A p-type contact layer 34 of Mg-doped GaN having a thickness of about 1 $\mu$m is formed to cover part of the upper surface of the current blocking layer 33 in the vicinity of the current path portion 32 and the current path portion 32 (the cap layer 31) exposed on the current blocking layer 33. Each of the layers 22 to 31, 33 and 34 has a wurtzite structure, and is formed by growth in the [0001] direction of the nitride-based semiconductor. Raw material gas for forming the layers 22 to 31, 33 and 34 consisting of nitride semiconductors on the sapphire substrate 21 by MOVPE is prepared from trimethyl aluminum (TMAl), trimethyl gallium (TMGa), trimethyl indium (TMIn), $NH_3$, $SiH_4$ or cyclopentadienyl magnesium ($Cp_2Mg$), for example.

A p-side electrode 35 consisting of Au/Pd is formed on the p-type contact layer 34 by stacking Pd and Au layers on the p-type contact layer 34 in this order. An n-side electrode 36 consisting of Au/Ti is formed on the exposed surface part of the n-type contact layer 24 by stacking Ti and Au layers on the n-type contact layer 24 in this order.

According to the second embodiment, the current blocking layer 33 is formed to have the large thickness of about 3 $\mu$m in the vicinity of the current path portion 32 and thinly formed on the step portions 100 not in the vicinity of the current path portion 32 as hereinabove described, so that strain applied to the current blocking layer 33 due to the difference between the lattice constants of the current blocking layer 33 and the n-type contact layer 24 of n-type GaN formed on the sapphire substrate 21 with the large thickness of about 4 $\mu$m easily concentrates to the thin regions (the step portions 100) of the current blocking layer 33. Thus, lattice defects or cracks are easily caused in the thin regions of the current blocking layer 33 not in the vicinity of the current path portion 32, whereby the current blocking layer 33 can be inhibited from formation of cracks or lattice defects in the vicinity of the current path portion 32. Consequently, the thickness of the current blocking layer 33 can be increased in the vicinity of the current path portion 32, thereby stabilizing transverse light confinement.

A method of fabricating the nitride-based semiconductor laser device according to the second embodiment is now described with reference to FIGS. 8 to 14.

Figure 9:
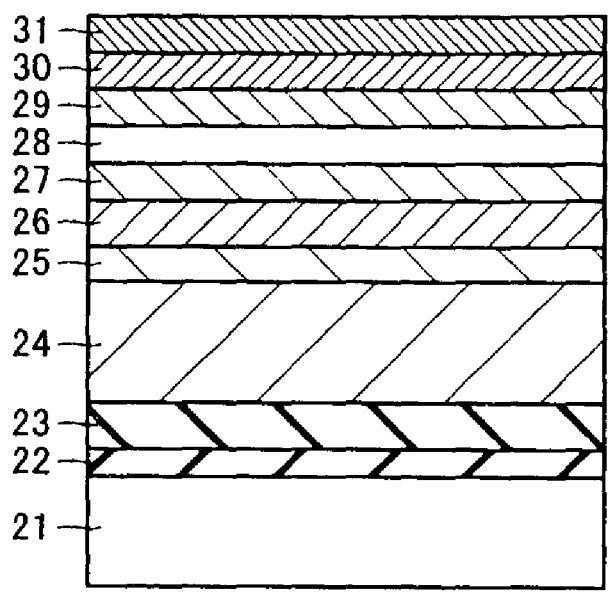
FIGS. 9 to 14 are sectional views for illustrating a method of fabricating the nitride-based semiconductor laser device according to the second embodiment of the present invention.

As shown in FIG. 9, the buffer layer 22 of AlGaN having the thickness of about 15 nm, the undoped GaN layer 23 having the thickness of about 0.5 $\mu$m, the n-type contact layer 24 of Si-doped GaN having the thickness of about 4 $\mu$m, the anti-cracking layer 25 of n-type $In_{0.05}Ga_{0.95}N$ having the thickness of about 0.1 $\mu$m, the n-type second cladding layer 26 of Si-doped $Al_{0.1}Ga_{0.9}N$ having the thickness of about 1 $\mu$m and the n-type first cladding layer 27 of Si-doped GaN having the thickness of about 50 nm are formed on the sapphire substrate 21 by MOVPE under the atmospheric pressure under conditions similar to the growth conditions according to the first embodiment shown in FIG. 2.

Then, five undoped GaN barrier layers and four undoped $In_{0.15}Ga_{0.85}N$ well layers are alternately stacked on the n-type first cladding layer 27, thereby forming the MQW emission layer 28. The p-type first cladding layer 29 of Mg-doped GaN having the thickness of about 40 nm, the p-type second cladding layer 30 of Mg-doped $Al_vGa_{1-v}N$ (Al composition: v=0.08) having the thickness of about 0.45 μm and the cap layer 31 of p-type GaN having the thickness of about 50 nm are formed on the MQW emission layer 28.

Figure 10:
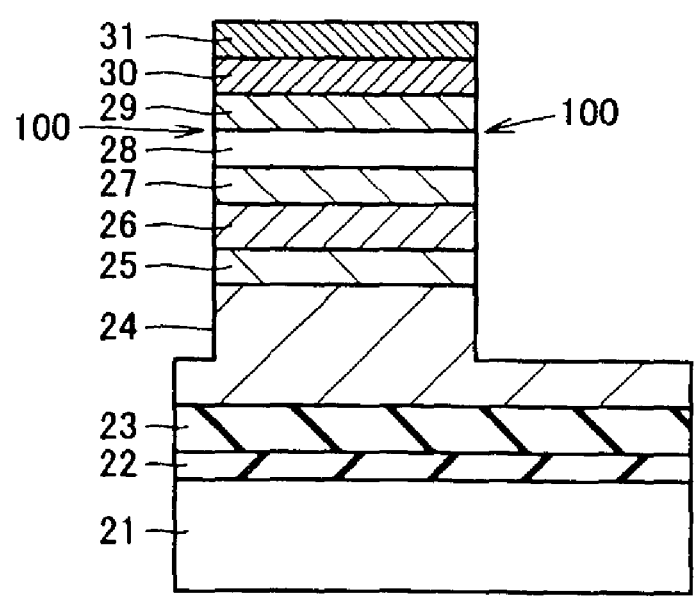

Thereafter a striped Ni mask layer (not shown) having a width of about 10 μm is formed on a prescribed region of the cap layer 31, as shown in FIG. 10. This Ni mask layer is employed as a mask for removing partial regions of the cap layer 31, the p-type second cladding layer 30, the p-type first cladding layer 29, the MQW emission layer 28, the n-type first cladding layer 27, the n-type second cladding layer 26, the anti-cracking layer 25 and the n-type contact layer 24 by etching with etching gas of $CF_4$, for example, thereby forming the step portions 100. Thereafter the Ni mask layer is removed.

Figure 11:
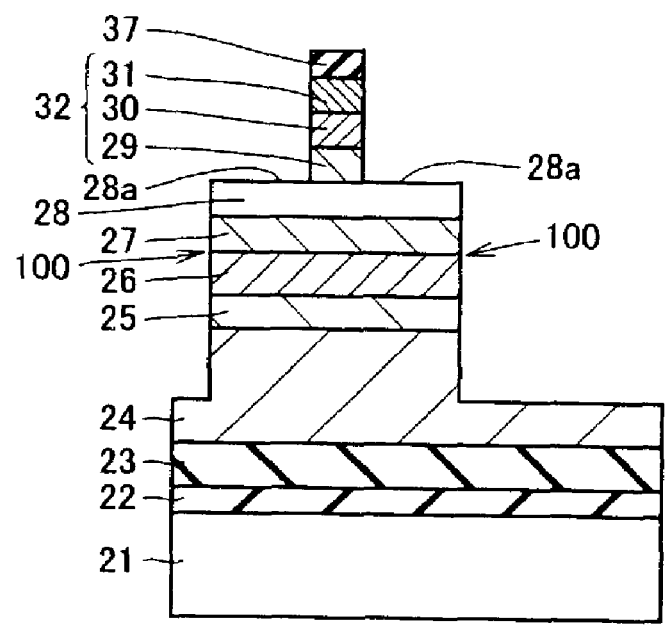

Thereafter another striped Ni mask layer (not shown) having a width of about 2 μm is formed on the cap layer 31. This Ni mask layer is employed as a mask for etching the cap layer 31, the p-type second cladding layer 30 and the p-type first cladding layer 29 by RIE or the like with etching gas of $CF_4$, for example, until the MQW emission layer 28 is exposed, and thereafter the Ni mask layer is removed. Thus, the current path portion (ridge portion) 32, having the width of about 2 μm, consisting of the p-type first cladding layer 29, the p-type second cladding layer 30 and the cap layer 31 is formed as shown in FIG. 11. In this case, the terraces 28a having the width of about 4 μm are formed on both sides of the current path portion 32 while exposing the MQW emission layer 28 on the upper surfaces thereof. Thereafter a mask layer 37 of a silicon nitride such as $Si_3N_4$ having a width of about 2 μm and a thickness of about 0.5 μm is formed only on the upper surface of the current path portion 32 (the cap layer 31) by ECR plasma CVD, for example.

Figure 12:
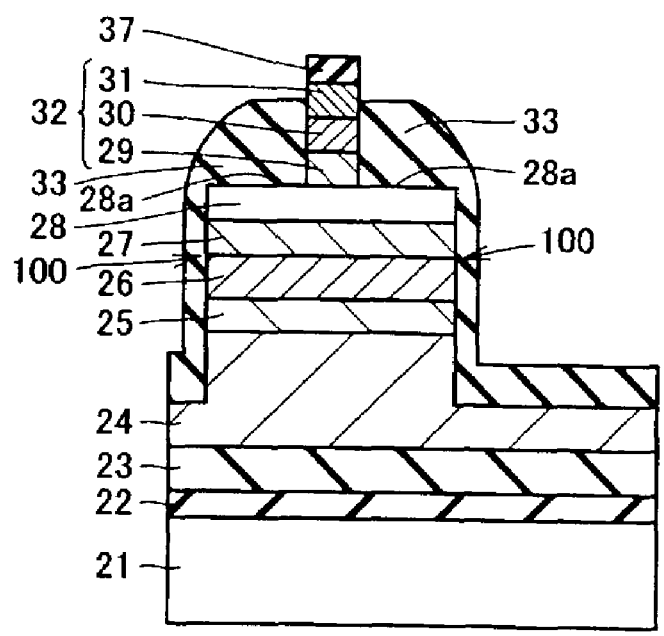

As shown in FIG. 12, the current blocking layer 33 is selectively grown by low-pressure MOVPE with pressure of about $1 \times 10^4$ Pa on the step portions 100. Thus, the current blocking layer 33 of undoped AlGaN is formed to cover partial regions of the side portions of the current path portion 32, the upper surface of the MQW emission layer 28, the side surfaces (the step portions 100) of the MQW emission layer 28, the n-type first cladding layer 27, the n-type second cladding layer 26, the anti-cracking layer 25 and the n-type contact layer 24 and the upper surface of the n-type contact layer 24. According to this selective growth on the step portions 100, the part of the current blocking layer 33 formed in the vicinity of the current path portion 32 on the MQW emission layer 28 has the large thickness of about 3 μm, while the parts formed on the step portions 100 have a smaller thickness than that in the vicinity of the current path portion 32. Thereafter the mask layer 37 is removed from the current path portion 32 (the cap layer 31).

Figure 13:
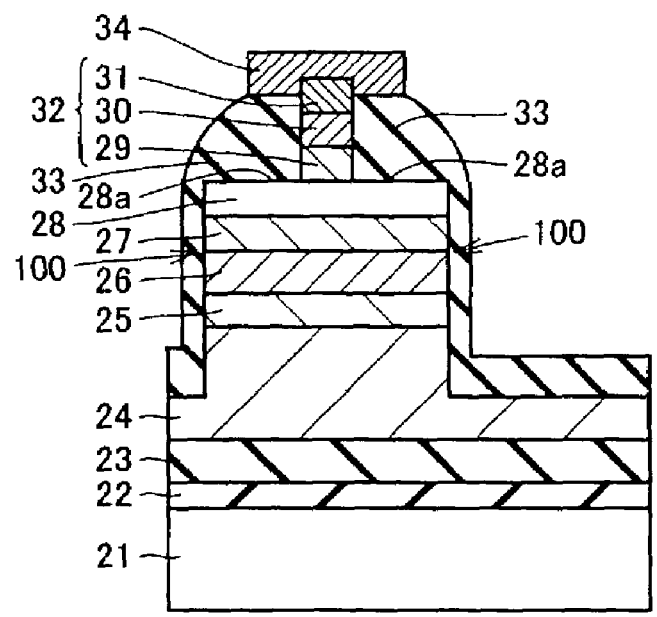

As shown in FIG. 13, the p-type contact layer 34 of Mg-doped GaN having the thickness of about 1 μm is formed by low-pressure MOVPE with pressure of about $1 \times 10^4$ Pa to cover part of the current blocking layer 33 in the vicinity of the current path portion 32 and the current path portion 32 (the cap layer 31) exposed on the current blocking layer 33.

Figure 14:
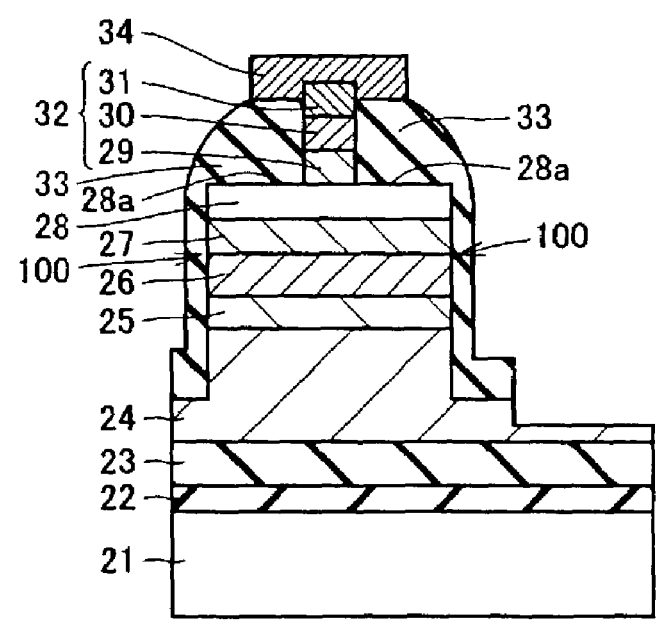

Then, a striped Ni mask layer (not shown) having a width of about 70 μm and a thickness of about 3 μm to about 5 μm, for example, is formed on a prescribed region of the wafer through a metal mask by EB deposition. This Ni mask layer is employed as a mask for removing partial regions of the current blocking layer 33 and the n-type contact layer 24 by RIE or the like with etching gas of $CF_4$, for example, thereby partially exposing the upper surface of the n-type contact layer 24 as shown in FIG. 14. Thereafter the aforementioned Ni mask layer is removed with hydrochloric acid or the like.

Figure 8:
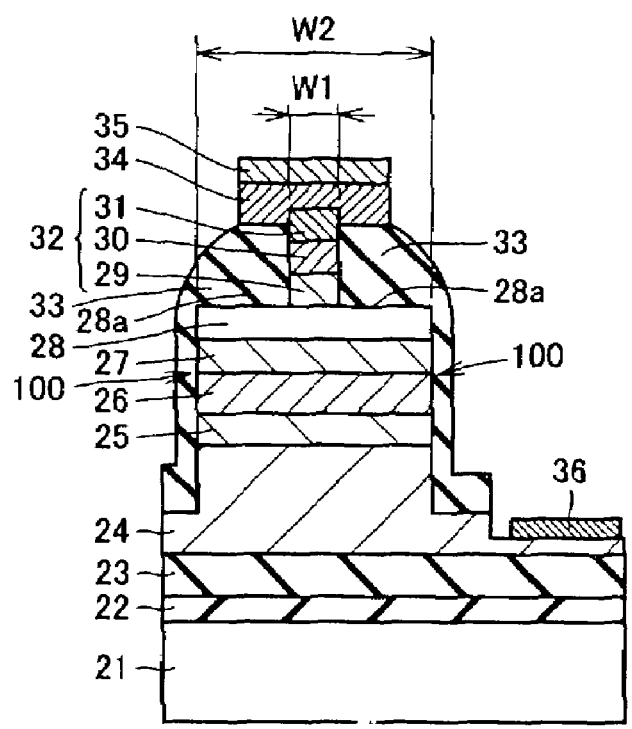
FIG. 8 is a sectional view showing a nitride-based semiconductor laser device according to a second embodiment of the present invention.

Finally, the p-side electrode 35 of Au/Pd is formed on the p-type contact layer 34, as shown in FIG. 8. Further, the n-side electrode 36 of Au/Ti is formed on the surface part of the n-type contact layer 24 exposed by etching. The wafer formed in the aforementioned manner is cleaved, for example, thereby forming a cavity structure having a cavity length of about 300 μm in the longitudinal direction of stripes. Thus, the nitride-based semiconductor laser device according to the second embodiment is fabricated.

In the method of fabricating the nitride-based semiconductor laser device according to the second embodiment, the current blocking layer 33 is selectively grown on the step portions 100 as hereinabove described, whereby crystallinity of the current blocking layer 33 can be improved. Due to the selective growth on the step portions 100, further, the thin regions of the current blocking layer 33 can be formed on the step portions 100 not in the vicinity of the current path portion 32. Therefore, strain applied to the current blocking layer 33 due to the difference between the lattice constants of the current blocking layer 33 and the n-type contact layer 24 of n-type GaN having the large thickness of about 4 μm easily concentrates to the thin regions of the current blocking layer 33. Thus, the current blocking layer 33 can be inhibited from formation of cracks or lattice defects in the vicinity of the current path portion 32.

(Third Embodiment)

The structure of a nitride-based semiconductor laser device according to a third embodiment of the present invention is described with reference to FIG. 15. The nitride-based semiconductor laser device according to the third embodiment has a real refractive index guided self-aligned structure.

In the structure of the nitride-based semiconductor laser device according to the third embodiment, a buffer layer 42 of n-type AlGaN having a thickness of about 15 nm, an n-type GaN layer 43 of n-type GaN having a thickness of about 4 μm, an anti-cracking layer 44 of n-type $In_{0.05}Ga_{0.95}N$ having a thickness of about 0.1 μm, an n-type second cladding layer 45 of n-type AlGaN having a thickness of about 1 μm and an n-type first cladding layer 46 of n-type GaN having a thickness of about 50 nm are formed on an n-type Si (111) plane substrate 41 (hereinafter referred to as "n-type Si substrate 41").

An MQW emission layer 47 consisting of multiple quantum wells (MQW) of InGaN is formed on the n-type first cladding layer 46. This MQW emission layer 47 is formed by alternately stacking five barrier layers of undoped $In_yGa_{1-y}N$ (In composition: y=0, i.e., GaN) each having a thickness of about 4 nm and four well layers of undoped $In_xGa_{1-x}N$ (In composition: x=0.15) each having a thickness of about 4 nm. The n-type Si substrate 41 is an example of the "substrate" according to the present invention, and the n-type GaN layer 43 is an example of the "nitride-based semiconductor layer" according to the present invention. The MQW emission layer 47 is an example of the "emission layer" according to the present invention.

A p-type first cladding layer 48 of Mg-doped GaN having a thickness of about 40 nm is formed on the MQW emission layer 47. A mask layer 49 of a silicon nitride such as $Si_3N_4$ having an opening of about 8 μm in width is formed on a partial region of the upper surface of the p-type first cladding layer 48. A current blocking layer 50 of undoped $Al_wGa_{1-w}N$ (Al composition: w=0.2) having an opening and a thickness of about 3 μm is formed on the upper surface of the p-type first cladding layer 48 exposed in the opening of the mask layer 49 with a width W2 of about 8 μm. A p-type second cladding layer 52 of undoped $Al_vGa_{1-v}N$ (Al composition: v=0.08) having a thickness of about 0.45 μm is formed on the p-type first cladding layer 48 in the opening of the current blocking layer 50. The p-type second cladding layer 52 has an inverse mesa shape (inverse trapezoidal shape) and is so formed that a surface closer to the p-type first cladding layer 48 has a width W1 of about 2 μm and side surfaces thereof are in contact with the inner side surface of the opening of the current blocking layer 50. The p-type first cladding layer 48 is an example of the "first cladding layer" according to the present invention, and the p-type second cladding layer 52 is an example of the "second cladding layer" according to the present invention.

A mask layer 51 of a silicon nitride such as $Si_3N_4$ is formed on the upper surface of the current blocking layer 50. A p-type contact layer 53 of Mg-doped GaN having a thickness of about 3 μm to about 5 μm is formed on the p-type second cladding layer 52 and on the mask layer 51. The p-type second cladding layer 52 and the p-type contact layer 53 form a current path portion having the width W1 (about 2 μm in the third embodiment). The width (the total width of the current path portion and the current blocking layer 50) W2 (about 8 μm) of the opening of the mask layer 49 is set in the range of at least three times and not more than seven times (four times in this embodiment) the width W1 (about 2 μm) of the current path portion (the lower surface of the p-type second cladding layer 52), for the following reason:

If the total width W2 of the current path portion and the current blocking layer 50 is smaller than three times the width W1 of the current path portion, the range of formation of the current blocking layer 50 is so excessively reduced that transverse light confinement is insufficient. If the total width W2 of the current path portion and the current blocking layer 50 is larger than seven times the width W1 of the current path portion, strain applied to the current blocking layer 50 is so increased as to cause a large number of crystal defects or cracks on the current blocking layer 50. Therefore, the total width W2 of the current path portion and the current blocking layer 50 is preferably set in the range of at least three times and not more than seven times the width W1 of the current path portion. Each of the layers 42 to 48, 50, 52 and 53 has a wurtzite structure and is formed by growth in the [0001] direction of the nitride-based semiconductor.

A p-side electrode 54 of Au/Pd is formed on the p-type contact layer 53 by stacking Pd and Au layers on the p-type contact layer 53 in this order. An n-side electrode 55 of Au/Ti is formed on the back surface of the n-type Si substrate 41 having conductivity by stacking Ti and Au layers on the n-type Si substrate 41 in this order.

According to the third embodiment, as hereinabove described, the current blocking layer 50 is formed in the range of the width W2 (about 8 μm) of the opening of the mask layer 49, so that the current blocking layer 50 can be provided only in the vicinity of the current path portion. Thus, the width of the current blocking layer 50 is reduced as compared with that formed in the vicinity of the current path portion and on the overall surface excluding the region in the vicinity of the current path portion. Therefore, strain applied to the current blocking layer 50 due to the difference between the lattice constants of the current blocking layer 50 and the n-type GaN layer 43 of n-type GaN formed on the Si substrate 41 with the large thickness of about 4 μm can be relaxed, whereby the current blocking layer 50 can be inhibited from formation of cracks or lattice defects. Consequently, the thickness of the current blocking layer 50 can be increased, thereby stabilizing transverse light confinement.

A method of fabricating the nitride-based semiconductor laser device according to the third embodiment is now described with reference to FIGS. 15 to 19.

Figure 16:
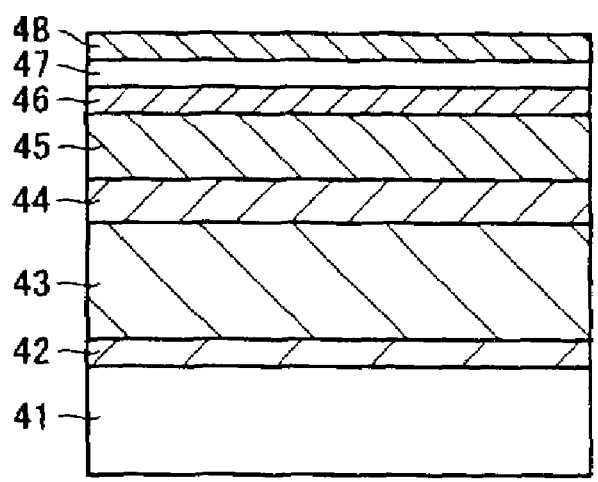
FIGS. 16 to 19 are sectional views for illustrating a method of fabricating the nitride-based semiconductor laser device according to the third embodiment of the present invention.

As shown in FIG. 16, the buffer layer 42 of n-type AlGaN having the thickness of about 15 nm and the n-type GaN layer 43 of Si-doped GaN having the thickens of about 4 μm are formed on the n-type Si substrate 41 by MOVPE under the atmospheric pressure while holding the substrate temperature at about 1150° C. Then, the anti-cracking layer 44 of n-type $In_{0.05}Ga_{0.95}N$ having the thickness of about 0.1 μm is formed on the n-type GaN layer 43 while holding the substrate temperature at about 880° C. The n-type second cladding layer 45 of Si-doped $Al_{0.15}Ga_{0.85}N$ having the thickness of about 1 μm and the n-type first cladding layer 46 of Si-doped GaN having the thickness of about 50 nm are formed on the anti-cracking layer 44 while holding the substrate temperature at about 1150° C.

Then, five undoped GaN barrier layers and four undoped $In_{0.15}Ga_{0.85}N$ well layers are alternately stacked on the n-type first cladding layer 46 while holding the substrate temperature at about 880° C., thereby forming the MQW emission layer 47. The p-type first cladding layer 48 of Mg-doped GaN having the thickness of about 40 nm is formed on the MQW emission layer 48 while holding the substrate temperature at about 1150° C.

Figure 17:
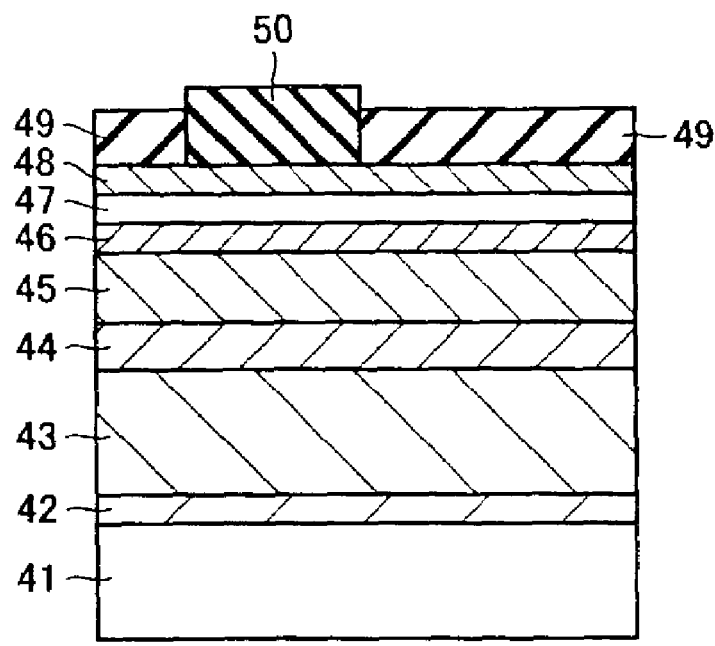

Thereafter the striped mask layer 49 of a silicon nitride such as $Si_3N_4$ having the opening of about 8 μm in width is formed on the upper surface of the p-type first cladding layer 48, as shown in FIG. 17. The mask layer 49 is employed as a mask for selectively growing undoped AlGaN (Al composition: 0.2) on the upper surface of the p-type first cladding layer 48 exposed in the opening of the mask layer 49 by low-pressure MOVPE with pressure of about $1 \times 10^4$ Pa, thereby forming the current blocking layer 50 of undoped AlGaN (Al composition: 0.2) having the thickness of about 3 μm. In this case, the flow rate of $NH_3$ is set to three times the flow rate of $NH_3$ employed for MOVPE under the atmospheric pressure while increasing the substrate temperature by about 100° C., for example. When the current blocking layer 50 is grown under such conditions, undoped AlGaN is selectively grown upward from the upper surface of the p-type first cladding layer 48 exposed in the opening of the mask layer 49 while no undoped AlGaN is grown on the mask layer 49. Thus, the current blocking layer 50 is formed on the upper surface of the p-type first cladding layer 48 exposed in the opening of the mask layer 49 within the range of the width W2 (see FIG. 15) of about 8 μm of the opening of the mask layer 49.

Figure 18:
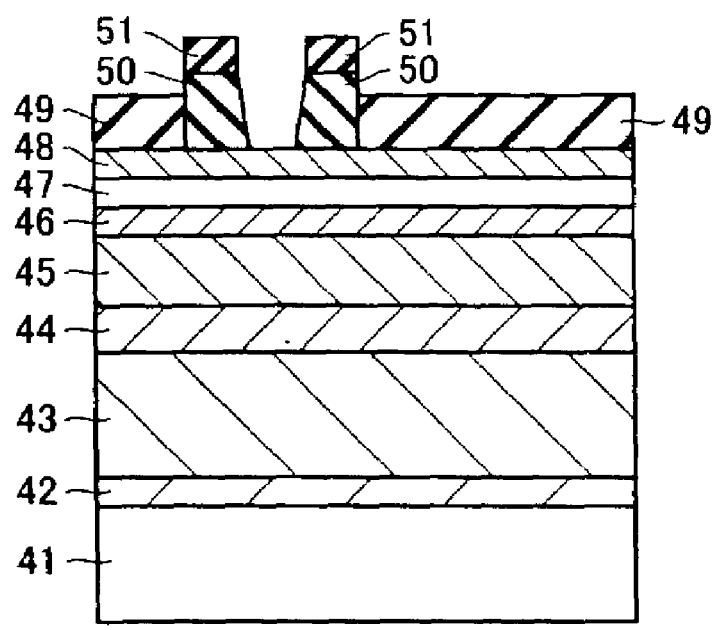

As shown in FIG. 18, the mask layer 51 of SiN is formed on a region of the upper surface of the current blocking layer 50 except the portion for forming the current path portion. The mask layer 51 is employed as a mask for etching the current blocking layer 50 with etching gas of $CF_4$, for example, until the upper surface of the p-type first cladding layer 48 is exposed by a width of about 2 μm. Thus, an opening for serving as the current path portion is formed in the current blocking layer 50.

Figure 19:
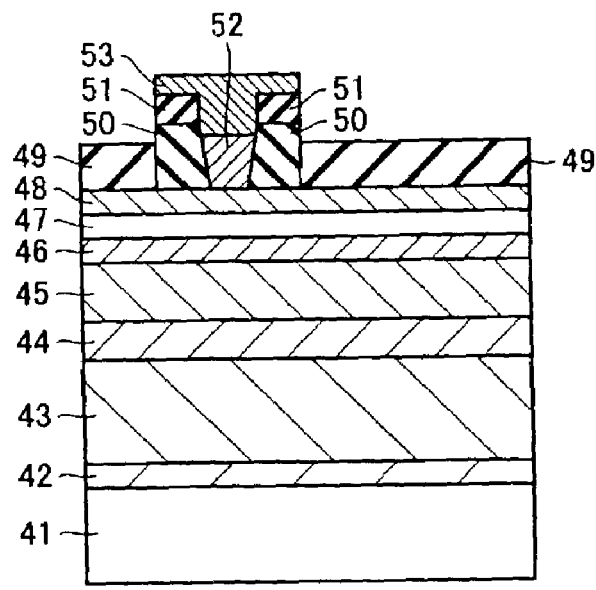

As shown in FIG. 19, the p-type second cladding layer 52 of Mg-doped AlGaN (Al composition: 0.08) is grown on the upper surface of the p-type first cladding layer 48 exposed in the opening of the current blocking layer 50 by low-pressure MOVPE with pressure of about $1 \times 10^4$ Pa. Thus, the p-type second cladding layer 52 having the width (bottom width) of about 2 μm is formed in a self-aligned manner. The p-type contact layer 53 of Mg-doped GaN having the thickness of about 3 μm to about 5 μm is formed on the upper surface of the p-type second cladding layer 52 and on the mask layer 51.

Raw material gas for forming the layers 42 to 48, 50, 52 and 53 consisting of nitride semiconductors on the n-type Si substrate 41 by MOVPE is prepared from trimethyl aluminum (TMAl), trimethyl gallium (TMGa), trimethyl indium (TMIn), $NH_3$, $SiH_4$ or cyclopentadienyl magnesium ($Cp_2Mg$), for example.

Figure 15:
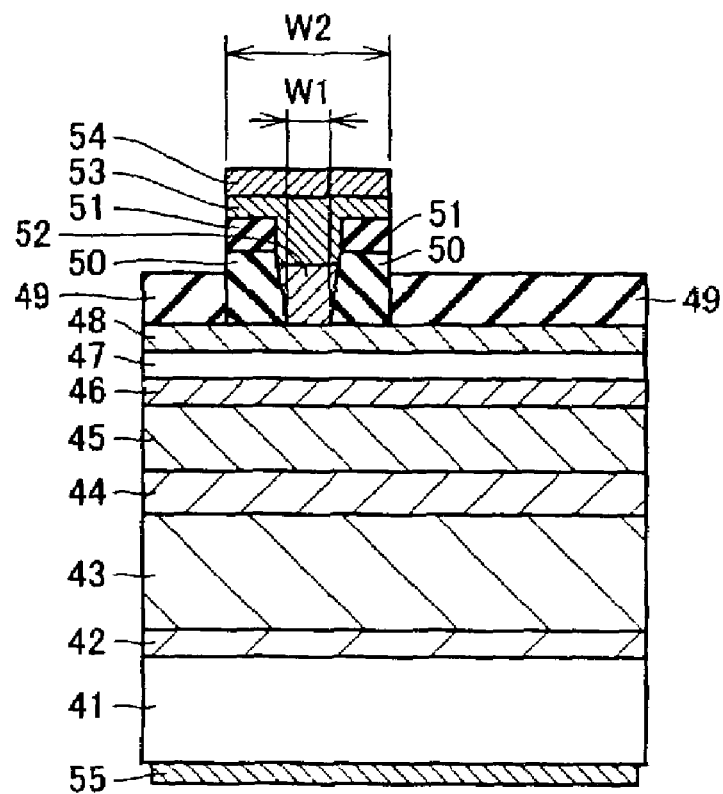
FIG. 15 is a sectional view showing a nitride-based semiconductor laser device according to a third embodiment of the present invention.

Finally, the p-side electrode 54 of Au/Pd is formed on the p-type contact layer 53, as shown in FIG. 15. Further, the n-side electrode 55 of Au/Ti is formed on the back surface of the n-type Si substrate 41 having conductivity. The wafer formed in the aforementioned manner is cleaved, for example, thereby forming a cavity structure having a cavity length of about 300 μm in the longitudinal direction of stripes. Thus, the self-aligned nitride-based semiconductor laser device according to the third embodiment is fabricated.

In the method of fabricating the nitride-based semiconductor laser device according to the third embodiment, the current blocking layer 50 having an opening is formed in the vicinity of the region of the upper surface of the p-type first cladding layer 48 formed with the current path portion by using the mask layer 49 followed by formation of the p-type second cladding layer 52 and the p-type contact layer 53 forming the current path portion on the p-type first cladding layer 48 in the opening of the current blocking layer 50, whereby the self-aligned nitride-based semiconductor laser device can be easily formed with the current blocking layer 50 provided only in the vicinity of the current path portion. Thus, the width of the current blocking layer 50 is reduced as compared with that formed on the overall surface, which consists of the vicinity of the current path portion and the region excluding the vicinity of the current path portion. Therefore, strain applied to the current blocking layer 50 due to the difference between the lattice constants of the current blocking layer 50 and the n-type GaN layer 43 of n-type GaN formed with the large thickness of about 4 μm can be relaxed, whereby the current blocking layer 50 can be inhibited fro formation of cracks or lattice defects.

According to the third embodiment, the current blocking layer 50 is formed by selective growth by using the mask layer 49 serving for a mask of the selective growth as described above, whereby crystallinity of the current blocking layer 50 can be improved in the self-aligned nitride-based semiconductor laser device.

(Fourth Embodiment)

The structure of a nitride-based semiconductor laser device according to a fourth embodiment of the present invention is described with reference to FIG. 20. According to the fourth embodiment, an n-type GaN substrate is employed for a self-aligned nitride-based semiconductor laser device. The fourth embodiment is now described in detail with reference to a complex refractive index guided nitride-based semiconductor laser device.

In the structure of the nitride-based semiconductor laser device according to the fourth embodiment, an anti-cracking layer 62 of n-type $In_{0.05}Ga_{0.95}N$ having a thickness of about 0.1 μm, an n-type second cladding layer 63 of Si-doped $Al_{0.3}Ga_{0.7}N$ having a thickness of about 1 μm, an n-type first cladding layer 64 of Si-doped GaN having a thickness of about 50 nm and an MQW emission layer 65 consisting of multiple quantum wells (MQW) of InGaN are formed on an n-type GaN (0001) plane substrate 61 (hereinafter referred to as "n-type GaN substrate 61"). The MQW emission layer 65 is formed by alternately stacking five barrier layers of undoped $In_yGa_{1-y}N$ (In composition: y=0, i.e., GaN) each having a thickness of about 4 nm and four well layers of undoped $In_xGa_{1-x}N$ (In composition: x=0.15) each having a thickness of about 4 nm. The n-type GaN substrate 61 is an example of the "GaN substrate" according to the present invention, and the MQW emission layer 65 is an example of the "emission layer" according to the present invention.

A p-type first cladding layer 66 of Mg-doped GaN having a thickness of about 40 nm is formed on the MQW emission layer 65. A mask layer 67 of a silicon nitride such as $Si_3N_4$ having an opening of about 8 μm in width is formed on a partial region of the upper surface of the p-type first cladding layer 66. A current blocking layer 68 of undoped $In_sGa_{1-s}N$ (In composition: s=0.15) having an opening with a thickness of about 3 μm is formed on the upper surface of the p-type first cladding layer 66 exposed in the opening of the mask layer 67 with a width W2 of about 8 μm. A p-type second cladding layer 70 of Mg-doped $Al_vGa_{1-v}N$ (Al composition: v=0.08) having a thickness of about 0.45 μm is formed on the p-type first cladding layer 66 in the opening of the current blocking layer 68. The p-type second cladding layer 70 is formed to have an inverse mesa shape (inverse trapezoidal shape) so that a surface closer to the p-type first cladding layer 66 has a width W1 of about 2 μm. The side surfaces of the p-type second cladding layer 70 are in contact with the inner side surface of the opening of the current blocking layer 68. The p-type first cladding layer 66 is an example of the "first cladding layer" according to the present invention, and the p-type second cladding layer 70 is an example of the "second cladding layer" according to the present invention.

A mask layer 69 of a silicon nitride such as $Si_3N_4$ is formed on the upper surface of the current blocking layer 68. A p-type contact layer 71 of Mg-doped GaN having a thickness of about 3 μm to about 5 μm is formed on the p-type second cladding layer 70 and on the mask layer 69. The p-type second cladding layer 70 and the p-type contact layer 71 form a current path portion having the width W1 (about 2 μm in the fourth embodiment). The width (the total width of the current path portion and the current blocking layer 68) W2 (about 8 μm) of the opening of the mask layer 67 is set in the range of at least three times and not more than seven times the width W1 (about 2 μm) of the current path portion (the lower surface of the p-type second cladding layer 70). The reason for setting the width W2 in this range is similar to that in the first embodiment. Each of the layers 62 to 66, 68, 70 and 71 has a wurtzite structure, and is formed by growth in the [0001] direction of the nitride-based semiconductor.

A p-side electrode 72 of Au/Pd is formed on the p-type contact layer 71 by stacking Pd and Au layers on the p-type contact layer 71 in this order. An n-side electrode 73 of Au/Pt/Ti/Al/Ti is formed on the back surface of the n-type GaN substrate 61 having conductivity by stacking Ti, Al, Ti, Pt and Au layers on the n-type GaN substrate 61 in this order so that the Ti layer is in contact with the n-type GaN substrate 61.

According to the fourth embodiment, the current blocking layer 68 is formed in the range of the width W2 (about 8 µm) of the opening of the mask layer 67 as hereinabove described, so that the current blocking layer 68 can be formed only in the vicinity of the current path portion. Therefore, the width of the current blocking layer 68 is reduced as compared with that formed on the overall surface, which consists of the vicinity of the current path portion and the region excluding the vicinity of the current path portion. Thus, strain applied to the current blocking layer 68 due to the difference between the lattice constants of the current blocking layer 68 and the n-type GaN substrate 61 can be relaxed, whereby the current blocking layer 68 can be inhibited from formation of cracks or lattice defects. Consequently, the thickness of the current blocking layer 68 can be increased, thereby stabilizing transverse light confinement.

A method of fabricating the nitride-based semiconductor laser device according to the fourth embodiment is now described with reference to FIGS. 20 to 24.

Figure 21:
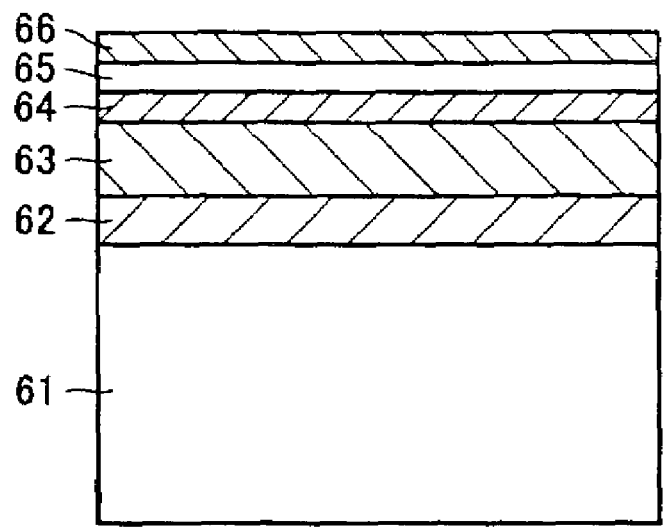
FIGS. 21 to 24 are sectional views for illustrating a method of fabricating the nitride-based semiconductor laser device according to the fourth embodiment of the present invention.

As shown in FIG. 21, the anti-cracking layer 62 of n-type $In_{0.05}Ga_{0.95}N$ having the thickness of about 0.1 µm is formed on the n-type GaN substrate 61 by MOVPE under the atmospheric pressure while holding the substrate temperature at about 880° C. The n-type second cladding layer 63 of Si-doped $Al_{0.3}Ga_{0.7}N$ having the thickness of about 1 µm and the n-type first cladding layer 64 of Si-doped GaN having the thickness of about 50 nm are formed on the anti-cracking layer 62 while holding the substrate temperature at about 1150° C.

Then, five undoped GaN barrier layers and four undoped $In_{0.15}Ga_{0.85}N$ well layers are alternately stacked on the n-type first cladding layer 64 while holding the substrate temperature at about 880° C., thereby forming the MQW emission layer 65. The p-type first cladding layer 66 of Mg-doped GaN is formed on the MQW emission layer 65 while holding the substrate temperature at about 1150° C.

Figure 22:
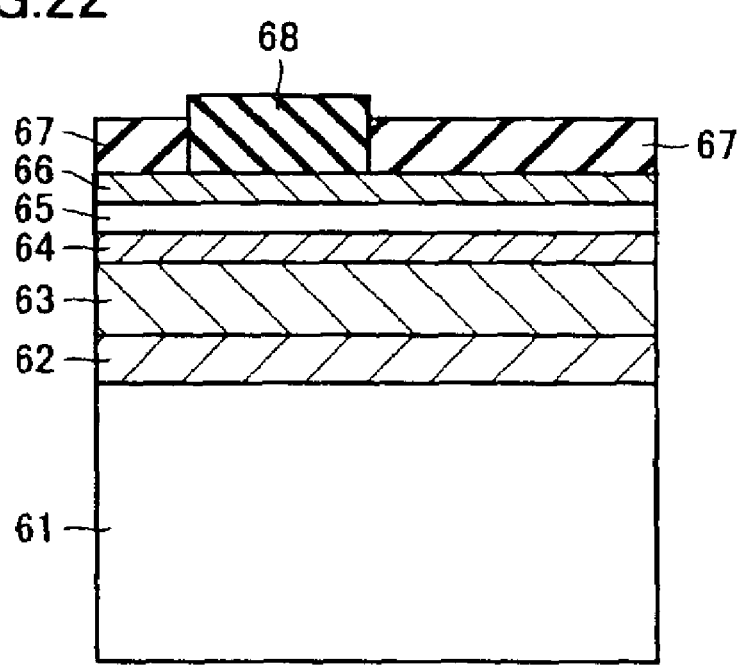

As shown in FIG. 22, the striped mask layer 67 of a silicon nitride such as $Si_3N_4$ having the opening of about 8 µm in width is formed on the upper surface of the p-type first cladding layer 66. The mask layer 67 is employed as a mask for selectively growing undoped InGaN on the upper surface of the p-type first cladding layer 66 exposed in the opening of the mask layer 67 by low-pressure MOVPE with pressure of about $1 \times 10^4$ Pa, thereby forming the current blocking layer 68 of undoped InGaN having the thickness of about 3 µm. In this case, the flow rate of $NH_3$ is set to about three times the flow rate of $NH_3$ employed for MOVPE under the atmospheric pressure while increasing the substrate temperature by about 100° C., for example. When the current blocking layer 68 is grown under such conditions, undoped InGaN is selectively grown upward on the upper surface of the p-type first cladding layer 66 exposed in the opening of the mask layer 67 while no undoped InGaN is grown on the mask layer 67. Thus, the current blocking layer 68 is formed on the upper surface of the p-type first cladding layer 66 exposed on the opening of the mask layer 67 in the range of the width W2 (see FIG. 20) of about 8 µm of the opening of the mask layer 67.

Figure 23:
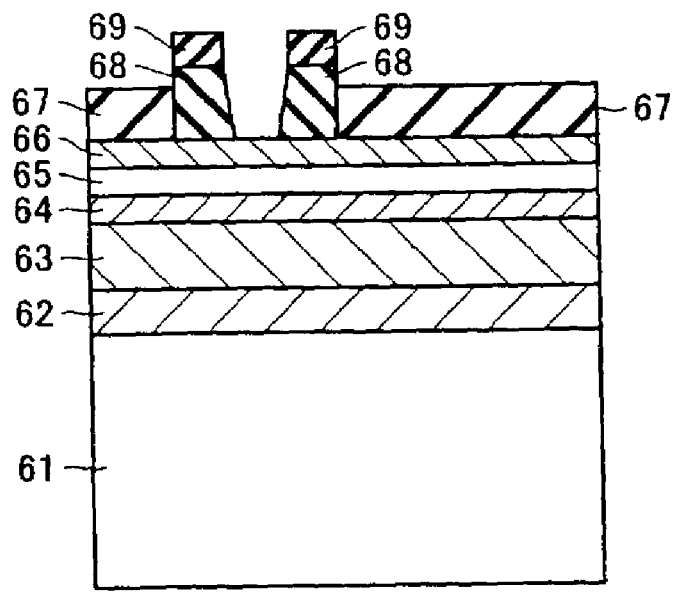

As shown in FIG. 23, the mask layer 69 of SiN is formed on a region of the upper surface of the current blocking layer 68 except the portion forming the current path portion. The mask layer 69 is employed as a mask for etching the current blocking layer 68 by RIE or the like with etching gas of $CF_4$, for example, until the upper surface of the p-type first cladding layer 66 is exposed by the width W1 (see FIG. 20) of about 2 µm. Thus, an opening for serving as the current path portion is formed between the current blocking layer 68 and the mask layer 69.

Figure 24:
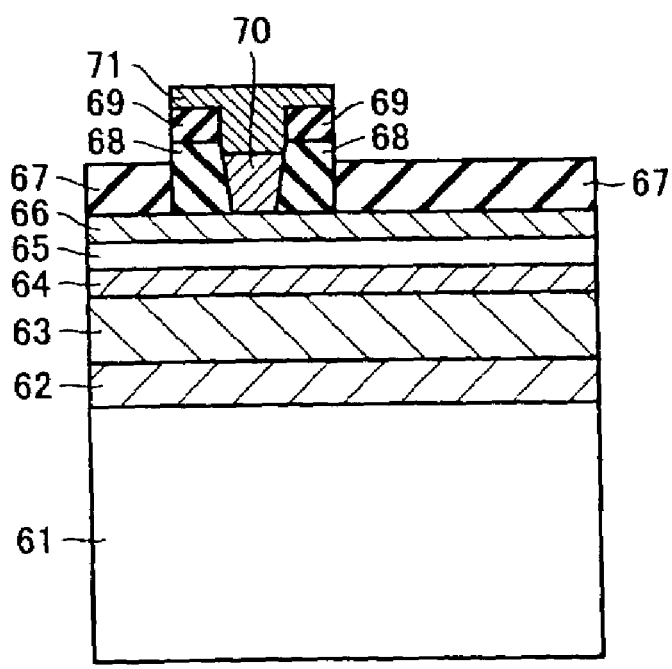

As shown in FIG. 24, the p-type second cladding layer 70 of Mg-doped AlGaN (Al composition: 0.08) is grown on the upper surface of the p-type first cladding layer 66 exposed in the opening of the current blocking layer 68 by low-pressure MOVPE with pressure of about $1 \times 10^4$ Pa. Thus, the p-type second cladding layer 70 having the width (bottom width) of about 2 µm is formed in a self-aligned manner. The p-type contact layer 71 of Mg-doped GaN having the thickness of about 3 µm to about 5 µm is formed on the upper surface of the p-type second cladding layer 70 and on the mask layer 69.

Raw material gas for forming the layers 62 to 66, 68, 70 and 71 consisting of nitride semiconductors on the n-type GaN substrate 61 by MOVPE is prepared from trimethyl aluminum (TMAl), trimethyl gallium (TMGa), trimethyl indium (TMIn), $NH_3$, $SiH_4$ or cyclopentadienyl magnesium ($Cp_2Mg$), for example.

Figure 20:
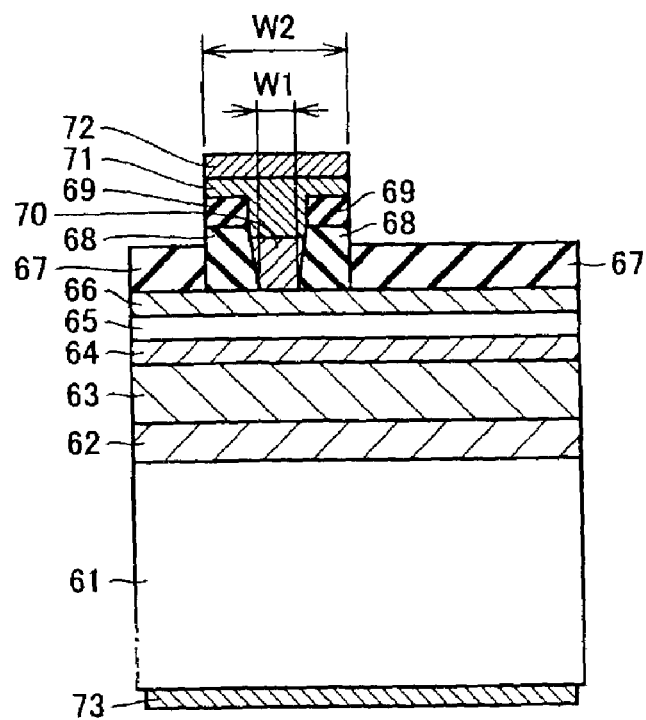
FIG. 20 is a sectional view showing a nitride-based semiconductor laser device according to a fourth embodiment of the present invention.

Finally, the p-side electrode 72 of Au/Pd is formed on the p-type contact layer 71, as shown in FIG. 20. The n-side electrode 73 of Au/Pt/Ti/Al/Ti is formed on the back surface of the n-type GaN substrate 61 having conductivity so that the Ti layer is in contact with the n-type GaN substrate 61. The wafer formed in the aforementioned manner is cleaved, for example, thereby forming a cavity structure having a cavity length of about 300 µm in the longitudinal direction of stripes. Thus, the self-aligned nitride-based semiconductor laser device according to the fourth embodiment is fabricated.

In the method of fabricating the nitride-based semiconductor laser device according to the fourth embodiment, as hereinabove described, the current blocking layer 68 having the opening is formed in the vicinity of the region formed with the current path portion on the upper surface of the p-type first cladding layer 66 by using the mask layer 67 followed by formation of the p-type second cladding layer 70 and the p-type contact layer 71 forming the current path portion on the p-type first cladding layer 66 in the opening of the current blocking layer 68, whereby the self-aligned nitride-based semiconductor laser device can be easily formed with the current blocking layer 68 provided only in the vicinity of the current path portion. Thus, the width of the current blocking layer 68 is reduced as compared with that formed on the overall surface, which consists of the vicinity of the current path portion and the region excluding the vicinity of the current path portion. Therefore, strain applied to the current blocking layer 68 due to the difference between the lattice constants of the current blocking layer 68 and the n-type GaN substrate 61 can be relaxed.

In the fourth embodiment, further, the current blocking layer 68 is formed by selective growth by using the mask layer 67 as described above, whereby crystallinity of the current blocking layer 68 can be improved in the self-aligned nitride-based semiconductor laser device.

(Fifth Embodiment)

Figure 25:
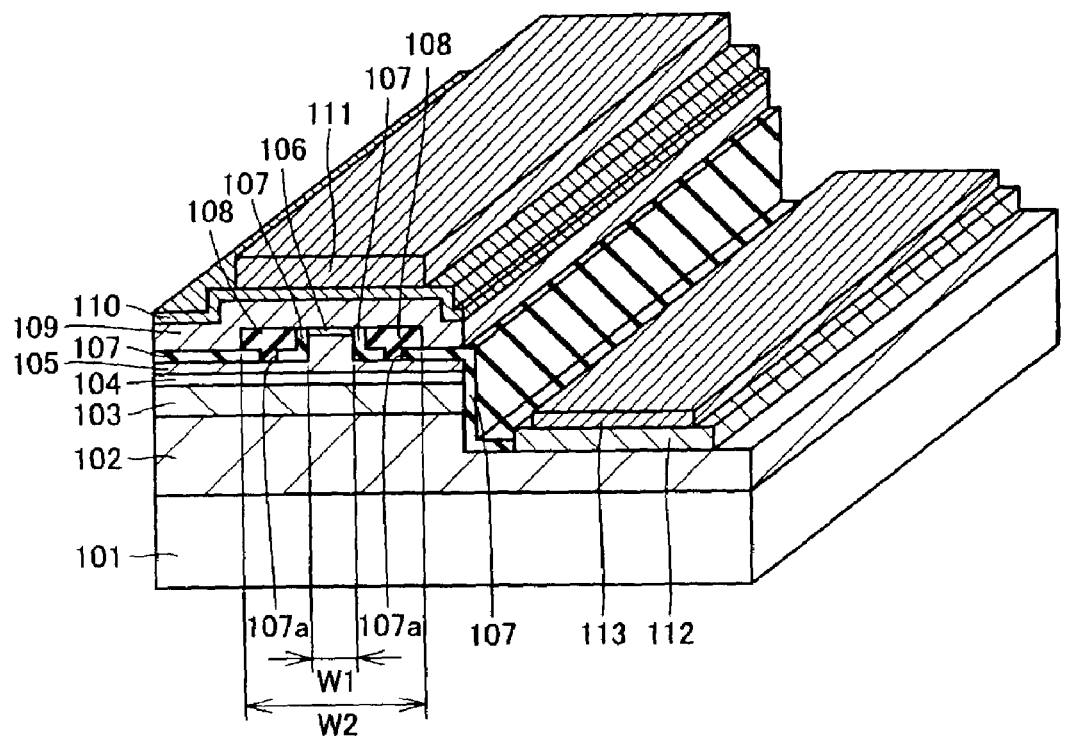
FIG. 25 is a perspective view showing a nitride-based semiconductor laser device according to a fifth embodiment of the present invention.

FIG. 25 shows a real refractive index guided ridge nitride-based semiconductor laser device according to a fifth embodiment of the present invention. The structure of the nitride-based semiconductor laser device according to the fifth embodiment is now described. Each of the following fifth to eleventh embodiments of the present invention is described with reference to a current blocking layer formed by a dielectric blocking layer and a semiconductor blocking layer formed on the dielectric blocking layer.

In the structure of the nitride-based semiconductor laser device according to the fifth embodiment, an n-type contact layer 102 of Si-doped GaN having a mesa portion with a thickness of about 4 μm is formed on a sapphire substrate 101. An n-type cladding layer 103 of Si-doped AlGaN having a thickness of about 1 μm and an MQW emission layer 104 having a multiple quantum well (MQW) structure of InGaN are formed on the upper surface of the mesa portion of the n-type contact layer 102. The MQW emission layer 104 is formed by alternately stacking three quantum well layers of $In_xGa_{1-x}N$ each having a thickness of about 8 nm and four quantum barrier layers of $In_yGa_{1-y}N$ each having a thickness of about 16 nm. In this MQW emission layer 104, x>y, and the MQW emission layer 104 is formed to satisfy x=0.13 and y=0.05 in this embodiment. The MQW emission layer 104 is an example of the "emission layer" according to the present invention.

A p-type cladding layer 105 of Mg-doped $Al_vGa_{1-v}N$ (Al composition: v=0.08) having a projection portion of about 1.5 μm in width is formed on the MQW emission layer 104. The thickness of the projection portion of the p-type cladding layer 105 is about 0.4 μm, and the thickness of a flat portion excluding the projection portion is about 0.1 μm. A p-type first contact layer 106 of Mg-doped GaN having a width of about 1.5 μm and a thickness of about 0.01 μm is formed on the upper surface of the projection portion of the p-type cladding layer 105. The projection portion of the p-type cladding layer 105 and the p-type first contact layer 106 form a current path portion (ridge portion) having a width W1 of about 1.5 μm. The p-type cladding layer 105 is an example of the "cladding layer" according to the present invention.

A dielectric blocking layer 107 of SiN having a thickness of about 50 nm is formed to cover the side surfaces of the current path portion (ridge portion), the flat portion of the p-type cladding layer 105, the side surfaces of the MQW emission layer 104, the n-type cladding layer 103 and the n-type contact layer 102 and a partial region of the upper surface of the n-type contact layer 102. The dielectric blocking layer 107 is formed to have an opening 107a for selective growth in the vicinity of the current path portion on the upper surface of the flat portion of the p-type cladding layer 105.

A semiconductor blocking layer 108 of $Al_wGa_{1-w}N$ (Al composition: w=0.15) having a thickness of about 0.25 μm is formed in the vicinity of the current path potion (ridge portion) on the upper surface of the dielectric blocking layer 107 to fill up the side portions of the current path portion. The semiconductor blocking layer 108 is formed only in the vicinity of the current path portion so that the total width W2 of the semiconductor blocking layer 108 and the current path portion (ridge portion) is about 7.5 μm. The semiconductor blocking layer 108 is formed to be in contact with the p-type cladding layer 105 through the opening 107a formed in the dielectric blocking layer 107. The dielectric blocking layer 107 and the semiconductor blocking layer 108 form a current blocking layer.

A p-type second contact layer 109 of Mg-doped GaN having a thickness of about 0.07 μm is formed on the current path portion (ridge portion), on the semiconductor blocking layer 108 and on the dielectric blocking layer 107 to fill up the current path portion and the semiconductor blocking layer 108 while covering a partial region on the upper surface of the dielectric blocking layer 107.

A p-side ohmic electrode 110 consisting of a Pt layer having a thickness of about 1 nm and a Pd layer having a thickness of about 3 nm stacked on the p-type second contact layer 109 in this order is formed on the p-type second contact layer 109. A p-side pad electrode 111 consisting of an Ni layer having a thickness of about 0.1 μm and an Au layer having a thickness of about 3 μm stacked on the p-side ohmic electrode 110 in this order is formed on a partial region of the upper surface of the p-side ohmic electrode 110. An n-side ohmic electrode 112 consisting of a Ti layer having a thickness of about 10 nm and an Al layer having a thickness of about 0.1 μm stacked on the n-type contact layer 102 in this order is formed on the exposed surface of the n-type contact layer 102. An n-side pad electrode 113 consisting of an Ni layer having a thickness of about 0.1 μm and an Au layer having a thickness of about 3 μm stacked on the n-side ohmic electrode 112 in this order is formed on a partial region of the upper surface of the n-side ohmic electrode 112.

According to the fifth embodiment, the current blocking layer is formed by the dielectric blocking layer 107 and the semiconductor blocking layer 108 formed on the dielectric blocking layer 107 as hereinabove described, whereby the semiconductor blocking layer 108 is in contact with the upper surface of the p-type cladding layer 105 through the opening 107a of the dielectric blocking layer 107 and hence the contact area between the p-type cladding layer 105 and the semiconductor blocking layer 108 can be reduced. Therefore, strain applied to the semiconductor blocking layer 108 due to the difference between the lattice constants of the p-type cladding layer 105 and the semiconductor blocking layer 108 can be relaxed, whereby the semiconductor blocking layer 108 can be inhibited from formation of cracks or crystal defects such as dislocations. Further, the contact area between the p-type cladding layer 105 and the semiconductor blocking layer 108 can be reduced, whereby formation of crystal defects resulting from a contaminant on the interface between the p-type cladding layer 105 and the semiconductor blocking layer 108 can also be suppressed. In addition, the dielectric blocking layer 107 can be interposed between the semiconductor blocking layer 108 and the underlayer, whereby strain applied to the semiconductor blocking layer 108 due to the difference between the lattice constants of the semiconductor blocking layer 108 and the thick n-type contact layer 108 of GaN forming the underlayer can be relaxed. The semiconductor blocking layer 108 can be inhibited from formation of cracks or crystal defects such as dislocations also by this.

According to the fifth embodiment, the semiconductor blocking layer 108 can be inhibited from formation of cracks or crystal defects as hereinabove described, whereby the thickness of the current blocking layer (the semiconductor blocking layer 108) can be increased so that the nitride-based semiconductor laser device can stabilize transverse light confinement.

According to the fifth embodiment, the semiconductor blocking layer 108 is formed only in the vicinity of the current path portion as hereinabove described, whereby the region for forming the semiconductor blocking layer 108 is so reduced that strain applied to the semiconductor blocking layer 108 due to the difference between the lattice constants of the p-type cladding layer 105 and the semiconductor blocking layer 108 can be further relaxed. The semiconductor blocking layer 108 can be inhibited from formation of cracks or crystal defects also by this, whereby transverse light confinement can be further stabilized and the semiconductor blocking layer 108 can be formed with excellent crystallinity.

According to the fifth embodiment, further, the semiconductor blocking layer 108 is formed only in the vicinity of the current path portion, thereby reducing the capacitance between the current blocking layer consisting of the semiconductor blocking layer 108 and the dielectric blocking layer 107 and the p-type cladding layer 105. Thus, a pulse for operating the device can be quickly rise and fall, whereby a nitride-based semiconductor laser device allowing high-speed pulsed operation can be obtained.

According to the fifth embodiment, the thickness (about 50 nm) of the dielectric blocking layer 107 is set smaller than the thickness (about 0.25 μm) of the semiconductor blocking layer 108 as hereinabove described, whereby the semiconductor blocking layer 108 having higher thermal conductivity than the dielectric blocking layer 107 can effectively radiate heat generated in the MQW emission layer 104. Consequently, excellent characteristics can be attained also in high-temperature operation or high-output operation of the nitride-based semiconductor laser device.

According to the fifth embodiment, the semiconductor blocking layer 108 of $Al_wGa_{1-w}N$ is employed to absorb no light in the semiconductor blocking layer 108, whereby operating current of the nitride-based semiconductor laser device can be reduced.

A method of fabricating the nitride-based semiconductor laser device according to the fifth embodiment is now described with reference to FIGS. 25 to 32.

Figure 26:
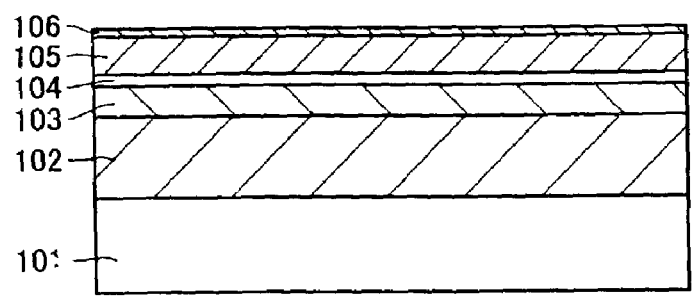
FIGS. 26 to 32 are sectional views for illustrating a method of fabricating the nitride-based semiconductor laser device according to the fifth embodiment of the present invention.

As shown in FIG. 26, the n-type contact layer 102 of Si-doped GaN having the thickness of about 4 μm and the n-type cladding layer 103 of Si-doped AlGaN having the thickness of about 1 μm are formed on the sapphire substrate 101 by MOVPE. Three $In_yGa_{1-y}N$ quantum well layers and four $In_yGa_{1-y}N$ quantum barrier layers are alternately stacked on the n-type cladding layer 103 by MOVPE, thereby forming the MQW emission layer 104. The p-type cladding layer 105 of Mg-doped $Al_vGa_{1-v}N$ (Al composition: v=0.08) having the thickness of about 0.4 μm and the p-type first contact layer 106 of Mg-doped GaN having the thickness of about 0.01 μm are successively formed on the MQW emission layer 104 by MOVPE.

Figure 27:
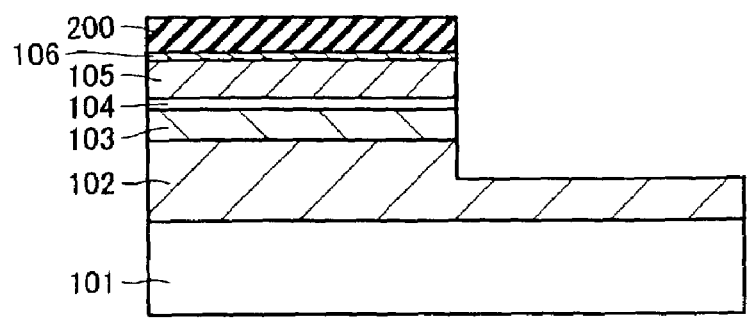

Thereafter an $SiO_2$ film (not shown) having a thickness of about 0.2 μm is formed to cover the overall upper surface of the p-type first contact layer 106 by plasma CVD, and a mask layer 200 of $SiO_2$ is formed by photolithography and etching, as shown in FIG. 27. This mask layer 200 is employed as a mask for etching prescribed regions of the p-type first contact layer 106, the p-type cladding layer 105, the MQW emission layer 104, the n-type cladding layer 103 and the n-type contact layer 102 by dry etching such as RIE (reactive ion etching) with etching gas consisting of $Cl_2$. Thereafter the mask layer 200 is removed from the p-type first contact layer 106.

Figure 28:
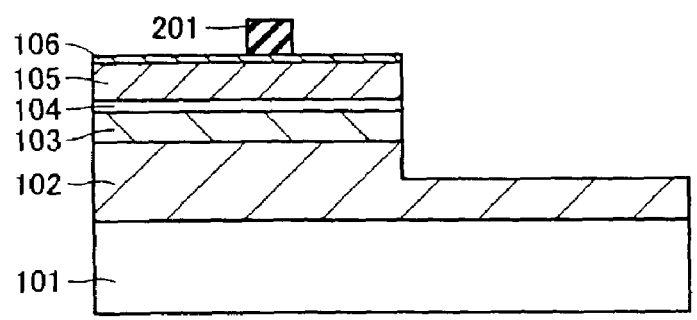

Then, an $SiO_2$ film (not shown) having a thickness of about 0.2 μm is formed by plasma CVD to cover the overall upper surface of the p-type first contact layer 106. Thereafter the $SiO_2$ film is patterned by photolithography and dry etching such as RIE with etching gas of $Cl_2$ or wet etching employing an HF-based etchant thereby forming a mask layer 201 of $SiO_2$, as shown in FIG. 28.

Figure 29:
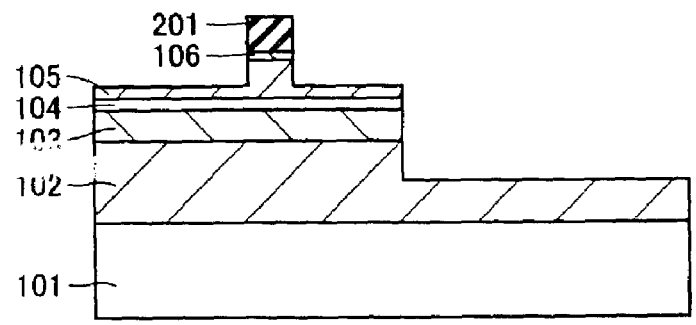

As shown in FIG. 29, partial regions of the p-type contact layer 106 and the p-type cladding layer 105 are etched by using the mask layer 201 serving as a mask by dry etching such as RIE with etching gas of $Cl_2$. Thus, the current path portion (ridge portion), consisting of the projection portion of the p-type cladding layer 105 and the p-type first contact layer 106, having the width W1 of about 1.5 μm is formed. Thereafter the mask layer 201 is removed.

Figure 30:
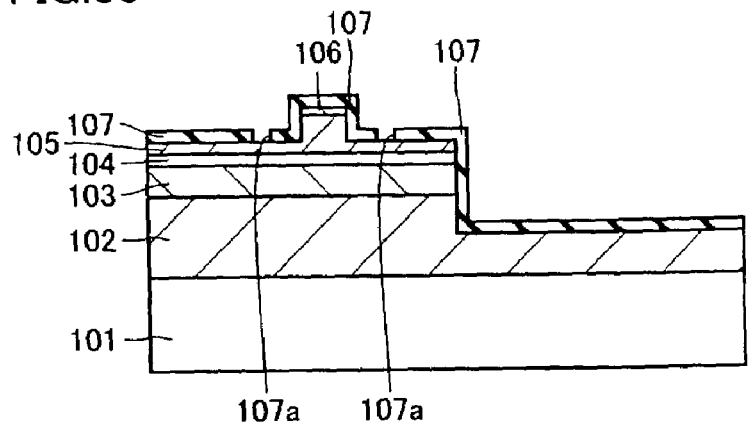

As shown in FIG. 30, the dielectric blocking layer 107 of SiN having the thickness of about 50 nm is formed by plasma CVD to substantially cover the overall upper surface of the wafer, and thereafter the opening 107a is formed in the dielectric blocking layer 107 by photolithography and etching. The opening 107a is so formed that a partial region of the upper surface of the flat portion of the p-type cladding layer 105 is exposed in the vicinity of the current path portion.

Figure 31:
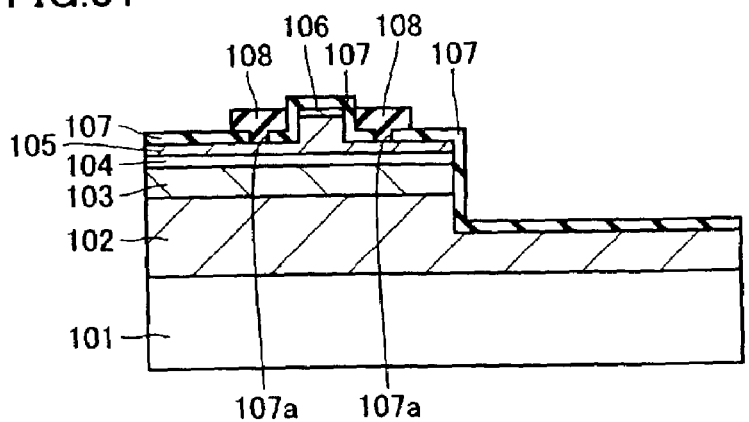

As shown in FIG. 31, the semiconductor blocking layer 108 of $Al_wGa_{1-w}N$ (Al composition: w=0.15) having the thickness of about 0.25 μm is selectively grown on the upper surface of the p-type cladding layer 105 exposed in the opening 107a to cover the dielectric blocking layer 107 formed on the side portions of the current path portion. Thus, the semiconductor blocking layer 108 is formed in the vicinity of the current path portion so that the total width W2 of the semiconductor blocking layer 108 and the current path portion is about 7.5 μm. This semiconductor blocking layer 108 can be easily formed by controlling the time for selective growth. Thereafter the portion of the dielectric blocking layer 107 located on the current path portion (the p-type first contact layer 106) is removed by photolithography and dry etching with etching gas of $CF_4$ or wet etching with an HF-based etchant.

Figure 32:
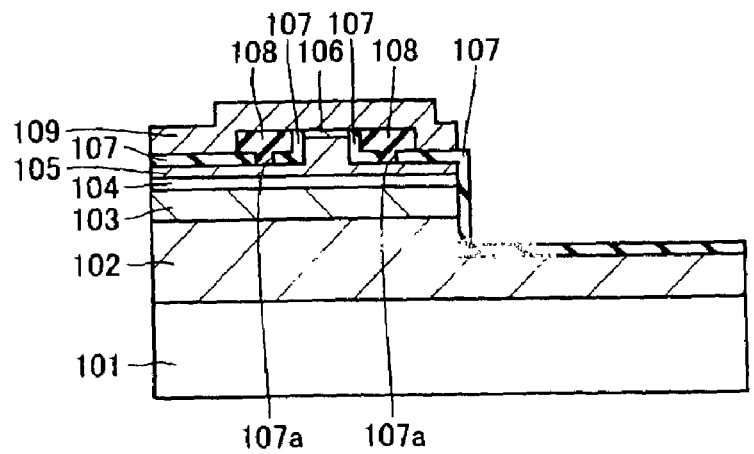

As shown in FIG. 32, the p-type second contact layer 109 of Mg-doped GaN having the thickness of about 0.07 μm is formed on the dielectric blocking layer 107 by MOVPE to cover the upper surface of the current path portion (the p-type first contact layer 106) and the semiconductor blocking layer 108.

Finally, the p-side ohmic electrode 110 consisting of the Pt layer having the thickness of about 1 nm and the Pd layer having the thickness of about 3 nm is formed on the p-type second contact layer 109 by vacuum deposition, as shown in FIG. 25. The p-side pad electrode 111 consisting of the Ni layer having the thickness of about 0.1 μm and the Au layer having the thickness of about 3 μm is formed on the partial region of the upper surface of the p-side ohmic electrode 110. Further, the partial region of the dielectric blocking layer 107 located on the upper surface of the n-type contact layer 102 is removed by photolithography and etching. The n-side ohmic electrode 112 consisting of the Ti layer having the thickness of about 10 nm and the Al layer having the thickness of about 0.1 μm is formed on the exposed surface of the n-type contact layer 102. The n-side pad electrode 113 consisting of the Ni layer having the thickness of about 0.1 μm and the Au layer having the thickness of about 3 μm is formed on the partial region of the upper surface of the n-side ohmic electrode 112. Thus, the nitride-based semiconductor laser device according to the fifth embodiment is fabricated.

In the method of fabricating the nitride-based semiconductor laser device according to the fifth embodiment, the semiconductor blocking layer 108 is formed by selective growth as hereinabove described, whereby crystallinity of the semiconductor blocking layer 108 can be improved. Further, the semiconductor blocking layer 108 is selectively grown from the opening 107a provided in the vicinity of the current path portion, so that the semiconductor blocking layer 108 can be formed only in the vicinity of the current path portion. Thus, strain applied to the semiconductor blocking layer 108 due to the difference between the lattice constants of the semiconductor blocking layer 108 and the p-type cladding layer 105 can be relaxed.

Figure 33:
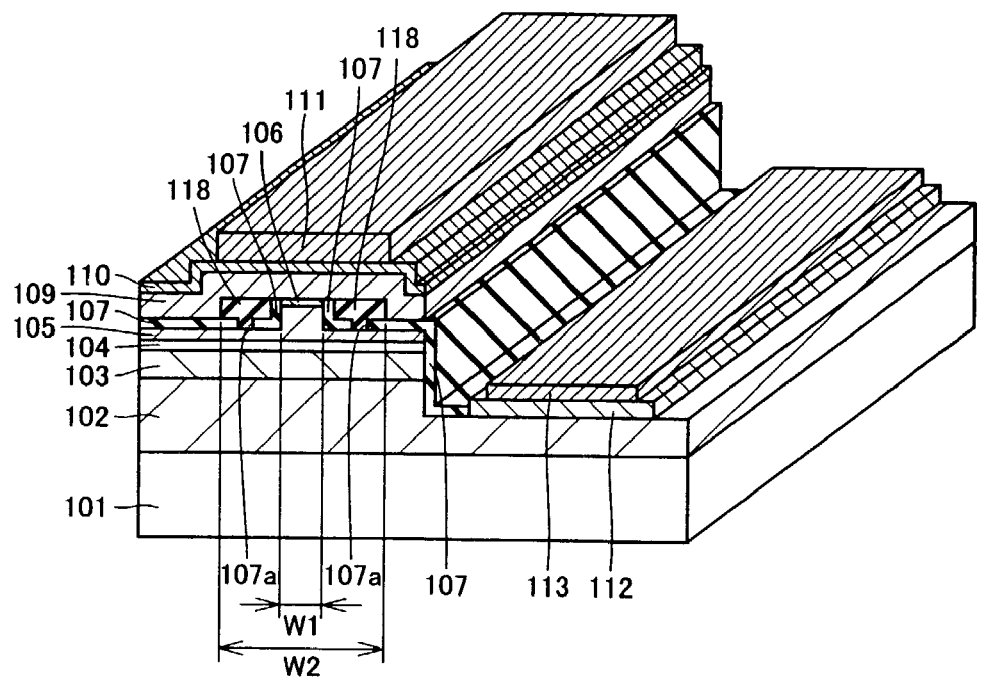
FIG. 33 is a perspective view showing a nitride-based semiconductor laser device according to a modification of the fifth embodiment of the present invention.

FIG. 33 is a perspective view showing a nitride-based semiconductor laser device according to a modification of the fifth embodiment of the present invention. The nitride-based semiconductor laser device according to the modification of the fifth embodiment is a complex refractive index guided ridge, laser device different from the nitride-based semiconductor laser device according to the fifth embodiment only in the material for a semiconductor blocking layer. According to the modification of the fifth embodiment, a semiconductor blocking layer 118 of $In_sGa_{1-s}N$ (In composition: s=0.18) having a thickness of about 0.25 μm is formed in the vicinity of a current path portion on the upper surface of a dielectric block layer 107 to fill up side portions of the current path portion so that the total width W2 of the semiconductor blocking layer 118 and the current path portion is about 7.5 μm, as shown in FIG. 33.

In the modification of the fifth embodiment, a current blocking layer is formed by the dielectric blocking layer 107 and the semiconductor blocking layer 118 of InGaN formed on the dielectric blocking layer 107 as hereinabove described, whereby transverse light confinement can be performed by absorbing light in the semiconductor blocking layer 118. Thus, transverse light confinement can be stabilized also when forming the semiconductor blocking layer 118 having a smaller thickness than a semiconductor blocking layer of AlGaN. The remaining effects of the modification of the fifth embodiment are similar to those of the fifth embodiment.

In fabrication of the aforementioned nitride-based semiconductor laser device according to the modification of the fifth embodiment, the semiconductor blocking layer 118 of InGaN is grown under a lower temperature as compared with the semiconductor blocking layer 108 of AlGaN according to the fifth embodiment. The remaining steps are similar to those in the fifth embodiment. The semiconductor blocking layer 118 of InGaN can be formed under a lower temperature as compared with the semiconductor blocking layer 108 of AlGaN according to the fifth embodiment as described above, whereby an impurity (Mg) introduced into a p-type cladding layer 105 can be prevented from diffusing into an MQW emission layer 104. Consequently, the nitride-based semiconductor laser device can be improved in reliability.

(Sixth Embodiment)

Figure 34:
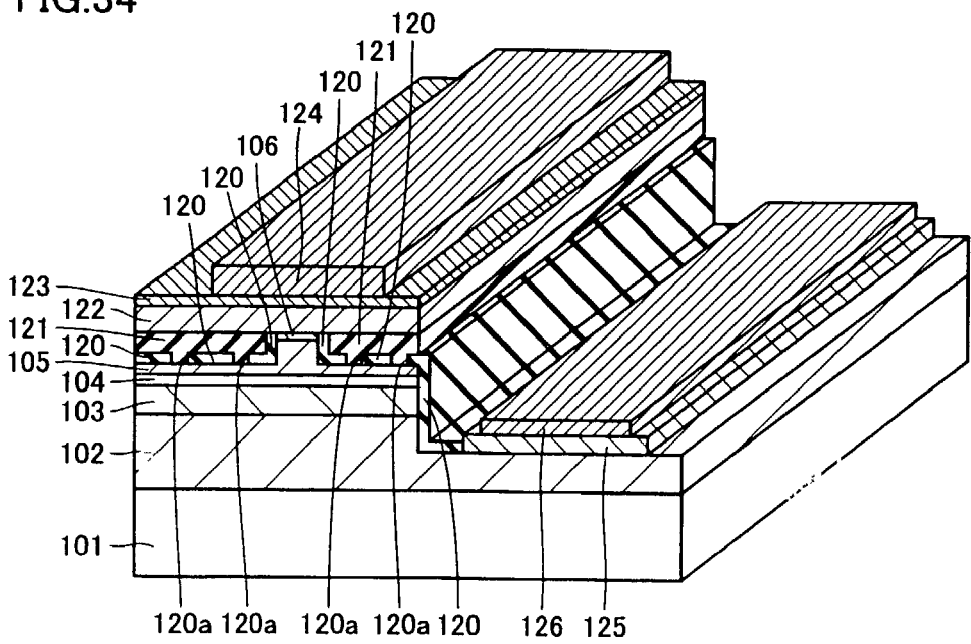
FIG. 34 is a perspective view showing a nitride-based semiconductor laser device according to a sixth embodiment of the present invention.

FIG. 34 shows a real refractive index guided ridge nitride-based semiconductor laser device according to a sixth embodiment of the present invention. While the semiconductor blocking layer 108 is formed only in the vicinity of the current path portion (ridge portion) in the aforementioned fifth embodiment, a semiconductor blocking layer 121 is formed substantially on the overall upper surface of a p-type cladding layer 105 in the sixth embodiment. The sixth embodiment is now described in detail.

In the structure of the nitride-based semiconductor laser device according to the sixth embodiment, an n-type contact layer 102, an n-type cladding layer 103 and an MQW emission layer 104 are formed on a sapphire substrate 101, similarly to the fifth embodiment. The p-type cladding layer 105 having a projection portion and a p-type first contact layer 106 are formed on the MQW emission layer 104. The projection portion of the p-type cladding layer 105 and the p-type first contact layer 106 form a current path portion (ridge portion). The compositions and the thicknesses of the layers 102 to 106 in the sixth embodiment are similar to those in the fifth embodiment.

A dielectric blocking layer 120 of SiN having a thickness of about 50 nm is formed to cover the side surfaces of the current path portion (ridge portion), a flat portion of the p-type cladding layer 105, the side surfaces of the MQW emission layer 104, the n-type cladding layer 103 and the n-type contact layer 102 and a partial region of the upper surface of the n-type contact layer 102. According to the sixth embodiment, the dielectric blocking layer 120 is formed to have four openings 120a for selective growth on the upper surface of the flat portion of the p-type cladding layer 105. The openings 120a are formed not only in the vicinity of the ridge portion but also in the remaining regions.

The semiconductor blocking layer 121 of $Al_wGa_{1-w}N$ (Al composition: w=0.15) having a thickness of about 0.25 μm is formed substantially on the overall upper surface of the dielectric blocking layer 120 formed on the p-type cladding layer 105, to cover the side portions of the current path portion. In other words, the semiconductor blocking layer 121 is formed not only in the vicinity of the ridge portion but also substantially on the overall upper surface of the p-type cladding layer 105 according to the sixth embodiment. The semiconductor blocking layer 121 is formed to be in contact with the p-type cladding layer 105 through the openings 120a provided in the dielectric blocking layer 120. The dielectric blocking layer 120 and the semiconductor blocking layer 121 form a current blocking layer.

A p-type second contact layer 122 of Mg-doped GaN having a thickness of about 0.07 μm is formed substantially on the overall upper surfaces of the current path portion (ridge portion) and the semiconductor blocking layer 121.

A p-side ohmic electrode 123 consisting of a Pt layer having a thickness of about 1 nm and a Pd layer having a thickness of about 3 nm stacked on the p-type second contact layer 122 in this order is formed on the p-type second contact layer 122. A p-side pad electrode 124 consisting of an Ni layer having a thickness of about 0.1 μm and an Au layer having a thickness of about 3 μm stacked on the p-side ohmic electrode 123 in this order is formed on a partial region of the upper surface of the p-side ohmic electrode 123. An n-side ohmic electrode 125 consisting of a Ti layer having a thickness of about 10 nm and an Al layer having a thickness of about 0.1 μm stacked on the n-type contact layer 102 in this order is formed on the exposed surface of the n-type contact layer 102. An n-side pad electrode 126 consisting of an Ni layer having a thickness of about 0.1 μm and an Au layer having a thickness of about 3 μm stacked on the n-side ohmic electrode 125 in this order is formed on a partial region of the upper surface of the n-side ohmic electrode 125.

According to the sixth embodiment, the semiconductor blocking layer 121 is formed substantially on the overall upper surface of the dielectric blocking layer 120 formed on the p-type cladding layer 105 as hereinabove described, whereby the p-type second contact layer 122 formed on the semiconductor blocking layer 121 can be flattened. Thus, strain applied to the current path portion (ridge portion) can be reduced when assembling the nitride-based semiconductor laser device on a submount (heat sink) in a junction-down (j-down) system from the side of the ridge portion. Consequently, the nitride-based semiconductor laser device can be improved in reliability.

According to the sixth embodiment, further, the current blocking layer is formed by the dielectric blocking layer 120 and the semiconductor blocking layer 121 similarly to the fifth embodiment, whereby the semiconductor blocking layer 121 is in contact with the upper surface of the p-type cladding layer 105 through the openings 120a of the dielectric blocking layer 120 and hence the contact area between the p-type cladding layer 105 and the semiconductor blocking layer 121 can be reduced. Therefore, strain applied to the semiconductor blocking layer 121 due to the difference between the lattice constants of the p-type cladding layer 105 and the semiconductor blocking layer 121 can be relaxed, whereby the semiconductor blocking layer 121 can be inhibited from formation of cracks or crystal defects such as dislocations. The contact area between the p-type cladding layer 105 and the semiconductor blocking layer 121 can be reduced, thereby suppressing formation of crystal defects resulting from a contaminant on the interface between the p-type cladding layer 105 and the semiconductor blocking layer 121. Further, the dielectric blocking layer 120 can be interposed between the semiconductor blocking layer 121 and the underlayer, whereby strain applied to the semiconductor blocking layer 121 due to the difference between the lattice constants of the semiconductor blocking layer 121 and the thick n-type contact layer 102 of GaN forming the underlayer can be relaxed. The semiconductor blocking layer 121 can be inhibited from formation of cracks or crystal defects such as dislocations also by this.

According to the sixth embodiment, the semiconductor blocking layer 121 can be inhibited from formation of cracks or crystal defects as hereinabove described, whereby the thickness of the current blocking layer (the semiconductor blocking layer 121) can be increased and the nitride-based semiconductor laser device can stabilize transverse light confinement as a result.

According to the sixth embodiment, further, the dielectric blocking layer 120 is formed to have a thickness (about 50 nm) smaller than the thickness (about 0.25 μm) of the semiconductor blocking layer 121 similarly to the fifth embodiment, whereby the semiconductor blocking layer 121 having higher thermal conductivity than the dielectric blocking layer 120 can effectively radiate heat generated in the MQW emission layer 104. Consequently, excellent characteristics can be attained also in high-temperature operation or high-output operation of the nitride-based semiconductor light-emitting device.

According to the sixth embodiment, the semiconductor blocking layer 121 of $Al_wGa_{1-w}N$ is employed similarly to the fifth embodiment, so that the semiconductor blocking layer 121 absorbs no light and hence the operating current of the nitride-based semiconductor light-emitting device can be reduced.

A method of fabricating the nitride-based semiconductor laser device according to the sixth embodiment is now described with reference to FIGS. 34 to 37.

Figure 35:
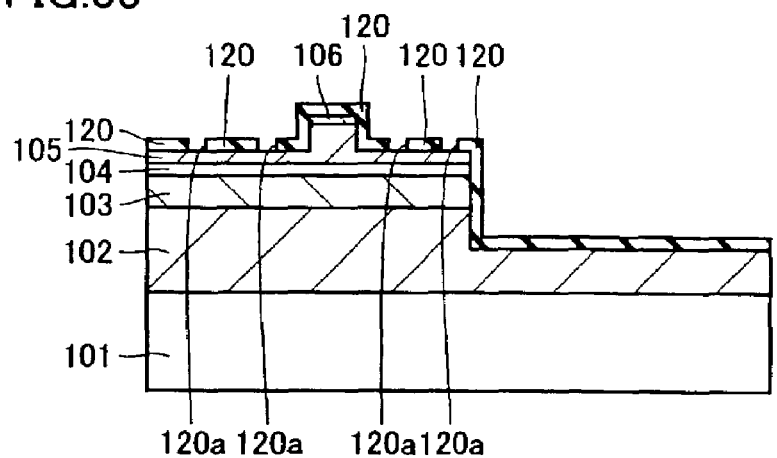
FIGS. 35 to 37 are sectional views for illustrating a method of fabricating the nitride-based semiconductor laser device according to the sixth embodiment of the present invention.

As shown in FIG. 35, the n-type contact layer 102, the n-type cladding layer 103, the MQW emission layer 104, the p-type cladding layer 105 and the p-type first contact layer 106 are formed on the sapphire substrate 101 by a method similar to that in the fifth embodiment shown in FIGS. 26 to 29. Then, the dielectric blocking layer 120 of SiN having the thickness of about 50 nm is formed by plasma CVD to substantially cover the overall upper surface of the wafer, followed by formation of the four openings 120a in the dielectric blocking layer 120 by photolithography and dry etching with etching gas of $CF_4$ or wet etching with an HF-based etchant. The openings 120a are formed to expose the partial region of the upper surface of the flat portion of the p-type cladding layer 105.

Figure 36:
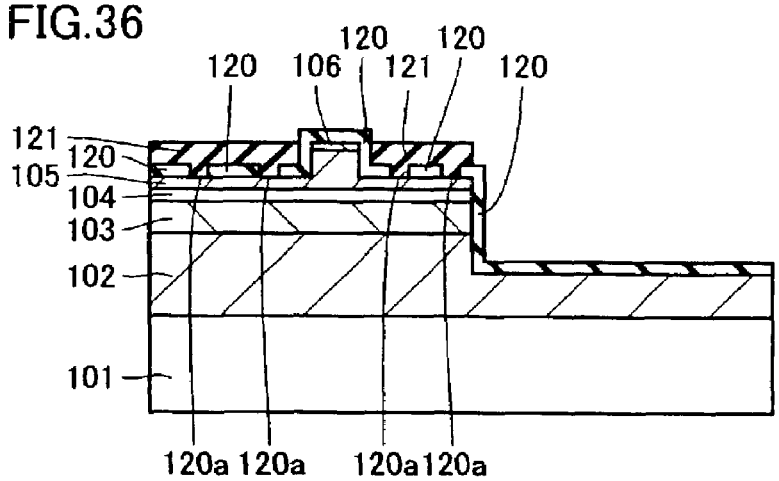

As shown in FIG. 36, the semiconductor blocking layer 121 of $Al_wGa_{1-w}N$ (Al composition: w=0.15) having the thickness of about 0.25 μm is selectively grown on the upper surface of the p-type cladding layer 105 exposed in the openings 120a by MOVPE, to cover the dielectric blocking layer 120 formed on the side portions of the current path portion and on the upper surface of the p-type cladding layer 105. Thereafter the portion of the dielectric blocking layer 120 located on the current path portion (the p-type first contact layer 106) removed by photolithography and dry etching with etching gas of $CF_4$ or wet etching with an HF-based etchant.

Figure 37:
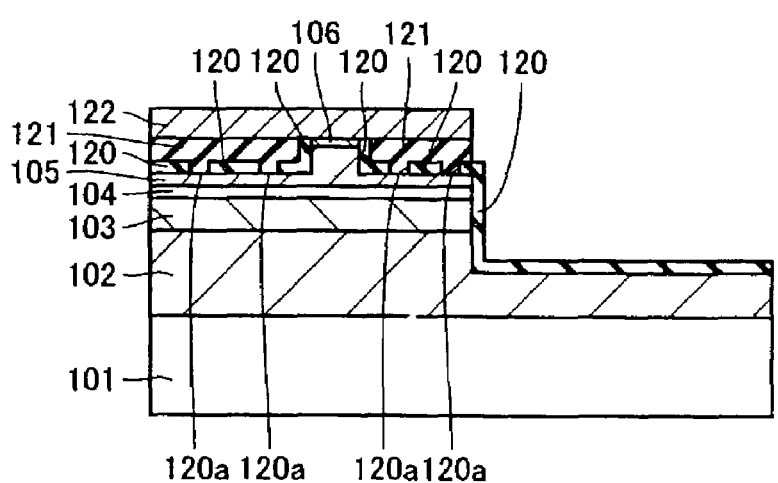

As shown in FIG. 37, the p-type second contact layer 122 of Mg-doped GaN having the thickness of about 0.07 μm is formed substantially on the overall upper surfaces of the current path portion (the p-type first contact layer 106) and the semiconductor blocking layer 121 by MOVPE.

Finally, the p-side ohmic electrode 123 and the p-side pad electrode 124 are successively formed by vacuum deposition, as shown in FIG. 34. The partial region of the dielectric blocking layer 120 located on the upper surface of the n-type contact layer 102 is removed by photolithography and etching. The n-side ohmic electrode 125 and the n-side pad electrode 126 are successively formed on the exposed surface of the n-type contact layer 102. Thus, the nitride-based semiconductor laser device according to the sixth embodiment is fabricated.

In the method of fabricating the nitride-based semiconductor laser device according to the sixth embodiment, the semiconductor blocking layer 121 is formed by selective growth as hereinabove described, whereby crystallinity of the semiconductor blocking layer 121 can be improved.

Figure 38:
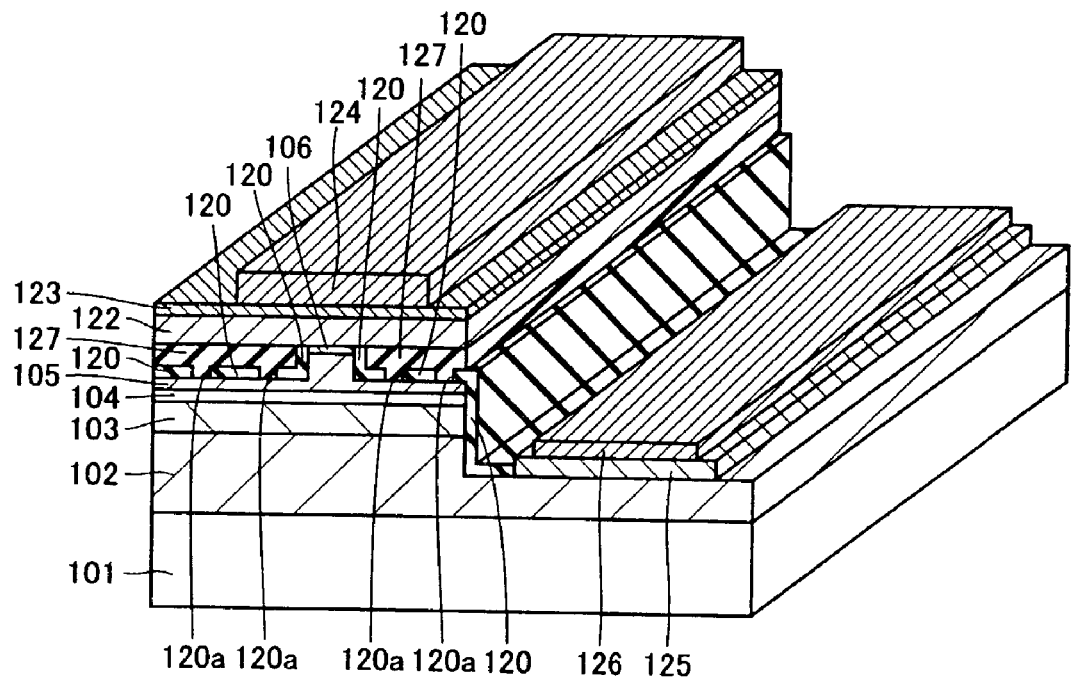
FIG. 38 is a perspective view showing a nitride-based semiconductor laser device according to a modification of the sixth embodiment of the present invention.

FIG. 38 is a perspective view showing a nitride-based semiconductor laser device according to a modification of the sixth embodiment of the present invention. The nitride-based semiconductor laser device according to the modification of the sixth embodiment is a complex refractive index guided ridge laser device different from the nitride-based semiconductor laser device according to the sixth embodiment only in the material for a semiconductor blocking layer 127. In the modification of the sixth embodiment, the semiconductor blocking layer 127 of $In_sGa_{1-s}N$ (In composition: s=0.18) having a thickness of about 0.25 μm is formed to cover a dielectric blocking layer 120 formed on the side portions of a current path portion and on the upper surface of a p-type cladding layer 105, as shown in FIG. 38.

In the modification of the sixth embodiment, a current blocking layer is formed by the dielectric blocking layer 120 and the semiconductor blocking layer 127 of InGaN formed on the dielectric blocking layer 120 as hereinabove described, whereby transverse light confinement can be performed by absorbing light in the semiconductor blocking layer 127. Thus, transverse light confinement can be stabilized also when forming the semiconductor blocking layer 127 having a smaller thickness than a semiconductor blocking layer of AlGaN. The remaining effects of the modification of the sixth embodiment are similar to those of the sixth embodiment.

In fabrication of the aforementioned nitride-based semiconductor laser device according to the modification of the sixth embodiment, the semiconductor blocking layer 127 of InGaN is grown under a lower temperature as compared with the semiconductor blocking layer 121 of AlGaN according to the sixth embodiment. The remaining steps are similar to those in the sixth embodiment. The semiconductor blocking layer 127 of InGaN can be formed under a lower temperature as compared with the semiconductor blocking layer 121 of AlGaN according to the sixth embodiment as described above, whereby an impurity (Mg) introduced into the p-type cladding layer 105 can be prevented from diffusing into an MQW emission layer 104. Consequently, the nitride-based semiconductor laser device can be improved in reliability.

(Seventh Embodiment)

Figure 39:
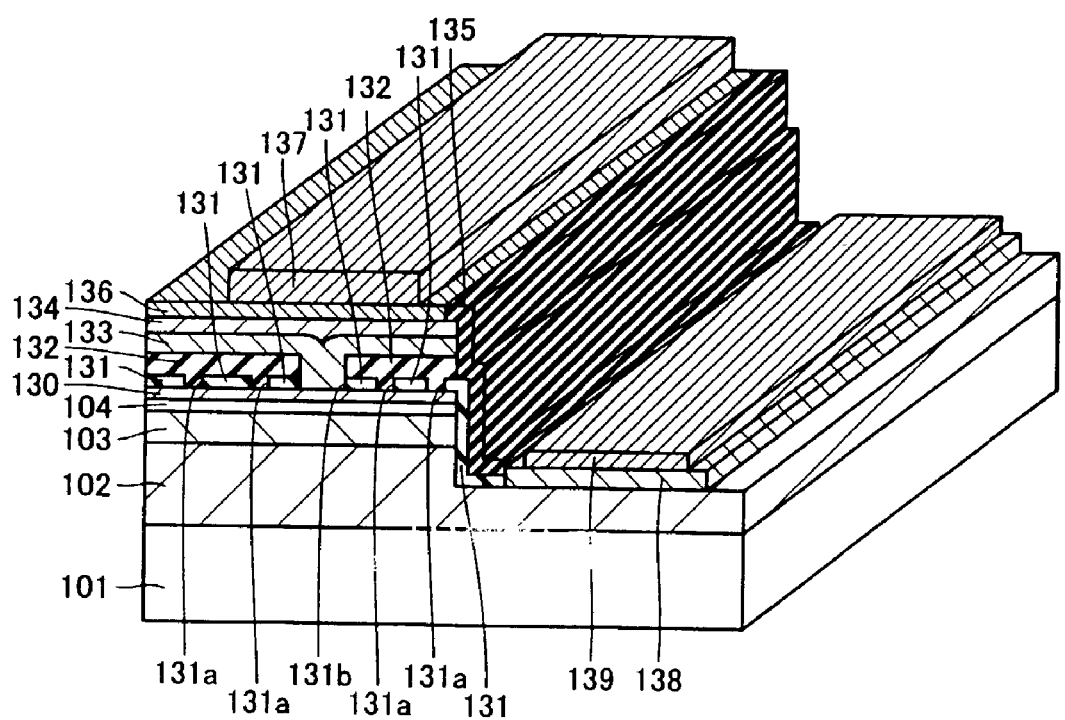
FIG. 39 is a perspective view showing a nitride-based semiconductor laser device according to a seventh embodiment of the present invention.

FIG. 39 shows a real refractive index guided self-aligned nitride-based semiconductor laser device according to a seventh embodiment of the present invention.

In the structure of the nitride-based semiconductor laser device according to the seventh embodiment, an n-type contact layer 102, an n-type cladding layer 103 and an MQW emission layer 104 are formed on a sapphire substrate 101, similarly to the fifth embodiment. A p-type first cladding layer 130 of Mg-doped $Al_vGa_{1-v}N$ (Al composition: v=0.08) having a thickness of about 0.1 μm is formed on the MQW emission layer 104. The p-type first cladding layer 130 is an example of the "first cladding layer" according to the present invention. The compositions and the thicknesses of the layers 102 to 104 are similar to those in the fifth embodiment.

A dielectric blocking layer 131 of SiN having a thickness of about 50 nm is formed to cover the upper surface of the p-type first cladding layer 130, the side surfaces of the MQW emission layer 104, the n-type cladding layer 103 and the n-type contact layer 102 and a partial region of the upper surface of the n-type contact layer 102. According to the seventh embodiment, the dielectric blocking layer 131 is formed to have four openings 131a and a central opening 131b having a width of about 1.5 μm for forming a current path portion. The openings 131a are formed not only in the vicinity of the current path portion but also in the remaining regions.

A semiconductor blocking layer 132 of $Al_wGa_{1-w}N$ (Al composition: w=0.15) having a thickness of about 0.25 μm is formed on the dielectric blocking layer 131 formed on the upper surface of the p-type first cladding layer 130 to have an opening of about 1.5 μm in width for forming the current path portion. According to the seventh embodiment, the semiconductor blocking layer 132 is formed not only in the vicinity of the current path portion but also substantially on the overall upper surface of the p-type first cladding layer 130. The semiconductor blocking layer 132 is formed to be in contact with the p-type first cladding layer 130 through the openings 131a provided in the dielectric blocking layer 131. The dielectric blocking layer 131 and the semiconductor blocking layer 132 form a current blocking layer.

A p-type second cladding layer 133 of Mg-doped $Al_vGa_{1-v}N$ (Al composition: v=0.08) having a thickness of about 0.3 μm is formed on the p-type first cladding layer 130 in the opening 131b for forming the current path portion of the current blocking layer (the dielectric blocking layer 131 and the semiconductor blocking layer 132) and on the semiconductor blocking layer 132. The p-type second cladding layer 133 is an example of the "second cladding layer" according to the present invention.

A p-type contact layer 134 of Mg-doped GaN having a thickness of about 0.07 μm is formed substantially on the overall upper surface of the p-type second cladding layer 133. A p-side ohmic electrode 136 consisting of a Pt layer having a thickness of about 1 nm and a Pd layer having a thickness of about 3 nm stacked on the p-type contact layer 134 in this order is formed on the p-type contact layer 134. A p-side pad electrode 137 consisting of an Ni layer having a thickness of about 0.1 μm and an Au layer having a thickness of about 3 μm stacked on the p-side ohmic electrode 136 in this order is formed on a partial region of the upper surface of the p-side ohmic electrode 136. An n-side ohmic electrode 138 consisting of a Ti layer having a thickness of about 10 nm and an Al layer having a thickness of about 0.1 μm stacked on the n-type contact layer 102 in this order is formed on the exposed surface of the n-type contact layer 102. An n-side pad electrode 139 consisting of an Ni layer having a thickness of about 0.1 μm and an Au layer having a thickness of about 3 μm stacked on the n-side ohmic electrode 138 in this order is formed on a partial region of the upper surface of the n-side ohmic electrode 138.

A protective film 135 of SiN having a thickness of about 0.1 μm is formed to cover the side portions of the p-side ohmic electrode 136, the p-type contact layer 134, the p-type second cladding layer 133 and the semiconductor blocking layer 132 and the dielectric blocking layer 131.

According to the seventh embodiment, the p-type second cladding layer 133 is formed to extend onto the upper surface of the semiconductor blocking layer 132 as hereinabove described, whereby the area of the upper surface of the p-type second cladding layer 133 can be increased. Thus, contact resistance between the p-type second cladding layer 133 and the p-type contact layer 134 formed thereon can be reduced.

According to the seventh embodiment, further, the p-type second cladding layer 133 is formed on the semiconductor blocking layer 132 having excellent crystallinity as hereinabove described, whereby the p-type second cladding layer 133 can be obtained with excellent crystallinity. Consequently, the p-type second cladding layer 133 is improved in thermal conductivity, whereby excellent characteristics can be attained also in high-temperature operation or high-output operation of the nitride-based semiconductor light-emitting diode.

According to the seventh embodiment, the p-type second cladding layer 133 is formed on the semiconductor blocking layer 132 having excellent crystallinity as hereinabove described, whereby the p-type second cladding layer 133 can be improved in crystallinity and the carrier concentration thereof can be increased. Consequently, operating voltage of the nitride-based semiconductor laser device can be reduced. The remaining effects of the seventh embodiment are similar to those of the sixth embodiment.

A method of fabricating the nitride-based semiconductor laser device according to the seventh embodiment is now described with reference to FIGS. 39 to 45.

Figure 40:
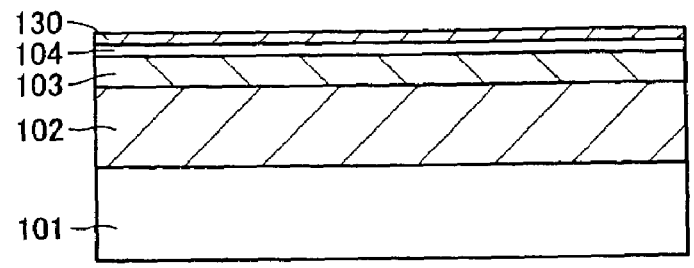
FIGS. 40 to 45 are sectional views for illustrating a method of fabricating the nitride-based semiconductor laser device according to the seventh embodiment of the present invention.

As shown in FIG. 40, the n-type contact layer 102, the n-type cladding layer 103 and the MQW emission layer 104 are formed on the sapphire substrate 101, similarly to the method of fabricating the nitride-based semiconductor laser device according to the fifth embodiment. The compositions and the thicknesses of the layers 102 to 104 are similar to those in the fifth embodiment. The p-type first cladding layer 130 of Mg-doped $Al_vGa_{1-v}N$ (Al composition: v=0.08) having the thickness of about 0.1 μm is formed on the MQW emission layer 104 by MOVPE.

Figure 41:
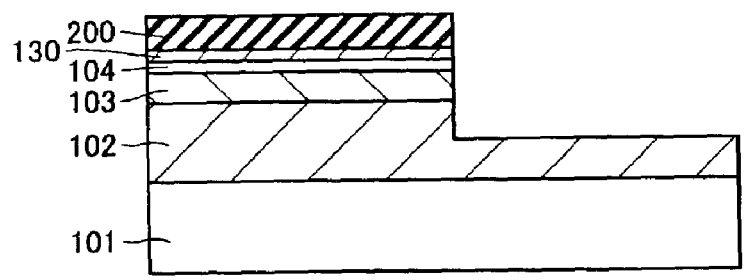

Then, an $SiO_2$ film (not shown) having a thickness of about 0.2 μm is formed by plasma CVD to cover the overall upper surface of the p-type first cladding layer 103, followed by formation of a patterned mask layer 200 of $SiO_2$ by photolithography and etching, as shown in FIG. 41. This mask layer 200 is employed as, a mask for etching prescribed regions of the p-type first cladding layer 130, the MQW emission layer 104, the n-type cladding layer 103 and the n-type contact layer 102 by dry etching such as RIE with etching gas of $Cl_2$. Thereafter the mask layer 200 is removed from the p-type first cladding layer 130.

Figure 42:
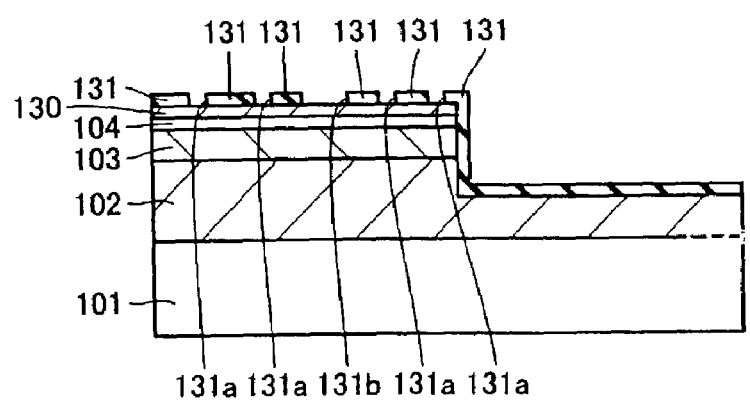

As shown in FIG. 42, the dielectric blocking layer 131 of SiN having the thickness of about 50 nm is formed by plasma CVD to substantially cover the overall upper surface of the wafer, followed by formation of the four openings 131a and the opening 131b having the width of about 1.5 μm for forming the current path portion in the dielectric blocking layer 131 by photolithography and dry etching with etching gas of $CF_4$ or wet etching with an HF-based etchant. The openings 131a and 131b are formed to expose the partial region on the upper surface of the p-type first cladding layer 130.

Figure 43:
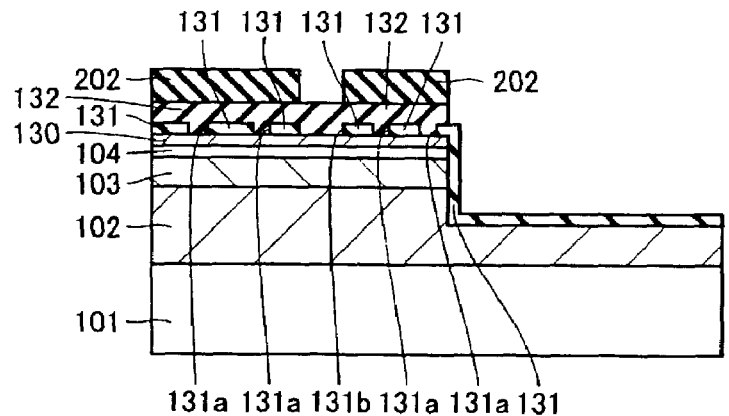

As shown in FIG. 43, the semiconductor blocking layer 132 of $Al_wGa_{1-w}N$ (Al composition: w=0.15) having the thickness of about 0.25 μm is selectively grown substantially on the overall upper surface of the p-type first cladding layer 130 exposed in the openings 131a and 131b. Thereafter an $SiO_2$ film (not shown) having a thickness of about 0.2 μm is formed by plasma CVD to substantially cover the overall upper surface of the semiconductor blocking layer 132, followed by formation of a patterned mask layer 202 of $SiO_2$ by photolithography and etching, as shown in FIG. 43.

Figure 44:
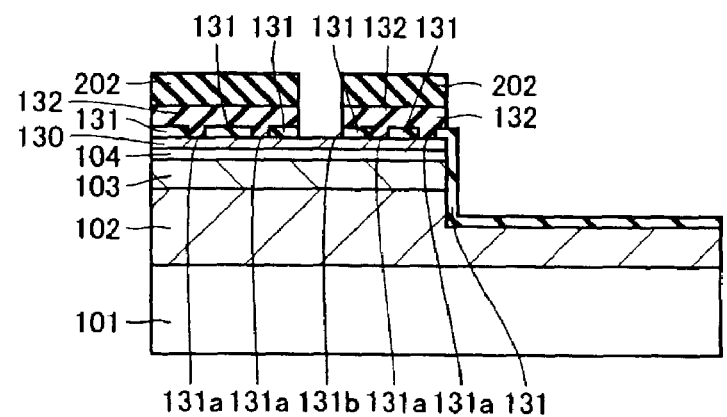

As shown in FIG. 44, the mask layer 202 is employed as a mask for etching the semiconductor blocking layer 132 formed on the opening 131b by dry etching such as RIE with etching gas of $Cl_2$. Thus, the opening having the width of about 1.5 μm for forming the current path portion is formed in the semiconductor blocking layer 132. Thereafter the mask layer 202 is removed from the semiconductor blocking layer 132.

Figure 45:
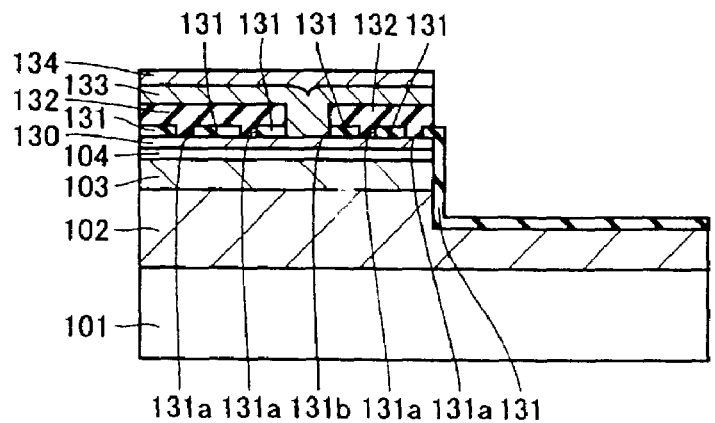

As shown in FIG. 45, the p-type second cladding layer 133 of Mg-doped $Al_vGa_{1-v}N$ (Al composition: v=0.08) is grown on the upper surface of the p-type first cladding layer 130 exposed in the opening of the current blocking layer (the dielectric blocking layer 131 and the semiconductor blocking layer 132) by MOVPE. Thus, the p-type second cladding layer 133 having the width of about 1.5 μm is formed in the opening of the current blocking layer in a self-aligned manner. The p-type second cladding layer 133 is formed to have the thickness of about 0.3 μm on the upper surface of the semiconductor blocking layer 132. The p-type contact layer 134 of Mg-doped GaN having the thickness of about 0.07 μm is formed on the upper surface of the p-type second cladding layer 133 by MOVPE.

Finally, an SiN film (not shown) having a thickness of about 50 nm is formed to substantially cover the overall upper surface of the wafer. Thereafter the protective film 135 of SiN having the shape shown in FIG. 39 is formed by photolithography and dry etching with etching gas of $CF_4$ or wet etching with an HF-based etchant.

As shown in FIG. 39, the p-side ohmic electrode 136 and the p-side pad electrode 137 are successively formed on the p-type contact layer 134 by vacuum deposition. The partial region of the dielectric blocking layer 131 located on the upper surface of the n-type contact layer 102 is removed by photolithography and etching. The n-side ohmic electrode 138 and the n-side pad electrode 139 are successively formed on the exposed surface of the n-type contact layer 102. Thus, the nitride-based semiconductor laser device according to the seventh embodiment is fabricated.

In the method of fabricating the nitride-based semiconductor laser device according to the seventh embodiment, the semiconductor blocking layer 132 is formed by selective growth as hereinabove described, whereby crystallinity of the semiconductor blocking layer 132 can be improved.

Figure 46:
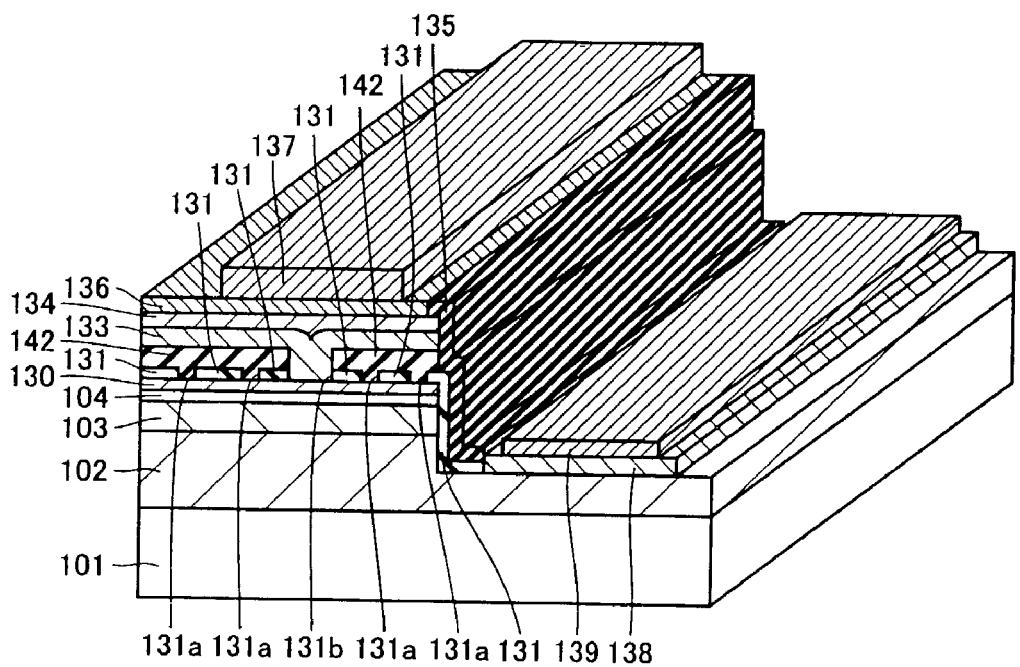
FIG. 46 is a perspective view showing a nitride-based semiconductor laser device according to a modification of the seventh embodiment of the present invention.

FIG. 46 is a perspective view showing a nitride-based semiconductor laser device according to a modification of the seventh embodiment of the, present invention. The nitride-based semiconductor laser device according to the modification of the seventh embodiment is a complex refractive index guided self-aligned nitride-based semiconductor laser device different from the nitride-based semiconductor laser device according to the seventh embodiment only in the material for a semiconductor blocking layer 142. In the modification of the seventh embodiment, the semiconductor blocking layer 142 of $In_sGa_{1-s}N$ (In composition: s=0.18) having a thickness of about 0.25 μm is formed on a dielectric blocking layer 131 to have an opening of about 1.5 μm in width for forming a current path portion, as shown in FIG. 46.

In the modification of the seventh embodiment, a current blocking layer is formed by the dielectric blocking layer 131 and the semiconductor blocking layer 142 of InGaN formed on the dielectric blocking layer 131 as hereinabove described, whereby transverse light confinement can be performed by absorbing light in the semiconductor blocking layer 142. Thus, transverse light confinement can be stabilized also when forming the semiconductor blocking layer 142 having a smaller thickness than a semiconductor blocking layer of AlGaN. The remaining effects of the modification of the seventh embodiment are similar to those of the seventh embodiment.

In fabrication of the aforementioned nitride-based semiconductor laser device according to the modification of the seventh embodiment, the semiconductor blocking layer 142 of InGaN is grown under a lower temperature as compared with the semiconductor blocking layer 132 of AlGaN according to the seventh embodiment. The remaining steps are similar to those in the seventh embodiment. The semiconductor blocking layer 142 of InGaN can be formed under a lower temperature as compared with the semiconductor blocking layer 132 of AlGaN according to the seventh embodiment as described above, whereby an impurity (Mg) introduced into a p-type cladding layer 130 can be prevented from diffusing into an MQW emission layer 104. Consequently, the nitride-based semiconductor laser device can be improved in reliability.

(Eighth Embodiment)

Figure 47:
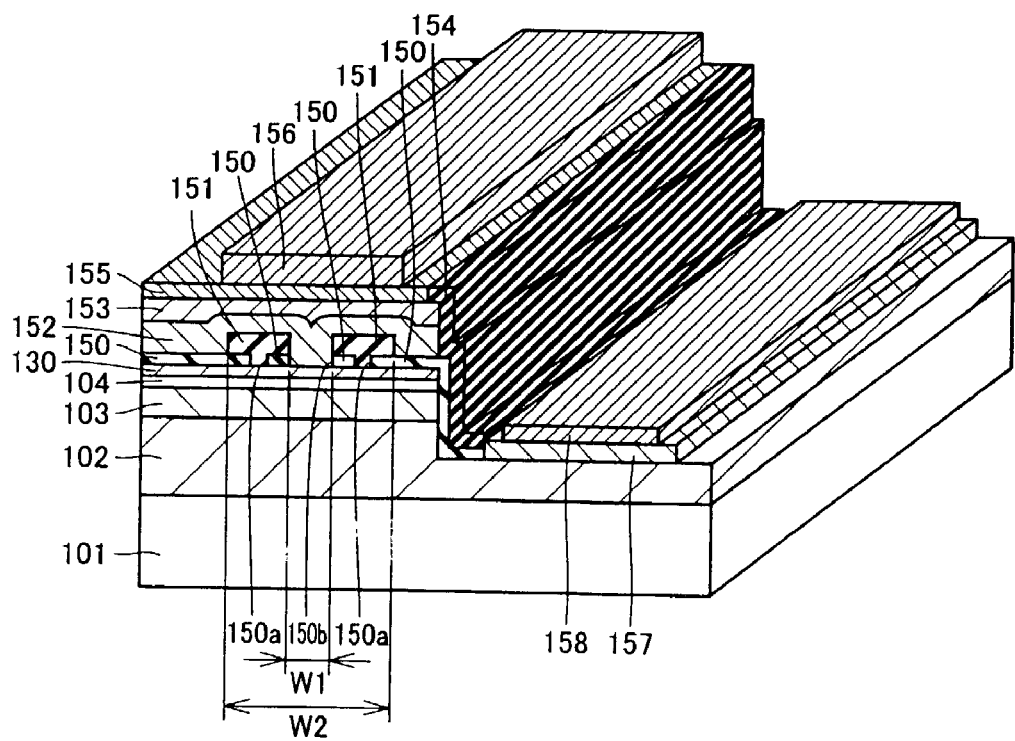
FIG. 47 is a perspective view showing a nitride-based semiconductor laser device according to an eighth embodiment of the present invention.

FIG. 47 shows a real refractive index guided self-aligned nitride-based semiconductor laser device according to an eighth embodiment of the present invention. While the semiconductor blocking layer 132 is formed up to the region not in the vicinity of the current path portion in the aforementioned seventh embodiment, a semiconductor blocking layer 151 according to the eighth embodiment is formed only in the vicinity of a current path portion. The eighth embodiment is now described in detail.

In the structure of the nitride-based semiconductor laser device according to the eighth embodiment, an n-type contact layer 102, an n-type cladding layer 103, an MQW emission layer 104 and a p-type first cladding layer 130 are formed on a sapphire substrate 101, similarly to the seventh embodiment. The compositions and the thicknesses of the layers 102 to 104 and 130 are similar to those in the seventh embodiment.

A dielectric blocking layer 150 of SiN having a thickness of about 50 nm is formed to cover the upper surface of the p-type first cladding layer 130, the side surfaces of the MQW emission layer 104, the n-type cladding layer 103 and the n-type contact layer 102 and a partial region of the upper surface of the n-type contact layer 102. According to the eighth embodiment, the dielectric blocking layer 150 is formed to have two openings 150a for selective growth and a central opening 150b having a width W1 of about 1.5 μm for forming the current path portion.

The semiconductor blocking layer 151 of $Al_wGa_{1-w}N$ (Al composition: w=0.15) having a thickness of about 0.25 μm and a width W2 of about 7.5 μm is formed in the vicinity of the current path portion on the dielectric blocking layer 150 to have an opening of about 1.5 μm in width for forming the current path portion. The semiconductor blocking layer 151 is formed to be in contact with the p-type first cladding layer 130 through the openings 150a provided in the dielectric blocking layer 150. The dielectric blocking layer 150 and the semiconductor blocking layer 151 form a current blocking layer.

A p-type second cladding layer 152 of Mg-doped $Al_vGa_{1-v}N$ (Al composition: v=0.08) having a thickness of about 0.3 μm is formed on the p-type first cladding layer 130 in the opening 150b for forming the current path portion of the current blocking layer (the dielectric blocking layer 150 and the semiconductor blocking layer 151) and on the dielectric blocking layer 150. The p-type second cladding layer 152 is an example of the "second cladding layer" according to the present invention.

A p-type contact layer 153 of Mg-doped GaN having a thickness of about 0.07 μm is formed substantially on the overall upper surface of the p-type second cladding layer 152. A p-side ohmic electrode 155 consisting of a Pt layer having a thickness of about 1 nm and a Pd layer having a thickness of about 3 nm stacked on the p-type contact layer 153 in this order is formed on the p-type contact layer 153. A p-side pad electrode 156 consisting of an Ni layer having a thickness of about 0.1 μm and an Au layer having a thickness of about 3 μm stacked on the p-side ohmic electrode 155 in this order is formed on a partial region of the upper surface of the p-side ohmic electrode 155. An n-side ohmic electrode 157 consisting of a Ti layer having a thickness of about 10 nm and an Al layer having a thickness of about 0.1 μm stacked on the n-type contact layer 102 in this order is formed on the exposed surface of the n-type contact layer 102. An n-side pad electrode 158 consisting of an Ni layer having a thickness of about 0.1 μm and an Au layer having a thickness of about 3 μm stacked on the n-side ohmic electrode 157 in this order is formed on a partial region of the upper surface of the n-side ohmic electrode 157.

A protective film 154 of SiN having a thickness of about 0.1 μm is formed to cover the side portions of the p-side ohmic electrode 155, the p-type contact layer 153, the p-type second cladding layer 152 and the semiconductor blocking layer 151 and the dielectric blocking layer 150.

According to the eighth embodiment, the p-type second cladding layer 152 is formed to extend onto the upper surface of the semiconductor blocking layer 151 as hereinabove described, whereby the area of the upper surface of the p-type second cladding layer 152 can be increased. Thus, contact resistance between the p-type second cladding layer 152 and the p-type contact layer 153 formed thereon can be reduced.

According to the eighth embodiment, further, the p-type second cladding layer 152 is formed on the semiconductor blocking layer 151 having excellent crystallinity as hereinabove described, whereby the p-type second cladding layer 152 can be obtained with excellent crystallinity. Consequently, the p-type second cladding layer 152 is improved in thermal conductivity, whereby excellent characteristics can be attained also in high-temperature operation or high-output operation of the nitride-based semiconductor light-emitting diode.

According to the eighth embodiment, the p-type second cladding layer 152 is formed on the semiconductor blocking layer 151 having excellent crystallinity as hereinabove described, whereby the p-type second cladding layer 152 can be improved in crystallinity and the carrier concentration thereof can be increased. Consequently, operating voltage of the nitride-based semiconductor laser device can be reduced. The remaining effects of the eighth embodiment are similar to those of the fifth embodiment.

A method of fabricating the nitride-based semiconductor laser device according to the eighth embodiment is now described with reference to FIGS. 47 to 51.

Figure 48:
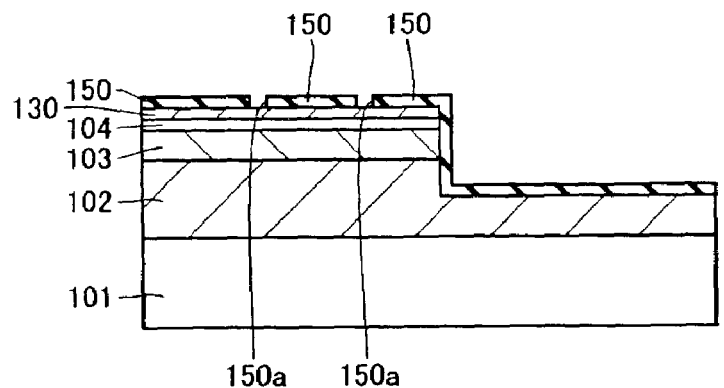
FIGS. 48 to 51 are sectional views for illustrating a method of fabricating the nitride-based semiconductor laser device according to the eighth embodiment of the present invention.

As shown in FIG. 48, the n-type contact layer 102, the n-type cladding layer 103, the MQW emission layer 104 and the p-type first cladding layer 130 are formed on the sapphire substrate 101, similarly to the method of fabricating the nitride-based semiconductor laser device according to the fifth embodiment.

As shown in FIG. 48, the dielectric blocking layer 150 of SiN having the thickness of about 50 nm is formed by plasma CVD to substantially cover the overall upper surface of the wafer, followed by formation of the two openings 150a by photolithography and dry etching with etching gas of $CF_4$ or wet etching with an HF-based etchant. The openings 150a are formed to expose the partial region on the upper surface of the p-type first cladding layer 130.

Figure 49:
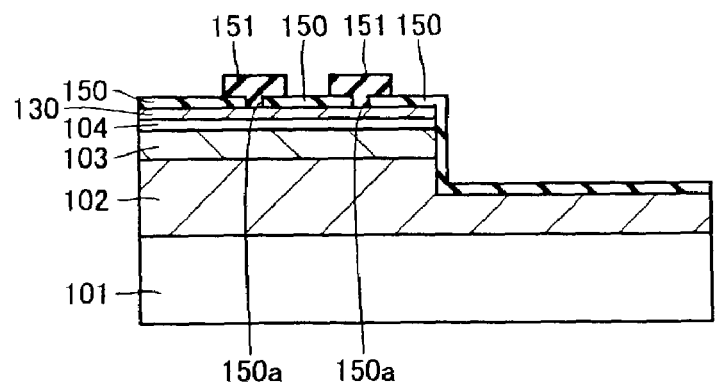
Figure 50:
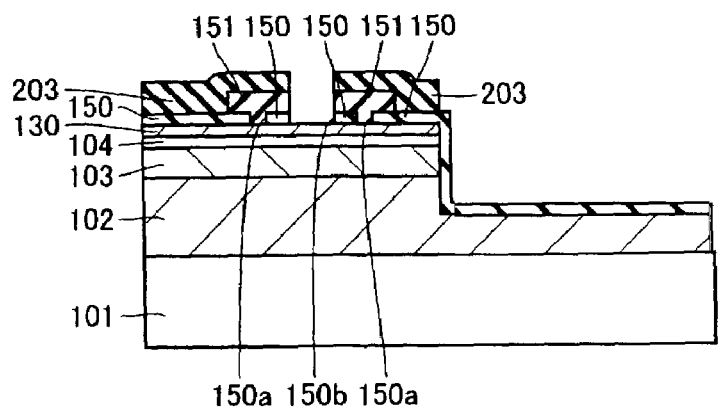

As shown in FIG. 49, the semiconductor blocking layer 151 of $Al_wGa_{1-w}N$ (Al composition: w=0.15) having the thickness of about 0.25 μm is selectively grown on the upper surface of the p-type first cladding layer 130 exposed in the openings 150a to cover the dielectric blocking layer 150. The semiconductor blocking layer 151 is formed only in the vicinity of the current path potion to have the opening of the width W1 of about 1.5 μm for forming the current path portion so that the total width W2 of the current path portion and the semiconductor blocking layer 151 is about 7.5 μm. This semiconductor blocking layer 151 can be easily formed by controlling the time for selective growth.

Thereafter an $SiO_2$ film (not shown) having a thickness of about 0.2 μm is formed by plasma CVD to cover the overall upper surface of the wafer. Then, the $SiO_2$ film and the dielectric blocking layer 150 are patterned by photolithography and etching. Thus, the dielectric blocking layer 150 having the opening 150b of the width W1 of about 1.5 μm for forming the current path portion is formed under a mask layer 203 of $SiO_2$ having an opening for forming the current path portion, as show in FIG. 50.

Figure 51:
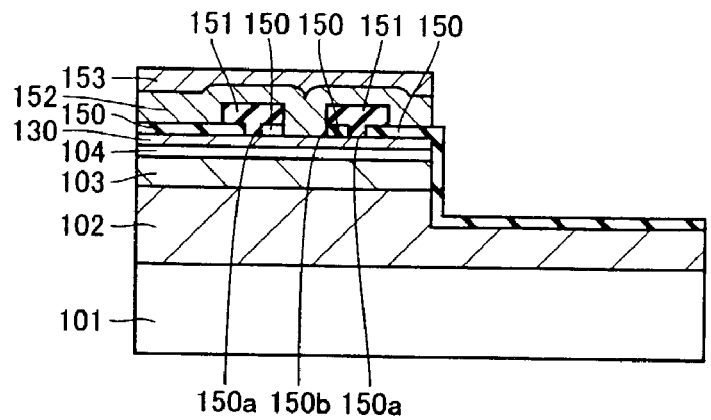

As shown in FIG. 51, the p-type second cladding layer 152 of Mg-doped $Al_vGa_{1-v}N$ (Al composition: v=0.08) is grown on the upper surface of the p-type first cladding layer 130 exposed in the opening of the current blocking layer (the dielectric blocking layer 150 and the semiconductor blocking layer 151) by MOVPE. Thus, the p-type second cladding layer 152 having the width W1 of about 1.5 μm is formed in the opening of the current blocking layer in a self-aligned manner. The p-type second cladding layer 152 is formed to have the thickness of about 0.3 μm on the upper surface of the semiconductor blocking layer 151. The p-type contact layer 153 of Mg-doped GaN having the thickness of about 0.07 μm is formed on the upper surface of the p-type second cladding layer 152 by MOVPE.

Finally, an SiN film (not shown) having a thickness of about 50 nm is formed to substantially cover the overall upper surface of the wafer. Thereafter the protective film 154 of SiN having the shape shown in FIG. 47 is formed by photolithography and dry etching with etching gas of $CF_4$ or wet etching with an HF-based etchant.

As shown in FIG. 47, the p-side ohmic electrode 155 and the p-side pad electrode 156 are successively formed on the p-type contact layer 153 by vacuum deposition. The partial region of the dielectric blocking layer 150 located on the upper surface of the n-type contact layer 102 is removed by photolithography and etching. The n-side ohmic electrode 157 and the n-side pad electrode 158 are successively formed on the exposed surface of the n-type contact layer 102. Thus, the nitride-based semiconductor laser device according to the eighth embodiment is fabricated.

In the method of fabricating the nitride-based semiconductor laser device according to the eighth embodiment, the semiconductor blocking layer 151 is formed by selective growth as hereinabove described, whereby crystallinity of the semiconductor blocking layer 151 can be improved.

Figure 52:
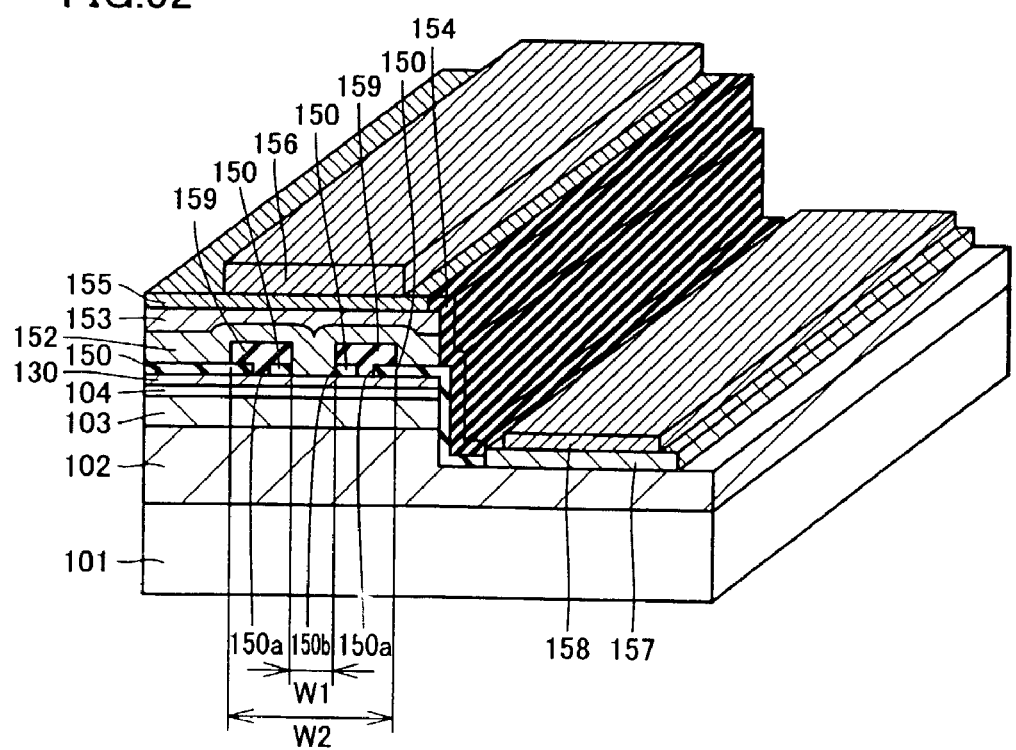
FIG. 52 is a perspective view showing a nitride-based semiconductor laser device according to a modification of the eighth embodiment of the present invention.

FIG. 52 is a perspective view showing a nitride-based semiconductor laser device according to a modification of the eighth embodiment of the present invention. The nitride-based semiconductor laser device according to the modification of the eighth embodiment is a complex refractive index guided self-aligned nitride-based semiconductor laser device different from the nitride-based semiconductor laser device according to the eighth embodiment only in the material for a semiconductor blocking layer 159. In the modification of the eighth embodiment, the semiconductor blocking layer 159 of $In_sGa_{1-s}N$ (In composition: s=0.18) having a thickness of about 0.25 µm and a width of about 3 µm is formed on a dielectric blocking layer 150 formed on the upper surface of a p-type first cladding layer 130 with a width W2 of about 7.5 µm to have an opening of a width W1 of about 1.5 µm for forming a current path portion, as shown in FIG. 52.

In the modification of the eighth embodiment, a current blocking layer is formed by the dielectric blocking layer 150 and the semiconductor blocking layer 159 of InGaN formed on the dielectric blocking layer 150 as hereinabove described, whereby transverse light confinement can be performed by absorbing light in the semiconductor blocking layer 159. Thus, transverse light confinement can be stabilized also when forming the semiconductor blocking layer 159 having a smaller thickness than a semiconductor blocking layer of AlGaN.

In fabrication of the aforementioned nitride-based semiconductor laser device according to the modification of the eighth embodiment, the semiconductor blocking layer 159 of InGaN is grown under a lower temperature as compared with the semiconductor blocking layer 151 of AlGaN according to the eighth embodiment. The remaining steps are similar to those in the eighth embodiment. The semiconductor blocking layer 159 of InGaN can be formed under a lower temperature as compared with the semiconductor blocking layer 151 of AlGaN according to the eighth embodiment as described above, whereby an impurity (Mg) introduced into a p-type cladding layer 130 can be prevented from diffusing into an MQW emission layer 104. Consequently, the nitride-based semiconductor laser device can be improved in reliability.

(Ninth Embodiment)

Figure 53:
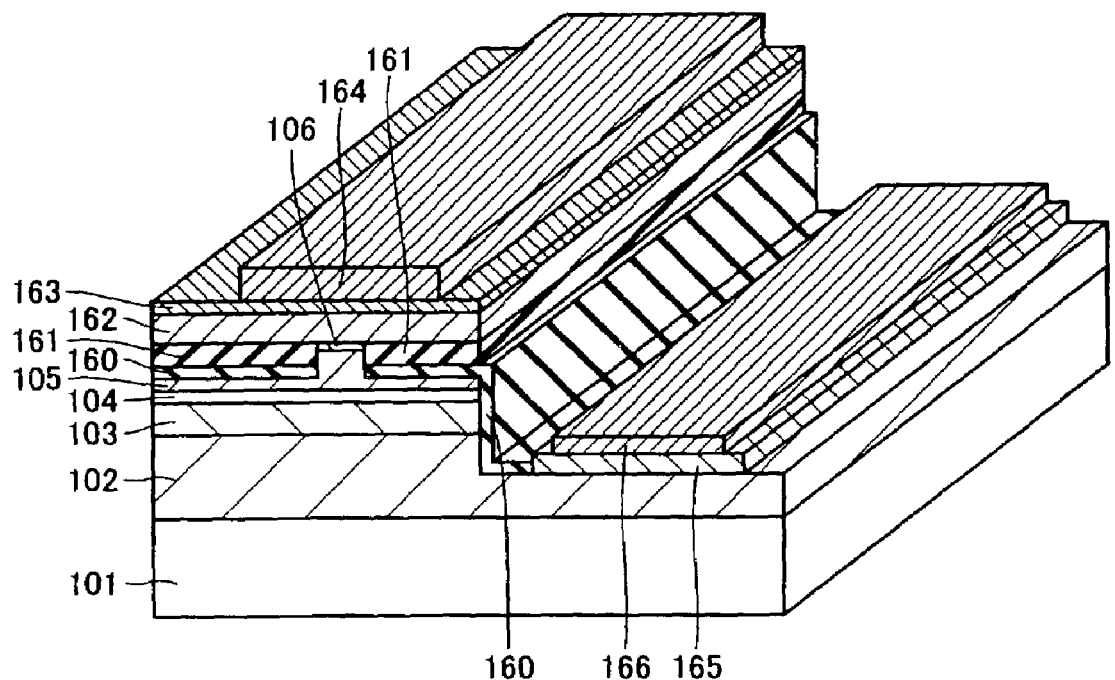
FIG. 53 is a perspective view showing a nitride-based semiconductor laser device according to a ninth embodiment of the present invention.

FIG. 53 shows a real refractive index guided ridge nitride-based semiconductor laser device according to a ninth embodiment of the present invention. While the semiconductor blocking layer is formed to be in contact with the p-type cladding layer located in the opening of the dielectric blocking layer in each of the aforementioned first to eighth embodiments, a semiconductor blocking layer 161 is formed to be in contact with a p-type cladding layer 105 on side surfaces of a current path portion in the ninth embodiment. The ninth embodiment is now described in detail.

In the structure of the nitride-based semiconductor laser device according to the ninth embodiment, an n-type contact layer 102, an n-type cladding layer 103 and an MQW emission layer 104 are formed on a sapphire substrate 101, similarly to the fifth embodiment. The p-type cladding layer 105 having a projection portion and a p-type first contact layer 106 are formed on the MQW emission layer 104. The projection portion of the p-type cladding layer 105 and the p-type first contact layer 106 form the current path portion (ridge portion). The compositions and the thicknesses of the layers 102 to 106 in the ninth embodiment are similar to those in the fifth embodiment.

The dielectric blocking layer 160 of SiN having a thickness of about 50 nm is formed to cover a flat portion of the p-type cladding layer 105, the side surfaces of the MQW emission layer 104, the n-type cladding layer 103 and the n-type contact layer 102 and a partial region of the upper surface of the n-type contact layer 102.

The semiconductor blocking layer 161 of $Al_wGa_{1-w}N$ (Al composition: w=0.15) having a thickness of about 0.25 µm is formed substantially on the overall upper surface of the dielectric blocking layer 160 formed on the p-type cladding layer 105, to cover the side surfaces of the current path portion. The dielectric blocking layer 160 and the semiconductor blocking layer 161 form a current blocking layer.

A p-type second contact layer 162 of Mg-doped GaN having a thickness of about 0.07 µm is formed substantially on the overall upper surfaces of the current path portion (ridge portion) and the semiconductor blocking layer 161.

A p-side ohmic electrode 163 consisting of a Pt layer having a thickness of about 1 nm and a Pd layer having a thickness of about 3 nm stacked on the p-type second contact layer 162 in this order is formed on the p-type second contact layer 162. A p-side pad electrode 164 consisting of an Ni layer having a thickness of about 0.1 µm and an Au layer having a thickness of about 3 µm stacked on the p-side ohmic electrode 163 in this order is formed on a partial region of the upper surface of the p-side ohmic electrode 163. An n-side ohmic electrode 165 consisting of a Ti layer having a thickness of about 10 nm and an Al layer having a thickness of about 0.1 µm stacked on the n-type contact layer 102 in this order is formed on the exposed surface of the n-type contact layer 102. An n-side pad electrode 166 consisting of an Ni layer having a thickness of about 0.1 µm and an Au layer having a thickness of about 3 µm stacked on the n-side ohmic electrode 165 in this order is formed on a partial region of the upper surface of the n-side ohmic electrode 165.

According to the ninth embodiment, the semiconductor blocking layer 161 is formed to be in contact with the side surfaces of the current path portion (ridge portion) as hereinabove described, whereby the contact portions between the semiconductor blocking layer 161 and the p-type cladding layer 105 can be limited to the side surfaces of the current path portion (ridge portion). Thus, strain applied to the semiconductor blocking layer 161 can 10. be further relaxed. Consequently, various effects at least equivalent to those of the sixth embodiment are attained.

A method of fabricating the nitride-based semiconductor laser device according to the ninth embodiment is now described with reference to FIGS. 53 to 56. According to the ninth embodiment, the layers 102 to 106 are formed similarly to those in the nitride-based semiconductor laser device according to the fifth embodiment shown in FIGS. 26 to 29.

Figure 54:
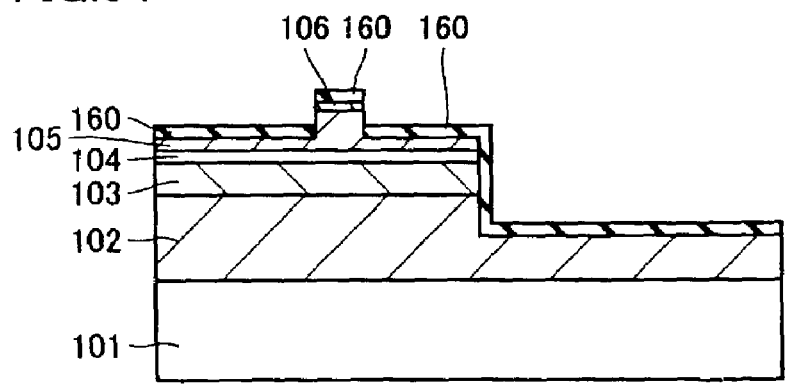
FIGS. 54 to 56 are sectional views for illustrating a method of fabricating the nitride-based semiconductor laser device according to the ninth embodiment of the present invention.

As shown in FIG. 54, the n-type contact layer 102, the n-type cladding layer 103, the MQW emission layer 104, the p-type cladding layer 105 and the p-type first contact layer 106 are formed on the sapphire substrate 101 by a method similar to that in the fifth embodiment. Then, the dielectric blocking layer 160 of SiN having the thickness of about 50 nm is formed by plasma CVD to substantially cover the overall upper surface of the wafer. Thereafter the portions of the dielectric blocking layer 160 located on the side surfaces of the current path portion are removed by photolithography and dry etching with etching gas of $CF_4$ or wet etching with an HF-based etchant.

Figure 55:
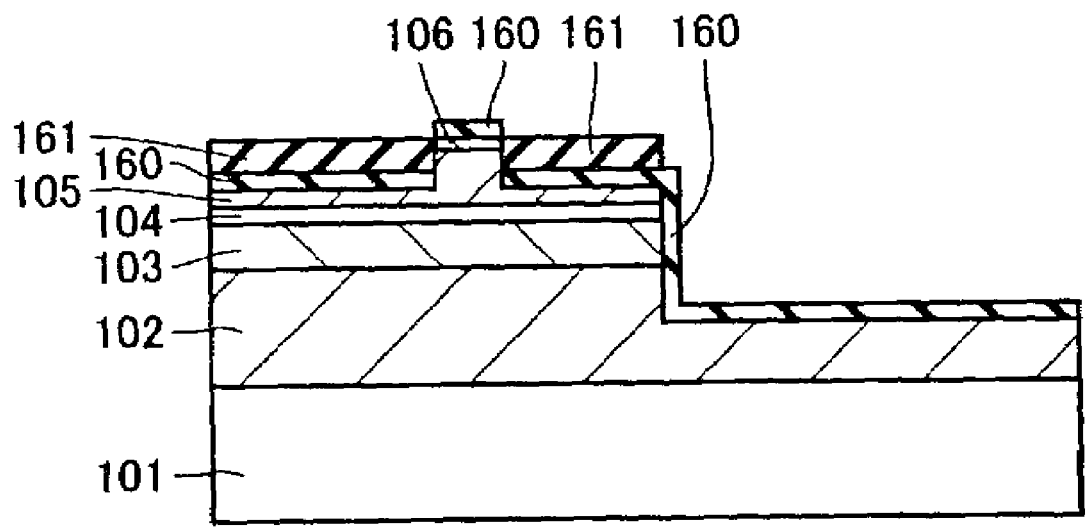

As shown in FIG. 55, the semiconductor blocking layer 161 of $Al_wGa_{1-w}N$ (Al composition: w=0.15) having the thickness of about 0.25 μm is selectively grown from the exposed side surfaces of the current path portion (ridge portion) by MOVPE, to cover the dielectric blocking layer 120 formed on the upper surface of the p-type cladding layer 105.

Figure 56:
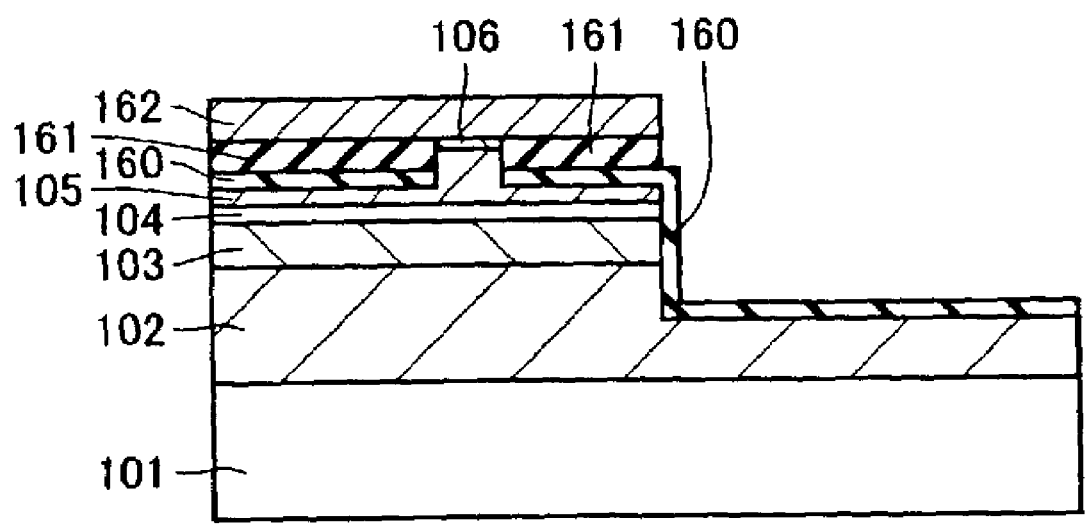

Thereafter the portion of the dielectric blocking layer 160 located on the current path portion (the p-type first contact layer 106) is removed by photolithography and dry etching with etching gas of $CF_4$ or wet etching with an HF-based etchant, as shown in FIG. 56. The p-type second contact layer 162 of Mg-doped GaN having the thickness of about 0.07 μm is formed substantially on the overall upper surfaces of the current path portion (the p-type first contact layer 106) and the semiconductor blocking layer 161 by MOVPE.

Finally, the p-side ohmic electrode 163 and the p-side pad electrode 164 are successively formed on the p-type second contact layer 162 by vacuum deposition, as shown in FIG. 53. The partial region of the dielectric blocking layer 160 located on the upper surface of the n-type contact layer 102 is removed by photolithography and etching. The n-side ohmic electrode 165 and the n-side pad electrode 166 are successively formed on the exposed surface of the n-type contact layer 102. Thus, the nitride-based semiconductor laser device according to the ninth embodiment is fabricated.

In the method of fabricating the nitride-based semiconductor laser device according to the ninth embodiment, the semiconductor blocking layer 161 is formed by selective growth as hereinabove described, whereby crystallinity of the semiconductor blocking layer 161 can be improved.

Figure 57:
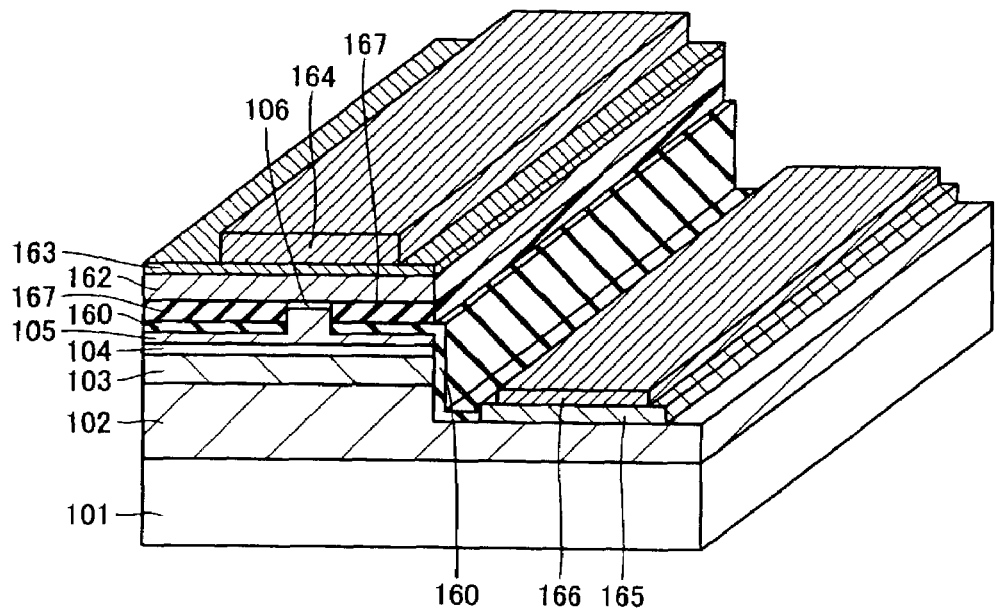
FIG. 57 is a perspective view showing a nitride-based semiconductor laser device according to a modification of the ninth embodiment of the present invention.

FIG. 57 is a perspective view showing a nitride-based semiconductor laser device according to a modification of the ninth embodiment of the present invention. The nitride-based semiconductor laser device according to the modification of the ninth embodiment is a complex refractive index guided ridge laser device different from the nitride-based semiconductor laser device according to the ninth embodiment only in the material for a semiconductor blocking layer 167. In the modification of the ninth embodiment, the semiconductor blocking layer 167 of $In_sGa_{1-s}N$ (In composition: s=0.18) having a thickness of about 0.25 μm is formed substantially on the overall upper surface of a dielectric blocking layer 160 formed on a p-type cladding layer 105 to cover the side surfaces of a current path portion, as shown in FIG. 57.

In the modification of the ninth embodiment, a current blocking layer is formed by the dielectric blocking layer 160 and the semiconductor blocking layer 167 of InGaN formed on the dielectric blocking layer 160 as hereinabove described, whereby transverse light confinement can be performed by absorbing light in the semiconductor blocking layer 167. Thus, transverse light confinement can be stabilized also when forming the semiconductor blocking layer 167 having a smaller thickness than a semiconductor blocking layer of AlGaN. The remaining effects of the modification of the ninth embodiment are similar to those of the ninth embodiment.

In fabrication of the aforementioned nitride-based semiconductor laser device according to the modification of the ninth embodiment, the semiconductor blocking layer 167 of InGaN is grown under a lower temperature as compared with the semiconductor blocking layer 161 of AlGaN according to the ninth embodiment. The remaining steps are similar to those in the ninth embodiment. The semiconductor blocking layer 167 of InGaN can be formed under a lower temperature as compared with the semiconductor blocking layer 161 of AlGaN according to the ninth embodiment as described above, whereby an impurity (Mg) introduced into the p-type cladding layer 105 can be prevented from diffusing into an MQW emission layer 104. Consequently, the nitride-based semiconductor laser device can be improved in reliability.

(Tenth Embodiment)

Figure 58:
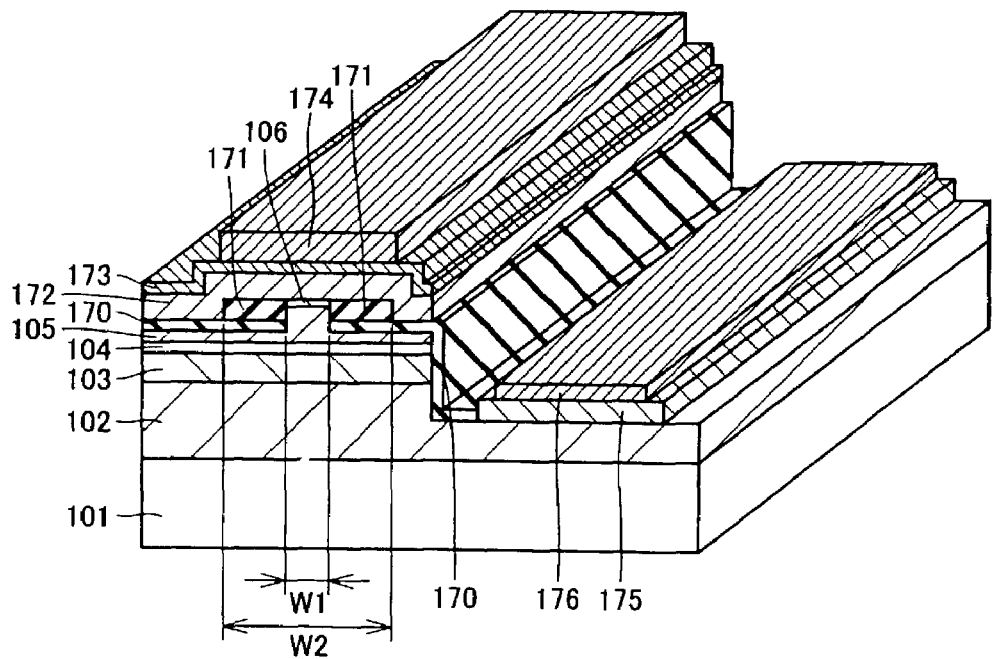
FIG. 58 is a perspective view showing a nitride-based semiconductor laser device according to a tenth embodiment of the present invention.

FIG. 58 shows a real refractive index guided ridge nitride-based semiconductor laser device according to a tenth embodiment of the present invention. While the semiconductor blocking layer 161 is formed up to the region not in the vicinity of the current path portion in the aforementioned ninth embodiment, a semiconductor blocking layer 171 is formed only in the vicinity of a current path portion in the tenth embodiment. The tenth embodiment is now described in detail.

In the structure of the nitride-based semiconductor laser device according to the tenth embodiment, an n-type contact layer 102, an n-type cladding layer 103 and an MQW emission layer 104 are formed on a sapphire substrate 101, similarly to the ninth embodiment. A p-type cladding layer 105 having a projection portion and a p-type first contact layer 106 are formed on the MQW emission layer 104. The projection portion of the p-type cladding layer 105 and the p-type first contact layer 106 form the current path portion (ridge portion) having a width W1 of about 1.5 μm. The compositions and the thicknesses of the layers 102 to 106 in the tenth embodiment are similar to those in the fifth embodiment.

A dielectric blocking layer 170 of SiN having a thickness of about 50 nm is formed to cover a flat portion of the p-type cladding layer 105, the side surfaces of the MQW emission layer 104, the n-type cladding layer 103 and the n-type contact layer 102 and a partial region of the upper surface of the n-type contact layer 102.

The semiconductor blocking layer 171 of $Al_wGa_{1-w}N$ (Al composition: w=0.15) having a thickness of about 0.25 μm is formed in the vicinity of the current path portion (ridge portion) on the upper surface of the dielectric blocking layer 170, to cover the side portions of the current path portion. The semiconductor blocking layer 171 is formed only in the vicinity of the current path portion, so that the total width W2 of the semiconductor blocking layer 171 and the current path portion is about 7.5 μm. The dielectric blocking layer 170 and the semiconductor blocking layer 171 form a current blocking layer.

A p-type second contact layer 172 of Mg-doped GaN having a thickness of about 0.07 μm is formed on the semiconductor blocking layer 171 located on a flat portion of the p-type cladding layer 105, to cover the upper surface of the current path portion (ridge portion) and the semiconductor blocking layer 171.

A p-side ohmic electrode 173 consisting of a Pt layer having a thickness of about 1 nm and a Pd layer having a thickness of about 3 nm stacked on the p-type second contact layer 172 in this order is formed on the p-type second contact layer 172. A p-side pad electrode 174 consisting of an Ni layer having a thickness of about 0.1 μm and an Au layer having a thickness of about 3 μm stacked on the p-side ohmic electrode 173 in this order is formed on a partial region of the upper surface of the p-side ohmic electrode 173. An n-side ohmic electrode 175 consisting of a Ti layer having a thickness of about 10 nm and an Al layer having a thickness of about 0.1 μm stacked on the n-type contact layer 102 in this order is formed on the exposed surface of the n-type contact layer 102. An n-side pad electrode 176 consisting of an Ni layer having a thickness of about 0.1 μm and an Au layer having a thickness of about 3 μm stacked on the n-side ohmic electrode 175 in this order is formed on a partial region of the upper surface of the n-side ohmic electrode 175.

According to the tenth embodiment, the semiconductor blocking layer 171 is formed to be in contact with the side surfaces of the current path portion (the p-type cladding layer 105 and the p-type first contact layer 106) as hereinabove described, whereby the contact portions between the semiconductor blocking layer 171 and the p-type cladding layer 105 can be limited to the side surfaces of the current path portion (ridge portion). Thus, strain applied to the semiconductor blocking layer 171 can be further relaxed. Further, the semiconductor blocking layer 171 is formed only in the vicinity of the current path portion, thereby reducing the capacitance between the current blocking layer consisting of the semiconductor blocking layer 171 and the dielectric blocking layer 170 and the p-type cladding layer 105. Thus, a pulse for operating the device can be quickly rise and fall, whereby a nitride-based semiconductor laser device allowing high-speed pulsed operation can be obtained. The remaining effects of the tenth embodiment are similar to those of the fifth embodiment.

A method of fabricating the nitride-based semiconductor laser device according to the tenth embodiment is now described with reference to FIGS. 58 to 60.

Figure 59:
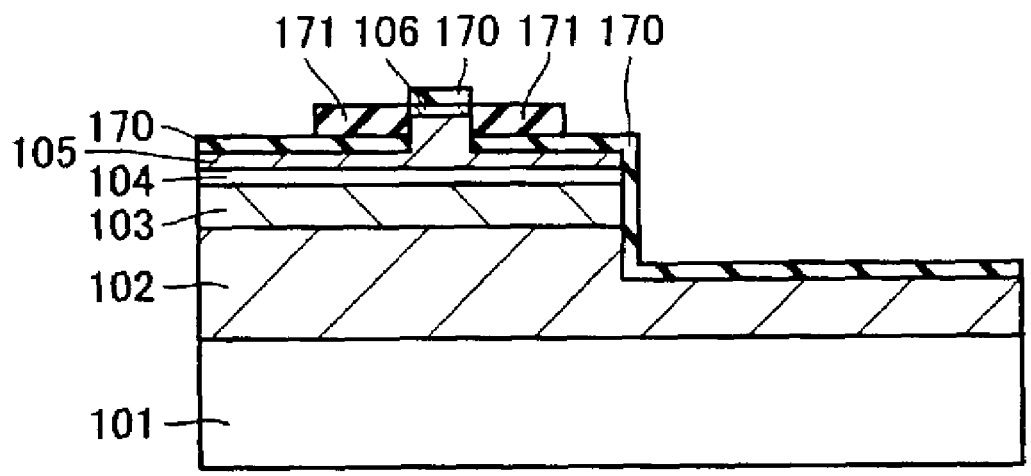
FIGS. 59 and 60 are sectional views for illustrating a method of fabricating the nitride-based semiconductor laser device according to the tenth embodiment of the present invention.

As shown in FIG. 59, the n-type contact layer 102, the n-type cladding layer 103, the MQW emission layer 104, the p-type cladding layer 105 and the p-type first contact layer 106 are formed on the sapphire substrate 101 by a method similar to that in the fifth embodiment shown in FIGS. 26 to 29. Then, the dielectric blocking layer 170 of SiN having the thickness of about 50 nm is formed by plasma CVD to substantially cover the overall upper surface of the wafer. Thereafter the portions of the dielectric blocking layer 170 located on the side surfaces of the current path portion are removed by photolithography and dry etching with etching gas of $CF_4$ or wet etching with an HF-based etchant.

The semiconductor blocking layer 171 of $Al_wGa_{1-w}N$ (Al composition: w=0.15) having the thickness of about 0.25 μm is selectively grown by MOVPE in the vicinity of the current path portion on the upper surface of the dielectric blocking layer 170 from the exposed side surfaces of the current path portion (ridge portion). In this case, the semiconductor blocking layer 171 is formed only in the vicinity of the current path portion so that the total width W2 of the semiconductor blocking layer 171 and the current path portion is about 7.5 μm. This semiconductor blocking layer 171 can be easily formed by controlling the time for selective growth.

Figure 60:
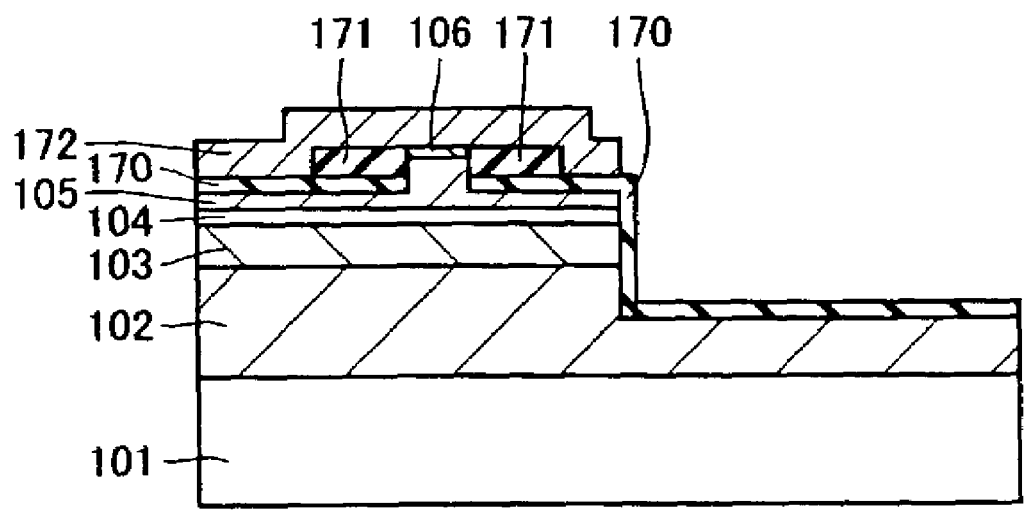

Thereafter the portion of the dielectric blocking layer 170 located on the current path portion (the p-type first contact layer 106) is removed by photolithography and dry etching with etching gas of $CF_4$ or wet etching with an HF-based etchant, as shown in FIG. 60. The p-type second contact layer 172 of Mg-doped GaN having the thickness of about 0.07 μm is formed to cover the upper surface of the current path portion (the p-type first contact layer 106) and the semiconductor blocking layer 161 by MOVPE.

Finally, the p-side ohmic electrode 173 and the p-side pad electrode 174 are successively formed on the p-type second contact layer 172 by vacuum deposition, as shown in FIG. 58. The partial region of the dielectric blocking layer 170 located on the upper surface of the n-type contact layer 102 is removed by photolithography and etching. The n-side ohmic electrode 175 and the n-side pad electrode 176 are successively formed on the exposed surface of the n-type contact layer 102. Thus, the nitride-based semiconductor laser device according to the tenth embodiment is fabricated.

In the method of fabricating the nitride-based semiconductor laser device according to the tenth embodiment, the semiconductor blocking layer 171 is formed by selective growth as hereinabove described, whereby crystallinity of the semiconductor blocking layer 171 can be improved.

Figure 61:
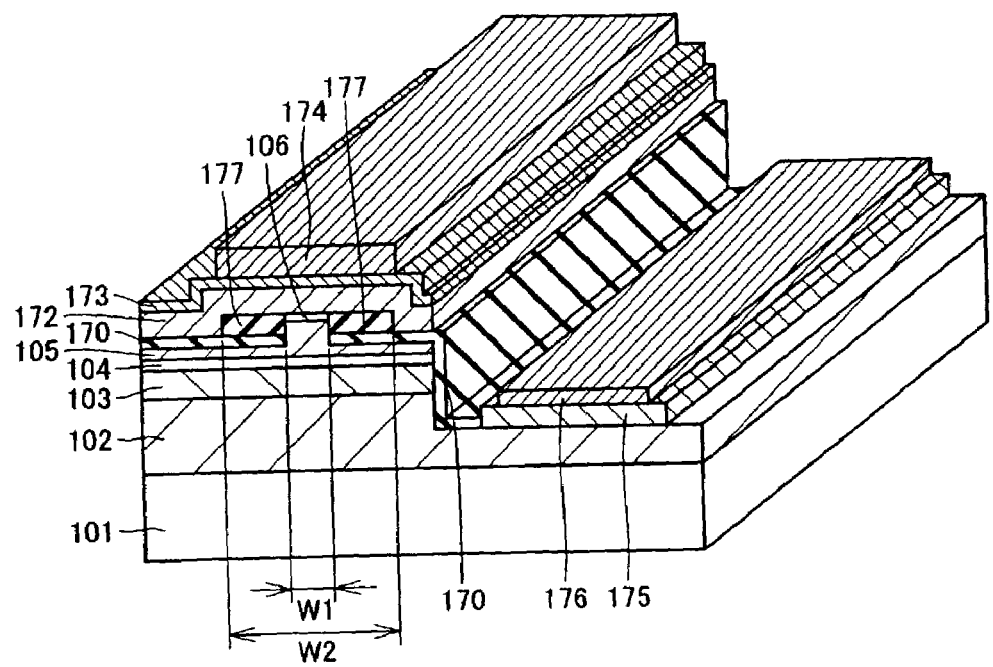
FIG. 61 is a perspective view showing a nitride-based semiconductor laser device according to a modification of the tenth embodiment of the present invention.

FIG. 61 is a perspective view showing a nitride-based semiconductor laser device according to a modification of the tenth embodiment of the present invention. The nitride-based semiconductor laser device according to the modification of the tenth embodiment is a complex refractive index guided ridge laser device different from the nitride-based semiconductor laser device according to the tenth embodiment only in the material for a semiconductor blocking layer 177. In the modification of the tenth embodiment, the semiconductor blocking layer 177 of $In_sGa_{1-s}N$ (In composition: s=0.18) having a thickness of about 0.25 μm and a width W2 of about 7.5 μm is formed in the vicinity of a current path portion on the upper surface of a dielectric blocking layer 170 to cover the side surfaces of the current path portion, as shown in FIG. 61.

In the modification of the tenth embodiment, a current blocking layer is formed by the dielectric blocking layer 170 and the semiconductor blocking layer 177 of InGaN formed on the dielectric blocking layer 170 as hereinabove described, whereby transverse light confinement can be performed by absorbing light in the semiconductor blocking layer 177. Thus, transverse light confinement can be stabilized also when forming the semiconductor blocking layer 177 having a smaller thickness than a semiconductor blocking layer of AlGaN. The remaining effects of the modification of the tenth embodiment are similar to those of the tenth embodiment.

In fabrication of the aforementioned nitride-based semiconductor laser device according to the modification of the tenth embodiment, the semiconductor blocking layer 177 of InGaN is grown under a lower temperature as compared with the semiconductor blocking layer 171 of AlGaN according to the tenth embodiment. The remaining steps are similar to those in the tenth embodiment. The semiconductor blocking layer 177 of InGaN can be formed under a lower temperature as compared with the semiconductor blocking layer 171 of AlGaN according to the tenth embodiment as described above, whereby an impurity (Mg) introduced into a p-type cladding layer 105 can be prevented from diffusing into an MQW emission layer 104. Consequently, the nitride-based semiconductor laser device can be improved in reliability.

(Eleventh Embodiment)

Figure 62:
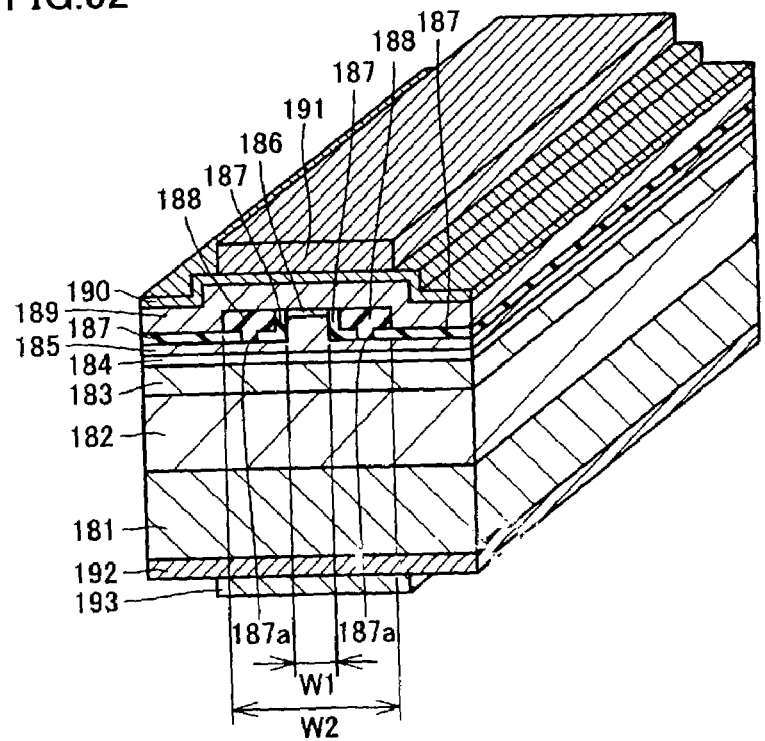
FIG. 62 is a perspective view showing a nitride-based semiconductor laser device according to an eleventh embodiment of the present invention.

FIG. 62 shows a real refractive index guided ridge nitride-based semiconductor laser device according to an eleventh embodiment of the present invention. While a sapphire substrate is employed in each of the aforementioned first to third and fifth to tenth embodiments, a GaN substrate 181 having conductivity is employed in the eleventh embodiment. The eleventh embodiment is now described in detail.

In the structure of the nitride-based semiconductor laser device according to the eleventh embodiment, an n-type contact layer 182 of Si-doped GaN having a thickness of about 4 μm, an n-type cladding layer 183 of Si-doped AlGaN having a thickness of about 1 μm and an MQW emission layer 184 having a multiple quantum well (MQW) structure of InGaN are formed on the GaN substrate 181. The MQW emission layer 184 is formed by alternately stacking three quantum well layers of $In_xGa_{1-x}N$ each having a thickness of about 8 nm and four quantum barrier layers of $In_yGa_{1-y}N$ each having a thickness of about 16 nm. In this MQW emission layer 184, x>y, and the MQW emission layer 184 is formed to satisfy x=0.13 and y=0.05 according to this embodiment. The MQW emission layer 184 is an example of the "emission layer" according to the present invention.

A p-type cladding layer 185 of Mg-doped $Al_vGa_{1-v}N$ (Al composition: v=0.08) having a projection portion of about 1.5 µm in width is formed on the MQW emission layer 184. The thickness of the projection portion of the p-type cladding layer 185 is about 0.4 µm, and the thickness of a flat portion excluding the projection portion is about 0.1 µm. A p-type first contact layer 186 of Mg-doped GaN having a width of about 1.5 µm and a thickness of about 0.01 µm is formed on the upper surface of the projection portion of the p-type cladding layer 185. The projection portion of the p-type cladding layer 185 and the p-type first contact layer 186 form a current path portion (ridge portion) having a width W1 of about 1.5 µm. The p-type cladding layer 185 is an example of the "cladding layer" according to the present invention.

A dielectric blocking layer 187 of SiN having a thickness of about 50 nm is formed to cover the side surfaces of the current path portion (ridge portion) and the upper surface of the flat portion of the p-type cladding layer 184. The dielectric blocking layer 187 is formed to have an opening 187a in the vicinity of the current path portion on the upper surface of the flat portion of the p-type cladding layer 185.

A semiconductor blocking layer 188 of $Al_wGa_{1-w}N$ (Al composition: w=0.15) having a thickness of about 0.25 µm and a width W2 of about 7.5 µm is formed in the vicinity of the current path potion (ridge portion) on the upper surface of the dielectric blocking layer 187 to fill up the side portions of the current path portion. The semiconductor blocking layer 188 is formed only in the vicinity of the current path portion so that the total width W2 of the semiconductor blocking layer 188 and the current path portion is about 7.5 µm. The semiconductor blocking layer 188 is formed to be in contact with the p-type cladding layer 185 through the opening 187a formed in the dielectric blocking layer 187. The dielectric blocking layer 187 and the semiconductor blocking layer 188 form a current blocking layer.

A p-type second contact layer 189 of Mg-doped GaN having a thickness of about 0.07 µm is formed on the dielectric blocking layer 187 to cover the upper surface of the current path portion (the p-type first contact layer 186) and the semiconductor blocking layer 188.

A p-side ohmic electrode 190 consisting of a Pt layer having a thickness of about 1 nm and a Pd layer having a thickness of about 3 nm stacked on the p-type second contact layer 189 in this order is formed on the p-type second contact layer 189. A p-side pad electrode 191 consisting of an Ni layer having a thickness of about 0.1 µm and an Au layer having a thickness of about 3 µm stacked on the p-side ohmic electrode 190 in this order is formed on a partial region of the upper surface of the p-side ohmic electrode 190. An n-side ohmic electrode 192 consisting of a Ti layer having a thickness of about 10 nm and an Al layer having a thickness of about 0.1 µm stacked on the GaN substrate 181 in this order is formed on the back surface of the GaN substrate 181 having conductivity. An n-side pad electrode 113 consisting of an Ni layer having a thickness of about 0.1 µm and an Au layer having a thickness of about 3 µm stacked on the n-side ohmic electrode 192 in this order is formed on a partial region of the back surface of the n-side ohmic electrode 192.

According to the eleventh embodiment, effects similar to those of the fifth embodiment can be attained also when forming the current blocking layer consisting of the dielectric blocking layer 187 and the semiconductor blocking layer 188 on the GaN substrate 181 having conductivity.

A method of fabricating the nitride-based semiconductor laser device according to the eleventh embodiment is now described with reference to FIGS. 62 to 67.

Figure 63:
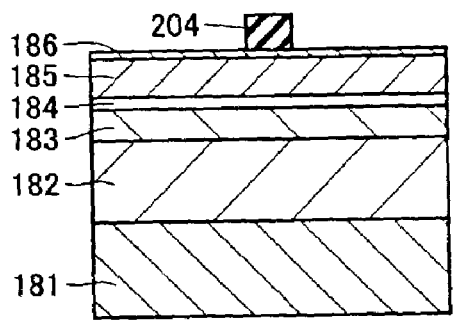
FIGS. 63 to 67 are sectional views for illustrating a method of fabricating the nitride-based semiconductor laser device according to the eleventh embodiment of the present invention.

As shown in FIG. 63, the n-type contact layer 182 of Si-doped GaN having the thickness of about 4 µm, the n-type cladding layer 183 of Si-doped AlGaN having the thickness of about 1 µm and the MQW emission layer 184 are formed on the GaN substrate 181 by MOVPE. The p-type cladding layer 185 of Mg-doped $Al_vGa_{1-v}N$ (Al composition: v= 0.08) having the thickness of about 0.4 µm and the p-type first contact layer 186 of Mg-doped GaN having the thickness of about 0.01 µm are successively formed on the MQW emission layer 184 by MOVPE. Thereafter an $SiO_2$ film (not shown) having a thickness of about 0.2 µm is formed to cover the overall upper surface of the p-type first contact layer 186 by plasma CVD. Thereafter the $SiO_2$ film is patterned by photolithography and dry etching with etching gas of $CF_4$ or wet etching with an HF-based etchant, thereby forming a mask layer 204 of $SiO_2$ as shown in FIG. 63.

Figure 64:
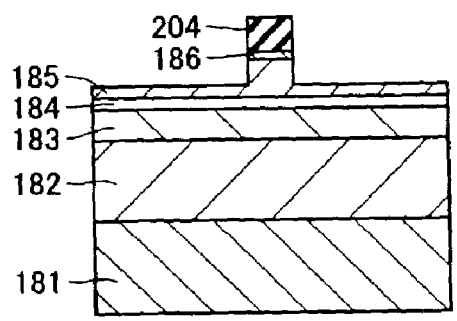

Thereafter the mask layer 204 is employed as a mask for etching partial regions of the p-type first contact layer 186 and the p-type cladding layer 185 by dry etching such as RIE with etching gas consisting of $Cl_2$, as shown in FIG. 64. Thus, the current path portion (ridge portion), consisting of the projection portion of the p-type cladding layer 185 and the p-type first contact layer 186, having the width W1 of about 1.5 µm is formed. Thereafter the mask layer 204 is removed.

Figure 65:
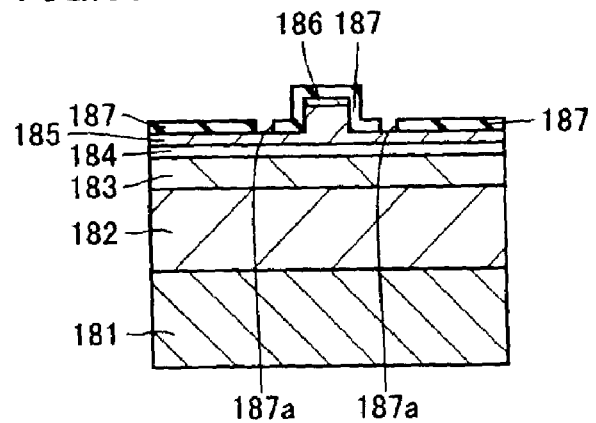

As shown in FIG. 65, the dielectric blocking layer 187 of SiN having the thickness of about 50 nm is formed by plasma CVD to substantially cover the overall upper surface of the wafer, and thereafter the opening 187a is formed in the dielectric blocking layer 187 by photolithography and etching. The opening 187a is so formed that a partial region of the upper surface of the flat portion of the p-type cladding layer 185 is exposed in the vicinity of the current path portion.

Figure 66:
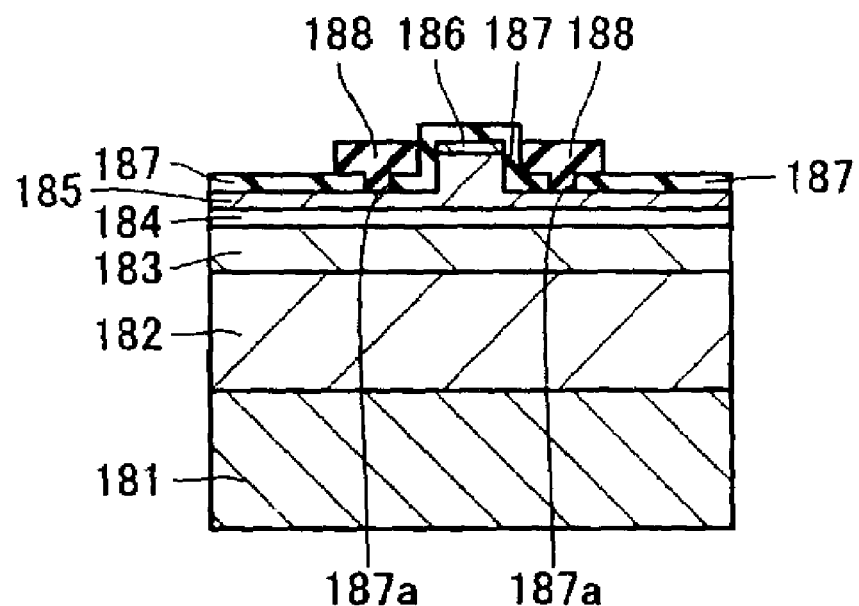
Figure 67:
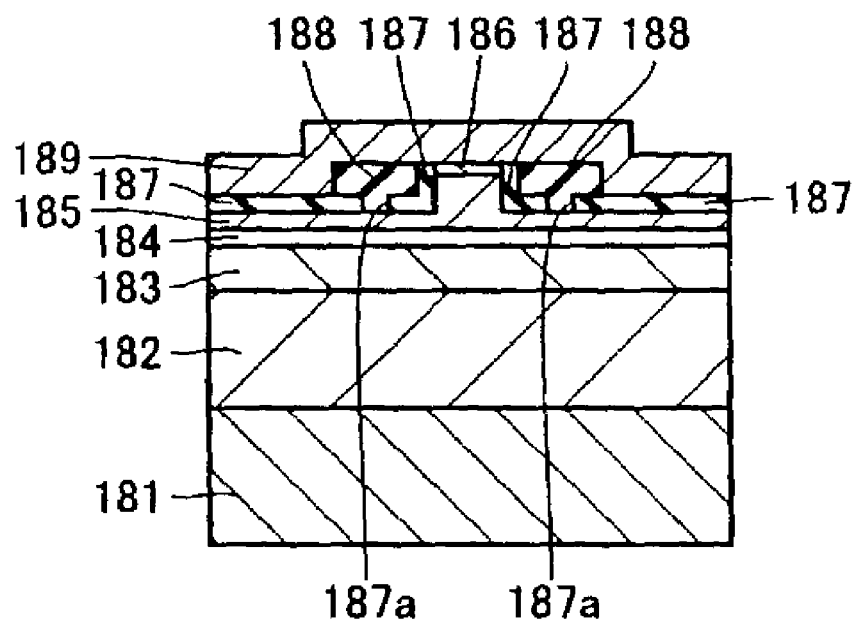

As shown in FIG. 66, the semiconductor blocking layer 188 of $Al_wGa_{1-w}N$ (Al composition: w=0.15) having the thickness of about 0.25 µm is selectively grown on the upper surface of the p-type cladding layer 185 exposed in the opening 187a by MOVPE to cover the portions of the dielectric blocking layer 187 formed on the side portions of the current path portion. The semiconductor blocking layer 188 is formed only in the vicinity of the current path portion so that the total width W2 of the semiconductor blocking layer 188 and the current path portion is about 7.5 µm. This semiconductor blocking layer 188 can be easily formed by controlling the time for selective growth. Thereafter the portion of the dielectric blocking layer 187 located on the current path portion (the p-type first contact layer 186) is removed by photolithography and dry etching with etching gas of $CF_4$ or wet etching with an HF-based etchant, as shown in FIG. 67.

Then, the p-type second contact layer 189 of Mg-doped GaN having the thickness of about 0.07 µm is formed on the dielectric blocking layer 187 by MOVPE to cover the upper surface of the current path portion (the p-type first contact layer 186) and the semiconductor blocking layer 188.

Finally, the p-side ohmic electrode 190 and the p-side pad electrode 191 are successively formed on the p-type second contact layer 189 by vacuum deposition, as shown in FIG. 62. Further, the n-side ohmic electrode 192 and the n-side pad electrode 193 are successively formed on the back surface of the GaN substrate 181 having conductivity. Thus, the nitride-based semiconductor laser device according to the eleventh embodiment is fabricated.

In the method of fabricating the nitride-based semiconductor laser device according to the eleventh embodiment, the semiconductor blocking layer 188 is formed by selective growth as hereinabove described, whereby crystallinity of the semiconductor blocking layer 188 can be improved. Further, the semiconductor blocking layer 188 is selectively grown from the opening 187*a* provided in the vicinity of the current path portion, so that the semiconductor blocking layer 188 can be formed only in the vicinity of the current path portion. Thus, strain applied to the semiconductor blocking layer 188 due to the difference between the lattice constants of the semiconductor blocking layer 188 and the p-type cladding layer 185 can be relaxed.

Figure 68:
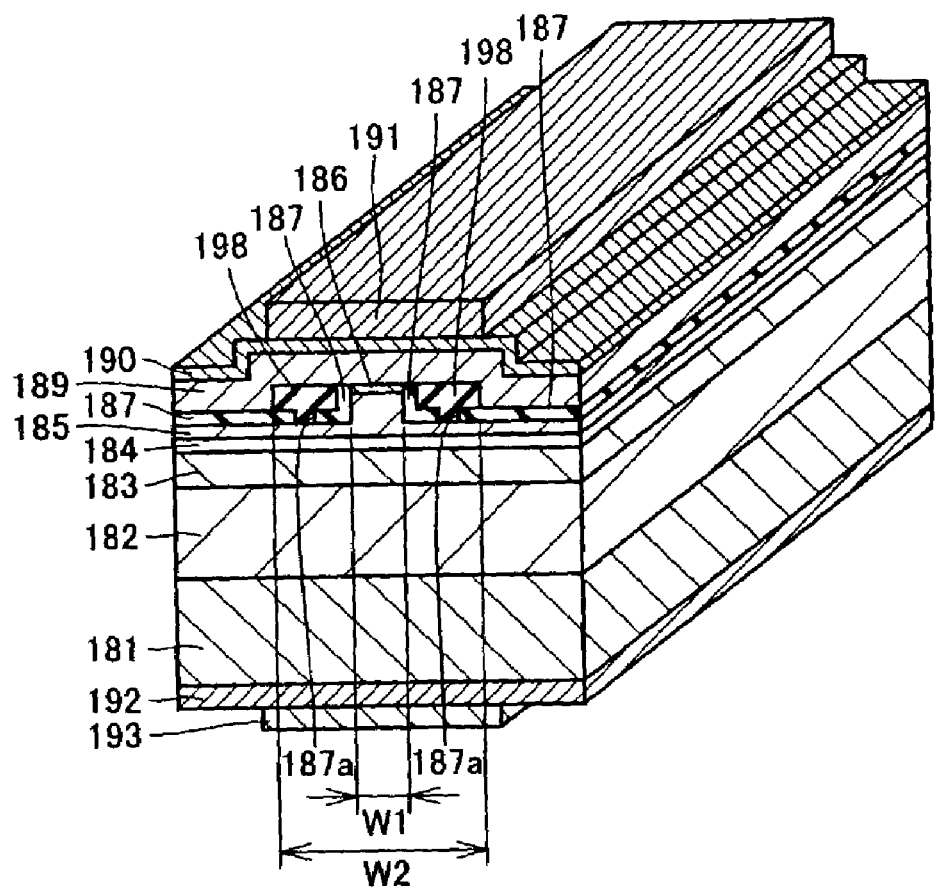
FIG. 68 is a perspective view showing a nitride-based semiconductor laser device according to a modification of the eleventh embodiment of the present invention.
Figure 69:
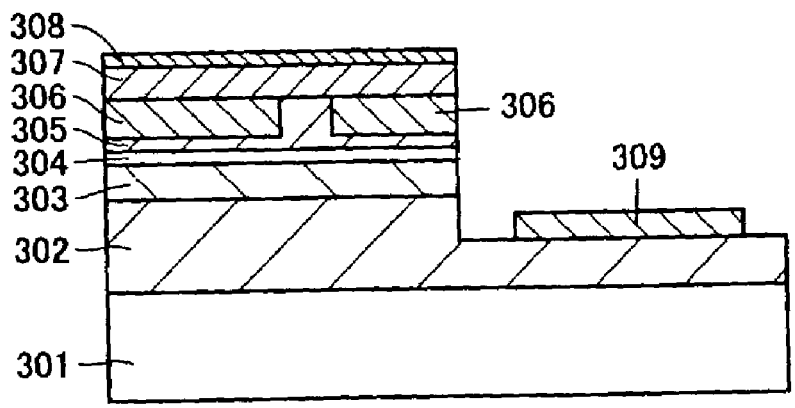
FIG. 69 is a sectional view showing a conventional nitride-based semiconductor laser device.

FIG. 68 is a perspective view showing a nitride-based semiconductor laser device according to a modification of the eleventh embodiment of the present invention. The nitride-based semiconductor laser device according to the modification of the eleventh embodiment is a complex refractive index guided ridge laser device different from the nitride-based semiconductor laser device according to the eleventh embodiment only in the material for a semiconductor blocking layer 198. According to the modification of the eleventh embodiment, the semiconductor blocking layer 198 of $In_sGa_{1-s}N$ (In composition: s=0.18) having a thickness of about 0.25 $\mu$m and a width W2 of about 7.5 $\mu$m is formed to cover a dielectric blocking layer 187 formed on side portions of a current path portion (ridge portion) and the upper surface of a p-type cladding layer 185, as shown in FIG. 68.

In the modification of the eleventh embodiment, a current blocking layer is formed by the dielectric blocking layer 187 and the semiconductor blocking layer 198 of InGaN formed on the dielectric blocking layer 187 as hereinabove described, whereby transverse light confinement can be performed by absorbing light in the semiconductor blocking layer 198. Thus, transverse light confinement can be stabilized also when forming the semiconductor blocking layer 198 having a smaller thickness than a semiconductor blocking layer of AlGaN. The remaining effects of the modification of the eleventh embodiment are similar to those of the eleventh embodiment.

In fabrication of the aforementioned nitride-based semiconductor laser device according to the modification of the eleventh embodiment, the semiconductor blocking layer 198 of InGaN is grown under a lower temperature as compared with the semiconductor blocking layer 188 of AlGaN according to the eleventh embodiment. The remaining steps are similar to those in the eleventh embodiment. The semiconductor blocking layer 198 of InGaN can be formed under a lower temperature as compared with the semiconductor blocking layer 188 of AlGaN according to the eleventh embodiment as described above, whereby an impurity (Mg) introduced into a p-type cladding layer 185 can be prevented from diffusing into an MQW emission layer 184. Consequently, the nitride-based semiconductor laser device can be improved in reliability.

Although the present invention has been described and illustrated in detail, it is clearly understood that the same is by way of illustration and example only and is not to be taken by way of limitation, the spirit and scope of the present invention being limited only by the terms of the appended claims.

For example, a high reflectivity film or low reflectivity film such as a dielectric multilayer film formed by stacking layers of $Si_3N_4$, $SiO_2$, $Al_2O_3$ or $TiO_2$ may further be formed on the cavity surface of the nitride-based semiconductor laser device formed according to each of the aforementioned first to eleventh embodiments.

While the present invention is applied to the nitride-based semiconductor laser device in each of the aforementioned first to eleventh embodiments, the present invention is not restricted to this but also applicable to a surface emission type semiconductor laser device, for example. Assuming that B represents the diameter of an emission region in this case, a mask layer having a substantially circular opening (preferably having a diameter 3B to 7B) may be formed around the emission region for forming a current blocking layer only around the emission region in the opening of the mask layer, for example. When a step portion is formed around a substantially circular terrace (flat portion) (preferably having a diameter 3B to 7B) around the emission region for thereafter selectively growing a current blocking layer on the step portion, a portion of the current blocking layer having a small thickness can be formed on the step portion to enclose the emission layer. In this case, a dielectric blocking layer may be formed around the emission region for forming a semiconductor blocking layer on this dielectric blocking layer. The present invention is also applicable to a superluminescent light-emitting diode device or the like.

While a sapphire substrate, an n-type Si substrate or an n-type GaN substrate is employed in each of the aforementioned first to eleventh embodiments, the present invention is not restricted to this but an insulator substrate such as a spinel substrate, a group 3–5 semiconductor substrate such as a GaAs substrate, a GaP substrate or an InP substrate, an SiC substrate or a substrate of a boron compound expressed as $MB_2$ (M: metallic element such as Al, Ti, Zr, Hf, V, Nb, Ta or Cr) may alternatively be employed.

While InGaN is employed as the material for the MQW emission layer in each of the aforementioned first to eleventh embodiments, the present invention is not restricted to this but an emission layer may alternatively be prepared from a material having a band gap smaller than those of an n-type first cladding layer and an n-type second cladding layer. Particularly in a device provided with an emission layer having a quantum well structure of AlGaN, GaN or AlGaN/GaN/AlGaN exhibiting a larger band gap than InGaN, a current blocking layer, consisting of AlBGaN or AlGaN having a large Al composition, exhibiting a smaller lattice constant must be formed, leading to remarkable difference between the lattice constants of the current blocking layer and a GaN layer or a GaN substrate. Also in this case, effects similar to those of the aforementioned first to fourth embodiments can be attained by forming the current blocking layer only in the vicinity of a current path portion or reducing the thickness of the current blocking layer in a portion not in the vicinity of the current path portion. In this case, further, effects similar to those of the aforementioned fifth to eleventh embodiments can be attained by forming a semiconductor blocking layer on a dielectric blocking layer.

While AlGaN is employed as the material for the n-type first and second cladding layers in each of the aforementioned first to eleventh embodiments, the present invention is not restricted to this but the n-type first and second cladding layers may be prepared from a material such as AlGaN, AlBN or AlBINGaN having a different lattice constant from the underlayer.

While the n-type layers are formed followed by formation of the p-type layers in each of the aforementioned first to eleventh embodiments, the present invention is not restricted to this but p-type layers may alternatively be first formed on a substrate followed by formation of n-type layers.

In each of the aforementioned first to eleventh embodiments, each of the nitride-based semiconductors may have either a wurtzite structure or a zinc blende crystal structure.

While each nitride-based semiconductor layer is crystal-grown by MOVPE or the like in each of the aforementioned first to eleventh embodiments, the present invention is not restricted to this but crystal growth may alternatively be performed by HVPE (halide or hydride VPE) or gas source MBE (molecular beam epitaxy) employing TMAl, TMGa, TMIn, $NH_3$, $SiH_4$ or $Cp_2Mg$ as material gas.

In each of the aforementioned second and third embodiments, the Al composition of $Al_xGa_{1-x}N$ forming the current blocking layer is set larger than the Al composition of $Al_zGa_{1-z}N$ forming the n-type cladding layer closer to the substrate in relation to the emission layer. While cracks or lattice defects are easily caused when the current blocking layer has a large Al composition, the present invention can inhibit the current blocking layer from formation of cracks or lattice defects. Consequently, the difference between the lattice constants of the n-type cladding layer and the current blocking layer can be increased, thereby stabilizing transverse light confinement. Also when the value x is less than or equal to the value z ($x \leq z$), the current blocking layer can be inhibited from formation of cracks or lattice defects according to the present invention. Thus, a similar effect can be attained in the point that a current blocking layer having excellent crystallinity can be formed.

While SiN is employed as the material for the dielectric blocking layer in each of the aforementioned fifth to eleventh embodiments, the present invention is not restricted to this but another nitride such as ZrN or TiN or an oxide such as $SiO_2$, $ZrO_2$ or $TiO_2$ may alternatively be employed. The dielectric blocking layer is preferably prepared from a material having a smaller refractive index than the material for the cladding layer forming the current path portion. Further, the dielectric blocking layer is preferably prepared from a material absorbing light generated from an active layer.

While the dielectric blocking layer is formed to have the thickness of about 50 nm in each of the aforementioned fifth to eleventh embodiments, the present invention is not restricted to this but the dielectric blocking layer may alternatively be formed to have a thickness within about 250 nm. When the dielectric blocking layer is formed to have a thickness of about 250 nm, for example, the temperature characteristic of the nitride-based semiconductor laser device is slightly reduced due to the increased thickness, thereby slightly increasing operating current under a high temperature.

While the semiconductor blocking layer 151 is grown to have the opening for forming the current path portion in the aforementioned eighth embodiment, the present invention is not restricted to this but the semiconductor blocking layer 151 may alternatively be temporarily formed on a region for forming the current path portion on the upper surface of the p-type first cladding layer 130 for thereafter removing the portion of the semiconductor blocking layer 151 for forming the current path portion by RIE or the like.

While each nitride-based semiconductor layer is stacked on the (0001) plane of the nitride-based semiconductor in each of the aforementioned first to eleventh embodiments, the present invention is not restricted to this but each nitride-based semiconductor layer may alternatively be stacked in another crystal orientation of the nitride-based semiconductor. For example, each nitride-based semiconductor layer may alternatively be stacked on the (H, K, —H—K, 0) plane such as the (1-100) plane or the (11-20) plane of the nitride-based semiconductor. In this case, no piezoelectric field is formed on the emission layer and hence the radiation efficiency of the emission layer can be improved.

While the step portions 100 are so formed that the portions forming the current path portion protrude and the side surfaces are substantially perpendicular to the substrate surface in the aforementioned second embodiment, the shape of the step portions employable in the present invention is not restricted to this. For example, side surfaces of such step portions may have an oblique angle with respect to the substrate. In this case, an angle formed by the normal directions of the side surfaces of the step portions and the substrate surface may be less than or greater than 90°. Further, the step portions may be so formed that portions forming the current path portion are recessed. Further, each step portion may be formed by a plurality of steps.

What is claimed is:

1. A nitride-based semiconductor light-emitting device comprising:
   an emission later;
   a cladding layer, formed on said emission layer, including a first nitride-based semiconductor layer and having a ridge portion; and
   a semiconductor current-blocking layer including a second nitride-based semiconductor layer, wherein
   said ridge portion serves as a current path portion, and
   said semiconductor current-blocking layer is formed to cover the side surfaces of said current path portion such that regions remote from said current path portion have no semiconductor current-blocking layers.

2. The nitride-based semiconductor light-emitting device according to claim 1, wherein
   the total width of said current path portion and said current blocking layer is at least three times and not more than seven times the width of said current path portion.

3. The nitride-based semiconductor light-emitting device according to claim 1, further comprising a mask layer, serving for selectively growing said current blocking layer, formed on portions of the upper surface of the first nitride-based semiconductor layer on which the current blocking layer is not formed.

4. The nitride-based semiconductor light-emitting device according to claim 3, wherein
   said mask layer is formed at a space of at least once and not more than three times the width of said current path portion from said current path portion.

5. The nitride-based semiconductor light-emitting device according to claim 3, wherein
   said mask layer includes an oxide film or a nitride film containing at least one element selected from a group consisting of Si, Ti and Zr.

6. The nitride-based semiconductor light-emitting device according to claim 1, wherein
   said cladding layer includes a projection portion forming said ridge portion and a flat portion, and said current blocking layer is formed on the side surfaces of said projection portion and on said flat portion.

7. The nitride-based semiconductor light-emitting device according to claim 6, wherein
said mask layer is formed on said flat portion of said cladding layer, and
said current blocking layer is formed on the side surfaces of said projection portion of said cladding layer, on said flat portion of said cladding layer and on said mask layer.

8. The nitride-based semiconductor light-emitting device according to claim 1, wherein
said current blocking layer includes an opening, and
said cladding layer includes:
a first cladding layer having a substantially flat upper surface, and
a second cladding layer, formed on said first cladding layer in said opening, having said current path portion.

9. The nitride-based semiconductor light-emitting device according to claim 1, wherein
said current blocking layer contains at least one element, selected from a group consisting of B, Ga, Al, In and Tl, and N.

10. The nitride-based semiconductor light-emitting device according to claim 1, wherein
said current blocking layer is formed either on a GaN substrate or on a GaN layer formed on a substrate, and includes said second nitride-based semiconductor layer having a smaller lattice constant than GaN.

11. The nitride-based semiconductor light-emitting device according to claim 10, wherein
said current blocking layer includes an Al GaN layer.

12. The nitride-based semiconductor light-emitting device according to claim 1, wherein
said current blocking layer includes said second nitride-based semiconductor layer having a refractive index smaller than the refractive index of said first nitride-based semiconductor layer forming said cladding layer.

13. The nitride-based semiconductor light-emitting device according to claim 1, wherein
said current blocking layer includes said second nitride-based semiconductor layer having a lattice constant smaller than the lattice constant of said first nitride-based semiconductor layer forming said cladding layer.

14. The nitride-based semiconductor light-emitting device according to claim 1, wherein
said current blocking layer includes an $Al_wGa_{1-w}N$ layer,
said cladding layer includes an $Al_vGa_{1-v}N$ layer, and
said current blocking layer and said cladding layer are formed to have compositions satisfying w>v.

15. The nitride-based semiconductor light-emitting device according to claim 1, wherein
said current blocking layer is formed either on a GaN substrate or on a GaN layer formed on a substrate, and includes said second nitride-based semiconductor layer having a lattice constant larger than the lattice constant of GaN.

16. The nitride-based semiconductor light-emitting device according to claim 15, wherein
said current blocking layer contains InGaN.

17. The nitride-based semiconductor light-emitting device according to claim 1, wherein
said current blocking layer includes said second nitride-based semiconductor layer absorbing light emitted from said emission layer.

18. The nitride-based semiconductor light-emitting device according to claim 1, wherein
said current blocking layer includes an $In_sGa_{1-s}N$ layer,
said emission layer includes an $In_xGa_{1-x}N$ layer, and
said current blocking layer and said emission layer are formed to have compositions satisfying $s \geq x$.

19. A nitride-based semiconductor light-emitting device comprising:
an emission layer;
a cladding layer, formed on said emission layer, including a first nitride-based semiconductor layer and having a ridge portion; and
a semiconductor current-blocking layer including a second nitride-based semiconductor layer, wherein
said ridge portion serves as a current path portion, and
said semiconductor current-blocking layer is formed to cover the side surfaces of said current path portion such that a portion of said semiconductor current-blocking layer spaced apart from said current path portion has a first thickness smaller than the thickness of a portion of the semiconductor current-blocking layer on said side surfaces of said current path portion.

20. The nitride-based semiconductor light-emitting device according to claim 19, further comprising a step portion formed on a region spaced apart from said current path portion, wherein
said portion of said current blocking layer having said first thickness is formed on said step portion.

21. The nitride-based semiconductor light-emitting device according to claim 20, wherein
said step portion is spaced apart from said current path portion by at least once and not more than three times the width of said current path portion.

22. The nitride-based semiconductor light-emitting device according to claim 19, wherein
said current blocking layer contains at least one element, selected from a group consisting of B, Ga, Al, Ia and Tl, and N.

23. The nitride-based semiconductor light-emitting device according to claim 19, wherein
said current blocking layer is formed either on a GaN substrate or on a GaN layer formed on a substrate, and includes said second nitride-based semiconductor layer having a smaller lattice constant than GaN.

24. The nitride-based semiconductor light-emitting device according to claim 23, wherein
said current blocking layer includes an AlGaN layer.

25. The nitride-based semiconductor light-emitting device according to claim 19, wherein
said current blocking layer includes said second nitride-based semiconductor layer having a refractive index smaller than the refractive index of said first nitride-based semiconductor layer forming said cladding layer.

26. The nitride-based semiconductor light-emitting device according to claim 19, wherein
said current blocking layer includes said second nitride-based semiconductor layer having a lattice constant smaller than the lattice constant of said first nitride-based semiconductor layer forming said cladding layer.

27. The nitride-based semiconductor light-emitting device according to claim 19, wherein
said current blocking layer includes an $Al_wGa_{1-w}N$ layer,
said cladding layer includes an $Al_vGa_{1-v}N$ layer, and
said current blocking layer and said cladding layer are formed to have compositions satisfying w>v.

28. The nitride-based semiconductor light-emitting device according to claim 19, wherein
said current blocking layer is formed either on a GaN substrate or on a GaN layer formed on a substrate, and includes said second nitride-based semiconductor layer having a lattice constant larger than the lattice constant of GaN.

29. The nitride-based semiconductor light-emitting device according to claim 28, wherein
said current blocking layer contains InGaN.

30. The nitride-based semiconductor light-emitting device according to claim 19, wherein
said current blocking layer includes said second nitride-based semiconductor layer absorbing light emitted from said emission layer.

31. The nitride-based semiconductor light-emitting device according to claim 19, wherein
said current blocking layer includes an $In_sGa_{1-s}N$ layer,
said emission layer includes an $In_xGa_{1-x}N$ layer, and
said current blocking layer and said emission layer are formed to have compositions satisfying $s \geqq x$.

32. A nitride-based semiconductor light-emitting device comprising:
an emission layer;
a cladding layer, formed on said emission layer, including a laterally extending flat portion and a ridge portion having side surfaces extending from the flat portion; and
a current-blocking layer, wherein
said ridge portion serves as a current path portion, and
said current-blocking layer is formed to cover the side surfaces of said current path portion, and
said current-blocking layer includes a dielectric blocking layer and a semiconductor blocking layer formed on said dielectric blocking layer.

33. The nitride-based semiconductor light-emitting device according to claim 32, wherein
said dielectric blocking layer includes an opening reaching the upper surface of said cladding layer, and
said semiconductor blocking layer is in contact with the upper surface of said cladding layer through said opening of said dielectric blocking layer.

34. The nitride-based semiconductor light-emitting device according to claim 33, wherein
said semiconductor blocking layer is formed by selective growth from the upper surface of said cladding layer located in said opening of said dielectric blocking layer.

35. The nitride-based semiconductor light-emitting device according to claim 32, wherein
the thickness of said dielectric blocking layer is smaller than the thickness of said semiconductor blocking layer.

36. The nitride-based semiconductor light-emitting device according to claim 32, wherein
said current blocking layer is formed on the side surfaces of said projection portion and on said flat portion.

37. The nitride-based semiconductor light-emitting device according to claim 36, wherein
said dielectric blocking layer is formed on said flat portion of said cladding layer, and
said semiconductor blocking layer is formed on the side surfaces of said projection portion of said cladding layer and on said dielectric blocking layer formed on said flat portion.

38. The nitride-based semiconductor light-emitting device according to claim 37, wherein
said semiconductor blocking layer is formed by selective growth from the side surfaces of said projection portion of said cladding layer.

39. The nitride-based semiconductor light-emitting device according to claim 32, wherein
said current blocking layer includes an opening, and
said cladding layer includes: a first cladding layer having a substantially flat upper surface, and
a second cladding layer, formed on said first cladding layer in said opening of said current blocking layer, having said current path portion.

40. The nitride-based semiconductor light-emitting device according to claim 39, wherein
said second cladding layer is formed to extend onto the upper surface of said current blocking layer.

41. The nitride-based semiconductor light-emitting device according to claim 32, wherein
a number of vertical dislocations is reduced in said semiconductor blocking layer due to transversely bent dislocations.

42. The nitride-based semiconductor light-emitting device according to claim 32, wherein
said semiconductor blocking layer is formed only in the vicinity of said current path portion.

43. The nitride-based semiconductor light-emitting device according to claim 32, wherein
said semiconductor blocking layer contains at least one element, selected from a group consisting of B, Ga, Al, In and Tl, and N.

44. The nitride-based semiconductor light-emitting device according to claim 32, wherein
said cladding layer includes a first nitride-based semiconductor layer, and
said semiconductor blocking layer is formed either on a GaN substrate or on a GaN layer formed on a substrate, and includes a second nitride-based semiconductor layer having a smaller lattice constant than GaN.

45. The nitride-based semiconductor light-emitting device according to claim 44, wherein
said semiconductor blocking layer includes an AlGaN layer.

46. The nitride-based semiconductor light-emitting device according to claim 32, wherein
said cladding layer includes a first nitride-based semiconductor layer, and
said semiconductor blocking layer includes a second nitride-based semiconductor layer having a refractive index smaller than the refractive index of said first nitride-based semiconductor layer forming said cladding layer.

47. The nitride-based semiconductor light-emitting device according to claim 32, wherein
said cladding layer includes a first nitride-based semiconductor layer, and
said semiconductor blocking layer includes a second nitride-based semiconductor layer having a lattice constant smaller than the lattice constant of said first nitride-based semiconductor layer forming said cladding layer.

48. The nitride-based semiconductor light-emitting device according to claim 32, wherein
said current blocking layer includes an $Al_wGa_{1-w}N$ layer,
said cladding layer includes an $Al_vGa_{1-v}N$ layer, and
said current blocking layer and said cladding layer are formed to have compositions satisfying $w > v$.

49. The nitride-based semiconductor light-emitting device according to claim 32, wherein
said cladding layer includes a first nitride-based semiconductor layer, and
said semiconductor blocking layer is formed either on a GaN substrate or on a GaN layer formed on a substrate, and includes a second nitride-based semiconductor layer having a lattice constant larger than the lattice constant of GaN.

50. The nitride-based semiconductor light-emitting device according to claim 49, wherein
said semiconductor blocking layer contains InGaN.

51. The nitride-based semiconductor light-emitting device according to claim 32, wherein
said cladding layer includes a first nitride-based semiconductor layer, and
said semiconductor blocking layer includes a second nitride-based semiconductor layer absorbing light emitted from said emission layer.

52. The nitride-based semiconductor light-emitting device according to claim 32, wherein
said semiconductor blocking layer includes an $In_sGa_{1-s}N$ layer,
said emission layer includes an $In_xGa_{1-x}N$ layer, and
said semiconductor blocking layer and said emission layer are formed to have compositions satisfying $s \geq x$.

53. The nitride-based semiconductor light-emitting device according to claim 32, wherein
said dielectric blocking layer includes an oxide film or a nitride film containing at least one element selected from a group consisting of Si, Ti and Zr.

54. The nitride-based semiconductor light-emitting device according to claim 53, wherein
said dielectric blocking layer includes an SiN film.

55. A nitride-based semiconductor light-emitting device comprising:
an emission layer;
a cladding layer, formed on said emission layer, including a first nitride-based semiconductor layer; and
a semiconductor current-blocking layer including a second nitride-based semiconductor layer and having an opening, wherein
said opening serves as a current path portion, and
said semiconductor current-blocking layer is formed on portions of said emission layer but not on other portions of said emission layer remote from said current path portion.

56. A nitride-based semiconductor light-emitting device comprising:
an emission layer;
a cladding layer, formed on said emission layer; and
a current-blocking layer having an opening, wherein
said opening serves as a current path portion, and
said current-blocking layer includes a dielectric blocking layer formed on and in direct contact with said cladding layer, and a nitride-based semiconductor blocking layer formed on said dielectric blocking layer, wherein said nitride-based semiconductor blocking layer absorbs light emitted from said emission layer.

* * * * *